(12) United States Patent
Watanabe

(10) Patent No.: US 8,212,362 B2
(45) Date of Patent: Jul. 3, 2012

(54) SEMICONDUCTOR DEVICE

(75) Inventor: Kiyonori Watanabe, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/603,106

(22) Filed: Oct. 21, 2009

(65) Prior Publication Data

US 2010/0038779 A1 Feb. 18, 2010

Related U.S. Application Data

(62) Division of application No. 11/826,119, filed on Jul. 12, 2007, now Pat. No. 7,626,271.

(30) Foreign Application Priority Data

Jul. 14, 2006 (JP) ................................. 2006-194658

(51) Int. Cl.
*H01L 23/48* (2006.01)
*H01L 23/52* (2006.01)
*H01L 29/40* (2006.01)

(52) U.S. Cl. ................................. 257/774; 257/E23.011

(58) Field of Classification Search .................. 257/738, 257/773, 774, 779, E23.011
See application file for complete search history.

(56) References Cited

U.S. PATENT DOCUMENTS

| 6,166,441 A | 12/2000 | Geryk et al. |
| 6,586,275 B2 * | 7/2003 | Kim et al. ..................... 438/106 |
| 6,982,494 B2 | 1/2006 | Anzai |
| 2009/0174068 A1 * | 7/2009 | Hashimoto ................... 257/734 |

FOREIGN PATENT DOCUMENTS

| JP | 2004-006486 A | 1/2004 |
| JP | 2005-064473 A | 3/2005 |

* cited by examiner

*Primary Examiner* — Jenny L Wagner
(74) *Attorney, Agent, or Firm* — Kubotera & Associates, LLC

(57) ABSTRACT

A semiconductor device includes a semiconductor chip having a first main surface having an electrode pad in an exposed state, and an interlayer insulation layer formed on the first main surface so that the electrode pad is partially exposed; a re-wiring layer including a wiring pattern having a linear portion having one end portion electrically connected to the electrode pad and extending from the electrode pad, and a post electrode mounting portion with a recessed polygonal shape and connected to the other end portion of the linear portion; a post electrode formed on the post electrode mounting portion and having a bottom surface with a contour crossing an upper contour of the post electrode mounting portion at more than two points; a sealing portion disposed so that a top of the post electrode is exposed; and an outer terminal formed on the top of the post electrode.

6 Claims, 32 Drawing Sheets

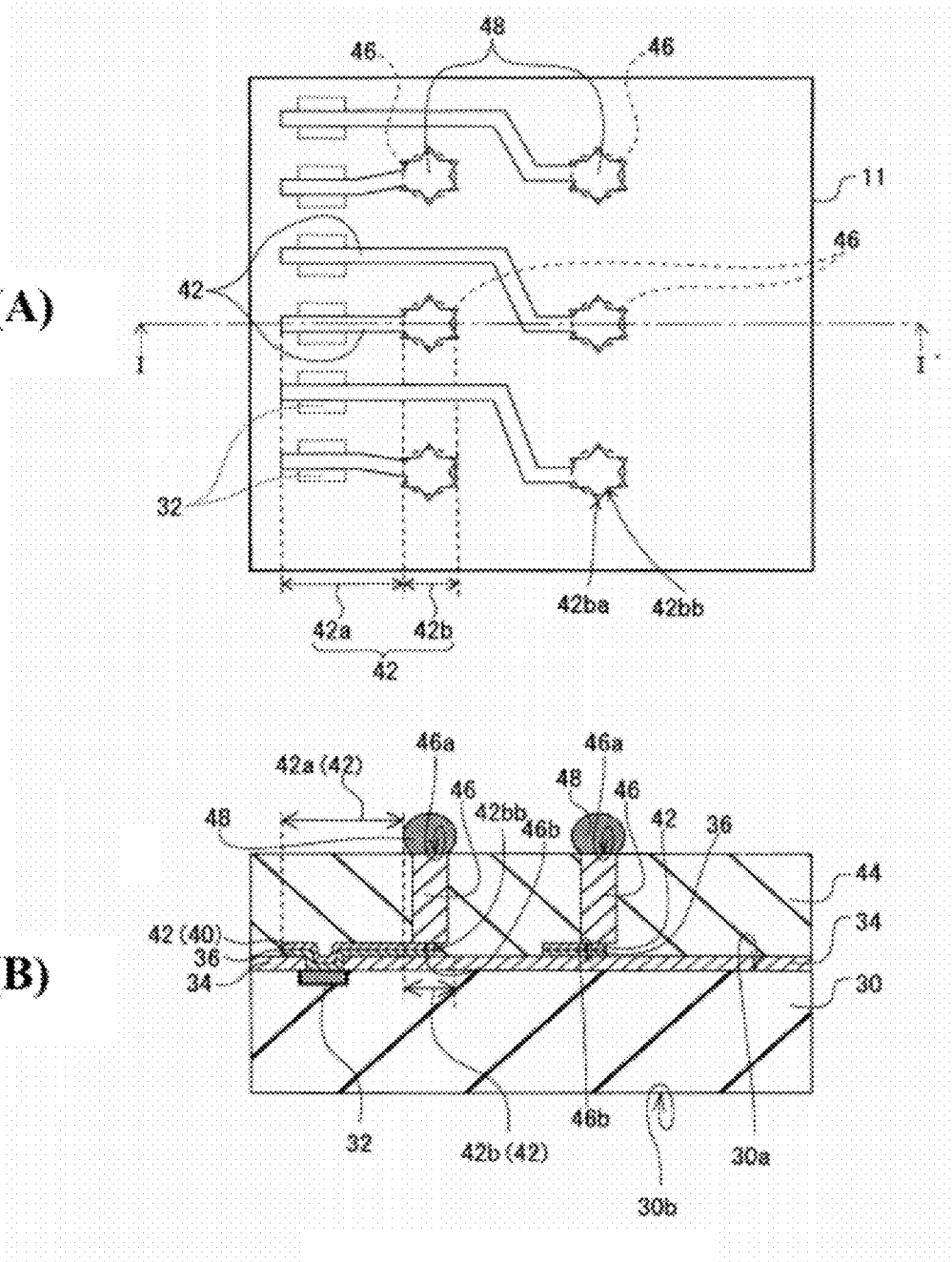

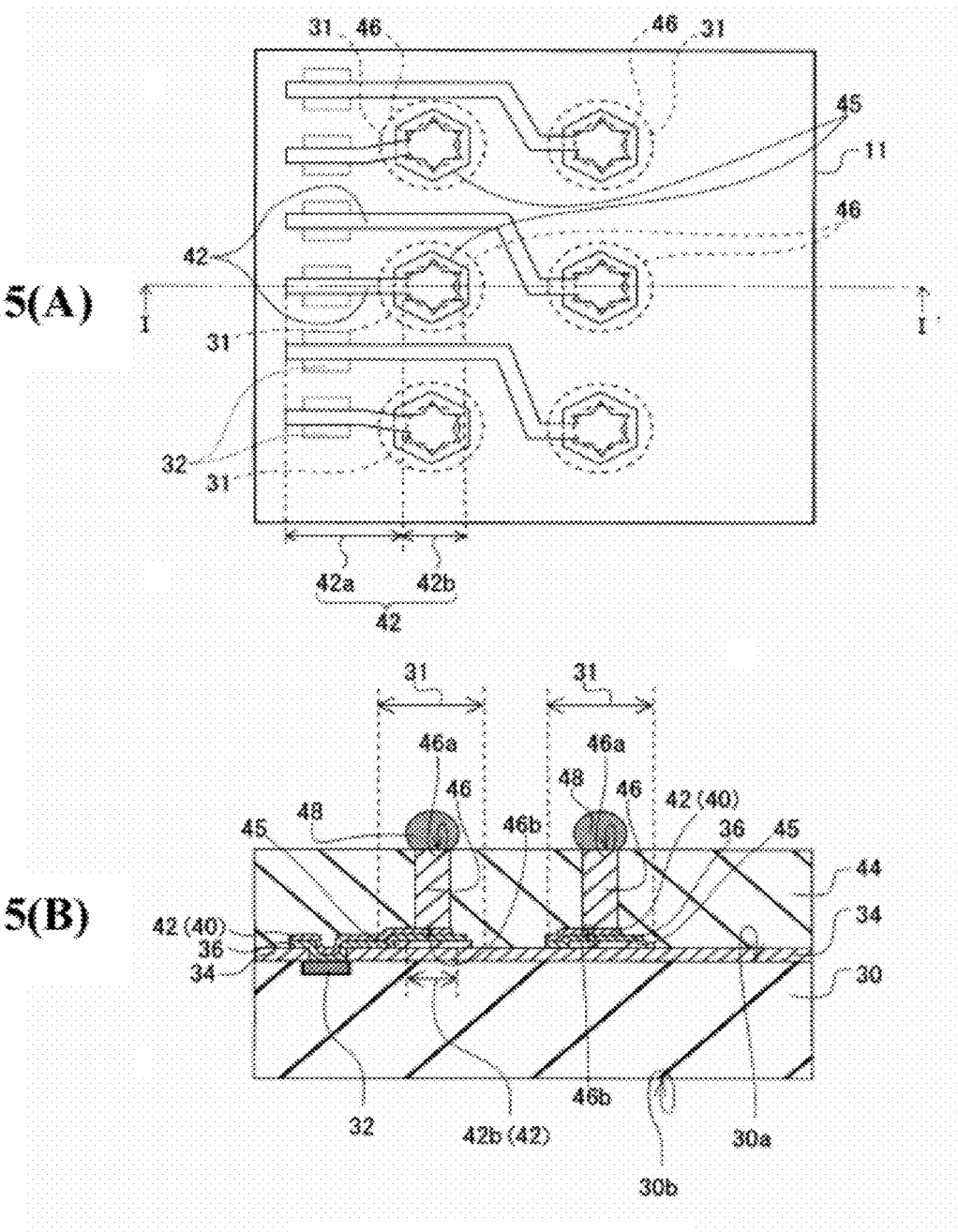

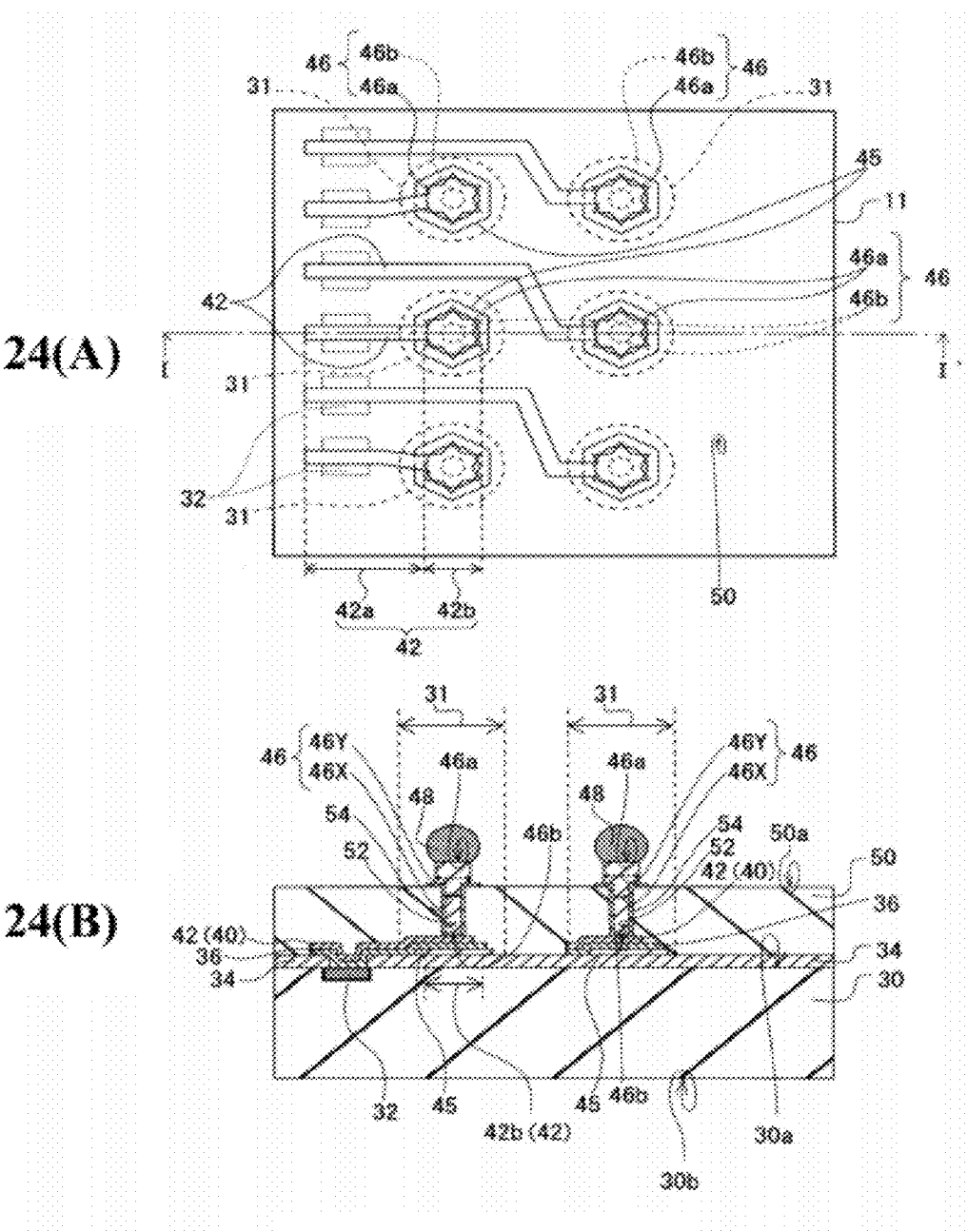

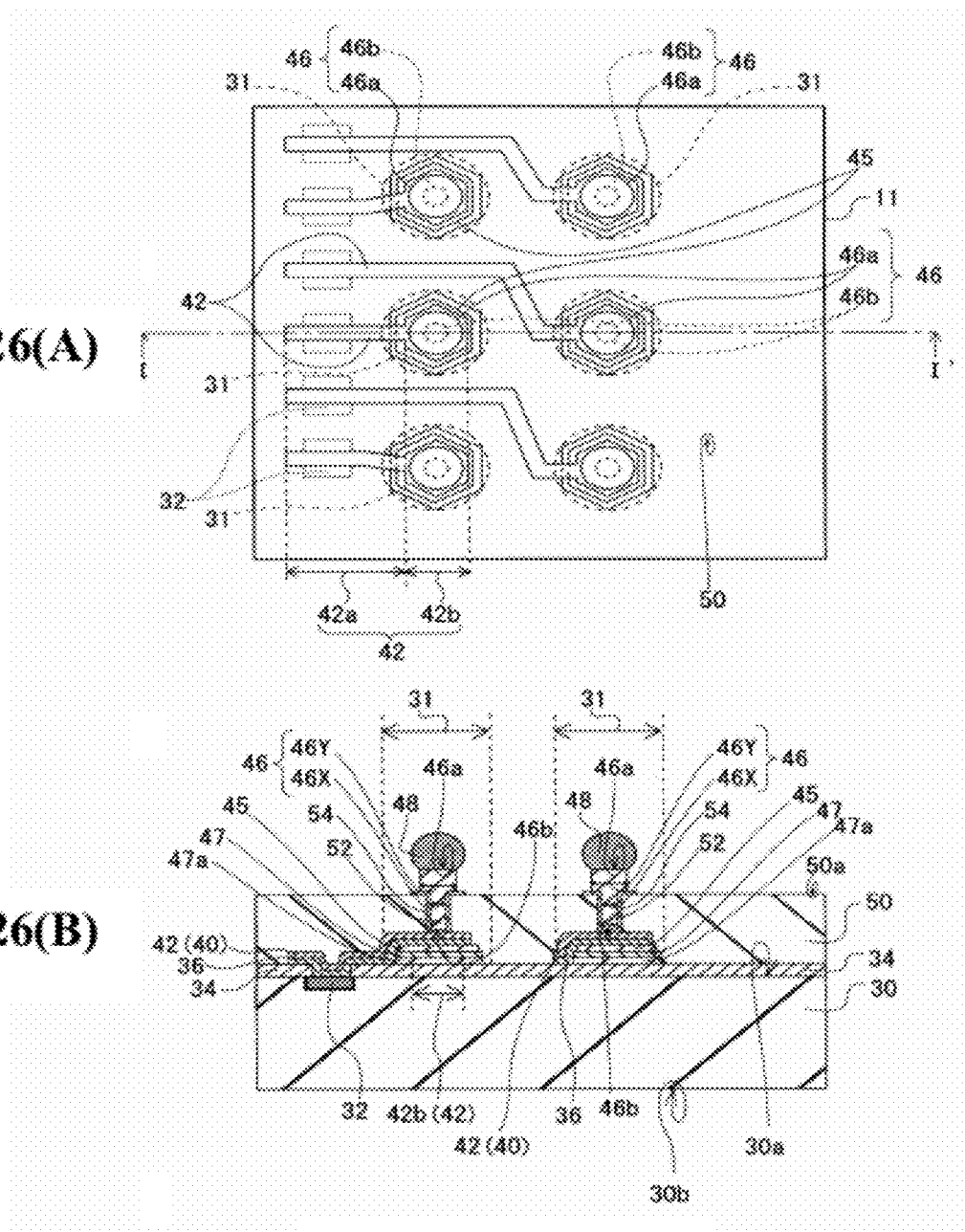

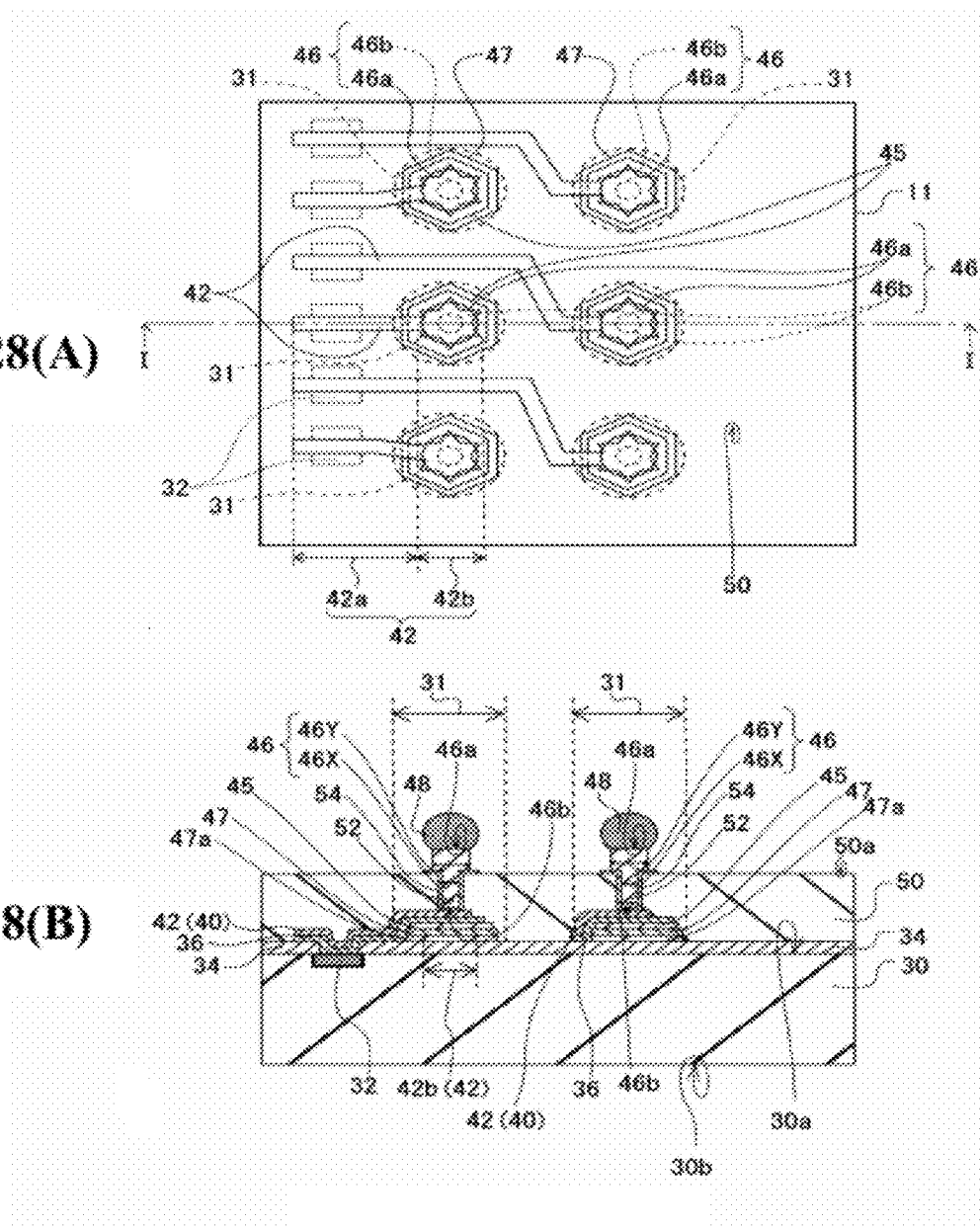

SEMICONDUCTOR DEVICE

CROSS-REFERENCE TO RELATED APPLICATIONS

This is a divisional application of the prior application Ser. No. 11/826,119 filed Jul. 12, 2007 now U.S. Pat. No. 7,626,271, allowed. The disclosure of Japanese Patent Application No. 2006-194658, filed on Jul. 14, 2006, is incorporated in the application by reference.

BACKGROUND OF THE INVENTION AND RELATED ART STATEMENT

The present invention relates to a semiconductor device having a packaged structure, and a method of producing the semiconductor device. In particular, the present invention relates to a semiconductor device called a Wafer level Chip Size Package (referred to as W-CSP).

Recently, it has been required to reduce a size and a thickness of a semiconductor device. To this end, there has been developed a semiconductor device called a wafer level Chip Size Package (W-CSP), in which an outer size of a package is substantially same as that of a semiconductor chip.

Patent Reference 1 has disclosed a semiconductor device of this type (W-CSP), in which it is possible to reduce a stress generated in an outer terminal and a boundary between the outer terminal and a re-wiring pattern, thereby improving reliability of the semiconductor device.

Patent Reference 2 has disclosed a method of producing a semiconductor device of this type (W-CSP). In the method, when a pots electrode is formed, the post electrode is plated under a plating condition different from that in plating a wiring pattern. Accordingly, it is possible to reduce a stress generated due to a difference in thermal expansion coefficients between a semiconductor substrate of W-CSP and a mounting board.

Patent Reference 1: Japanese Patent Publication No. 2004-6486
Patent Reference 1: Japanese Patent Publication No. 2005-64473

In general, after a W-CSP is mounted on a mounting board, the W-CSP functions as a semiconductor device. When or after the W-CSP having a post electrode is mounted on the mounting board, an external stress applied to the W-CSP is concentrated on an outer terminal, the post electrode, and a post electrode mounting portion, i.e., a part of a re-wiring pattern. The post electrode is also called a column electrode or a protrusion electrode. When such an external stress is applied, a wiring pattern, i.e., a substantial element of the semiconductor device, situated below the re-wiring pattern may be damaged. Further, a crack may be generated in an interlayer insulation layer, thereby deteriorating substantial electrical property of the semiconductor device.

In view of the problems described above, an object of the present invention is to provide a semiconductor device to solve the problems of the conventional semiconductor device. In particular, it is possible to prevent a substantial element such as a wiring pattern from being damaged when an external stress is applied upon or after mounting the semiconductor device or W-CSP on a mounting board. Accordingly, it is possible to prevent substantial electrical property of the semiconductor device from deteriorating.

Further objects and advantages of the invention will be apparent from the following description of the invention.

SUMMARY OF THE INVENTION

In order to attain the objects described above, according a first aspect of to the present invention, a semiconductor device includes a semiconductor chip having a first main surface having an electrode pad in an exposed state, and an interlayer insulation layer formed on the first main surface so that the electrode pad is partially exposed; a re-wiring layer including a wiring pattern having a linear portion having one end portion electrically connected to the electrode pad and extending from the electrode pad, and a post electrode mounting portion with a recessed polygonal shape and connected to the other end portion of the linear portion; a post electrode formed on the post electrode mounting portion of the wiring pattern and having a bottom surface with a contour crossing an upper contour of the post electrode mounting portion at least two points; a sealing portion disposed so that a top of the post electrode is exposed; and an outer terminal formed on the top of the post electrode.

According a second aspect of to the present invention, a method of producing a semiconductor device includes the steps of:

preparing a semiconductor substrate with a semiconductor chip area including a first main surface having an electrode pad in an exposed state, and an interlayer insulation layer formed on the first main surface so that the electrode pad is partially exposed;

forming a re-wiring layer including a wiring pattern so that the wiring pattern is formed on the interlayer insulation layer and has a linear portion having one end portion electrically connected to the electrode pad and extending from the electrode pad, and a post electrode mounting portion with a recessed polygonal shape and connected to the other end portion of the linear portion;

forming a post electrode on the post electrode mounting portion of the wiring pattern so that a contour of a bottom surface of the post electrode crosses an upper contour of the post electrode mounting portion at least two points;

forming a sealing portion so that a top of the post electrode is exposed;

forming an outer terminal on the top of the post electrode; and cutting the semiconductor substrate along the semiconductor chip area to form a semiconductor device.

In the first aspect of the present invention, the post electrode mounting portion has the characteristic shape. Accordingly, when there is a damage in a substantial element of the semiconductor device such as the post electrode or the interlayer insulation layer near the re-wiring layer connected to the post electrode, it is possible to prevent the damage from propagating continuously and linearly through the post electrode and the re-wiring layer.

In the first aspect of the present invention, it is possible to alleviate and block an external stress applied to the semiconductor device or W-CSP (Wafer level Chip Size Package), or to prevent propagation of damage with a configuration below the post electrode. Accordingly, it is possible to disperse the stress with the configuration, thereby making is possible to prevent the post electrode and the re-wiring layer connected thereto from being damaged due to the external stress applied to the semiconductor device or W-CSP. As a result, it is possible to prevent the element from being damaged or propagation of damage, thereby improving reliability of the semiconductor device.

In the second aspect of the present invention, with the method of producing the semiconductor device, it is possible to efficiently produce the semiconductor device with the configuration and the effect described above.

BRIEF DESCRIPTION OF THE DRAWINGS

FIG. 2(A) is a schematic plan view showing a wiring pattern of the semiconductor device according to the first embodiment of the present invention, and FIG. 2(B) is a schematic sectional view taken along a projected line I-I' in FIG. 2(A);

FIG. 15(A) is a schematic plan view showing a wiring pattern of the semiconductor device according to a sixth embodiment of the present invention, and FIG. 15(B) is a schematic sectional view taken along a projected line I-I' in FIG. 15(A);

FIG. 24(A) is a schematic plan view showing a wiring pattern of the semiconductor device according to a fifteenth embodiment of the present invention, and FIG. 24(B) is a schematic sectional view taken along a projected line I-I' in FIG. 24(A);

FIG. 26(A) is a schematic plan view showing a wiring pattern of the semiconductor device according to a seventeenth embodiment of the present invention, and FIG. 26(B) is a schematic sectional view taken along a projected line I-I' in FIG. 26(A);

FIG. 28(A) is a schematic plan view showing a wiring pattern of the semiconductor device according to a nineteenth embodiment of the present invention, and FIG. 28(B) is a schematic sectional view taken along a projected line I-I' in FIG. 28(A);

DETAILED DESCRIPTION OF PREFERRED EMBODIMENTS

Figure 1A:
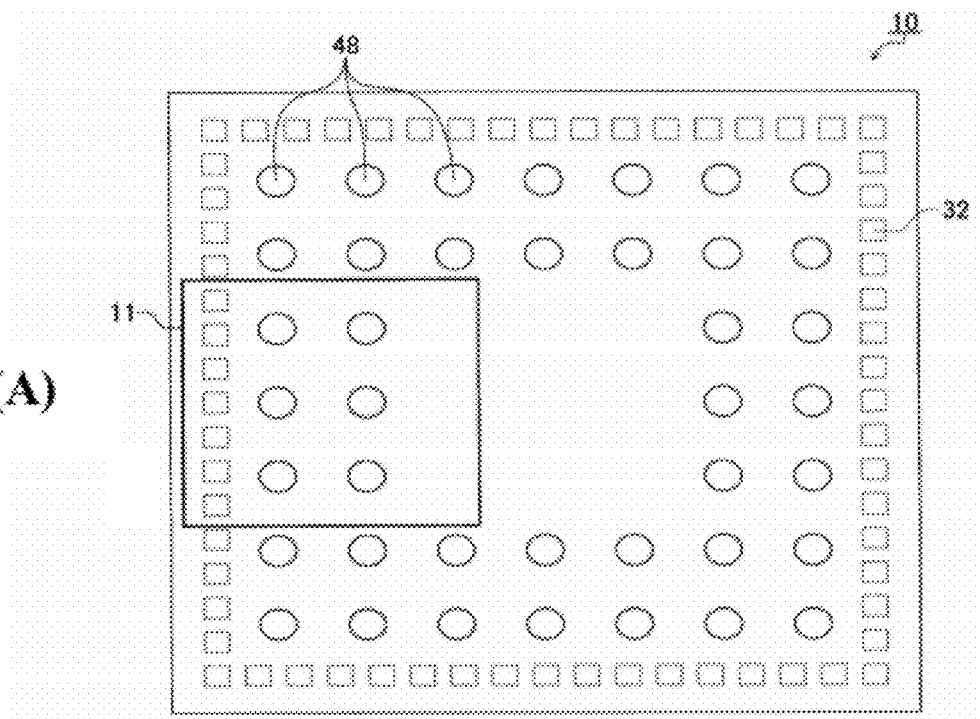
FIG. 1(A) is a schematic plan view showing a semiconductor device according to a first embodiment of the present invention.

Hereunder, embodiments of the present invention will be explained with reference to the accompanying drawings. In the following description of the present invention, each of the drawings is illustrated schematically in terms of a shape, a size and a dimensional relationship for explaining the embodiments of the present invention, and the present invention is not limited to the shape, the size, and the dimensional relationship shown in the drawings. Further, components similar in each of the drawings are designated with same reference numerals, and duplicate explanations thereof are omitted.

First Embodiment

Figure 1B:
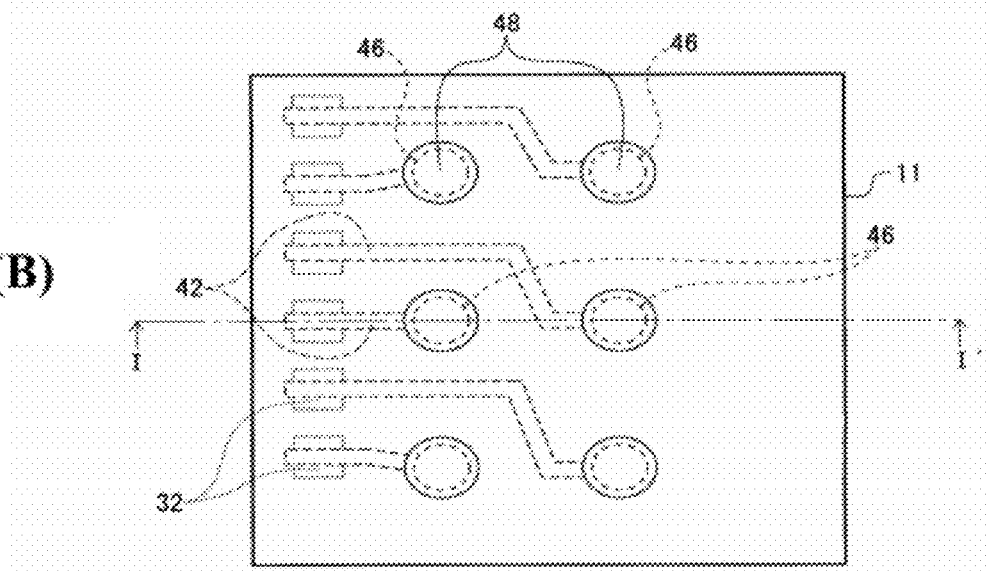
FIG. 1(B) is an enlarged plan view showing an area indicated by a line 11 in FIG. 1(A)

A first embodiment of the present invention will be explained. FIG. 1(A) is a schematic plan view showing a semiconductor device 10 according to a first embodiment of the present invention, and FIG. 1(B) is an enlarged plan view showing an area indicated by a line 11 in FIG. 1(A). FIG. 2(A) is a schematic plan view showing a wiring pattern of the semiconductor device 10 according to the first embodiment of the present invention, and FIG. 2(B) is a schematic sectional view taken along a projected line I-I' in FIG. 2(A).

In the semiconductor device in the embodiment, the wiring pattern in a re-wiring layer, especially a post electrode, has a characteristic shape.

As shown in FIGS. 2(A) and 2(B), the semiconductor device 10 or a W-CSP (Wafer level Chip Size Package) includes a semiconductor chip 30. In the embodiment, the semiconductor device 10 and the semiconductor chip 30 have a rectangular body, and shapes of the semiconductor device 10 and the semiconductor chip 30 are not limited thereto. The semiconductor chip 30 includes a circuit element (not shown) having a specific function. Further, the semiconductor chip 30 has a first main surface 30a and a second main surface 30b opposite to the first main surface 30a.

In the embodiment, the semiconductor chip 30 includes an interlayer insulation layer 34 formed on the first main surface 30a and at least one side surface between a surface of the interlayer insulation layer 34 and the second main surface 30b. The interlayer insulation layer 34 is formed of an insulation material. A plurality of electrode pads 32 connected to the circuit element is disposed on the first main surface 30a along an edge of the first main surface 30a such that at least a part thereof is exposed from the interlayer insulation layer 34. The electrode pads 32 are formed of aluminum and have a well-known configuration.

In the embodiment, a plurality of wiring patterns 42 is formed on an upper side of the interlayer insulation layer 34 for electrically connecting to the electrode pads 32 thus exposed. As shown in FIG. 1(B), each of the wiring patterns 42 extends inside the interlayer insulation layer 34, so-called a fan-in arrangement. The wiring patterns 42 are formed of copper, and are formed on a same plain. The wiring patterns 42 are also referred to as a re-wiring layer 40.

In the embodiment, a plurality of base metal patterns 36 is disposed on the interlayer insulation layer 34 and below the wiring patterns 42. The base metal patterns 36 include several types, and are called a base metal layer. Further, the base metal patterns 36 have a plain shape similar to that of the wiring patterns 42. The base metal patterns 36 are formed of a laminated structure of titanium (Ti), tungsten (W), and chrome (Cr) laminated in this order, and may be formed a laminated structure of copper (Cu), nickel (Ni), gold (Au), and palladium (Pd) laminated in this order. When the base metal patterns 36 are formed of a laminated structure, each of the layers has a thickness between 100 µm to 300 µm, so that the laminated structure has a thickness of 500 µm to 800 µm.

A configuration of the wiring patterns 42 of the semiconductor device 10 will be explained next. As shown in FIGS. 1(B) and 2(A), the wiring patterns 42 include linear portions 42a having a linear shape, a curved shape, or a combination thereof. One end portion of the linear portion 42a is electrically connected to one of the electrode pads 32 through the base metal patterns 36. Further, each of the wiring patterns 42 includes a post electrode mounting portion 42b integrally connected to the other end portion of the linear portion 42a. The post electrode mounting portion 42b has a recessed polygonal shape (polygonal star shape). In the embodiment, the post electrode mounting portion 42b has an upper contour shape of a substantially six-corner star having six acute angle corners 42ba (protruding portions).

In the embodiment, post electrodes 46 are disposed on the post electrode mounting portions 42b. The post electrodes 46 are preferably formed of copper. Each of the post electrodes 46 has a column shape having a top surface 46a with a circular shape and a bottom surface 46b with a circular shape opposite to the top surface 46a. Each of the post electrodes 46 is disposed on one of the post electrode mounting portions 42b, so that a contour of the bottom surface 46b of the post electrode 46 crosses a plan contour of the post electrode mounting portion 42b.

In particular, each of the post electrode mounting portions 42b has a plane shape or a contour shape of an upper surface thereof crossing the contour of the bottom surface 46b of the post electrode 46 at two points at least. When the post electrodes 46 are mounted on the post electrode mounting portions 42b, the protruding portions 42ba of the post electrode mounting portions 42b protrude from the bottom surfaces 46b of the post electrodes 46.

As described above, the post electrode mounting portions 42b have the substantially six-corner star shape having six of the protruding portions 42ba. Accordingly, the contour of the upper surface of the post electrode mounting portion 42b crosses the contour of the bottom surface 46b of the post electrode 46 at twelve points at least, depending on a connecting arrangement between the linear portion 42a and the post electrode mounting portion 42b.

As shown in FIG. 2(A), in each of the post electrode mounting portion 42b, recess portions 42bb are situated between the protruding portions 42ba. The bottom surface 46b of the post electrode 46 faces the interlayer insulation layer 34 at the recess portions 42bb. As shown in FIGS. 1(A) and 1(B), the post electrodes 46 are arranged in a matrix pattern with an equal interval. The number and arrangement of the post electrodes 46 are arbitrary and may be adjusted as necessary.

In the embodiment, a sealing portion 44 is disposed to cover the post electrodes 46 and an exposed portion of the interlayer insulation layer 34. The sealing portion 44 is formed of an insulation material formed in an insulation layer. The top surfaces 46a of the post electrodes 46 are exposed from a surface of the sealing portion 44. Outer terminals 48 are disposed on the top surfaces 46a thus exposed. The outer terminals 48 are formed of solder balls.

As described above, in the embodiment, the post electrode mounting portions 42b have a recessed polygonal shape or a star shape. Accordingly, even when a crack is generated in the semiconductor device 10, it is possible to prevent the crack from propagating continuously and linearly through the post electrodes 46 or the re-wiring layer 40.

Figure 3A:
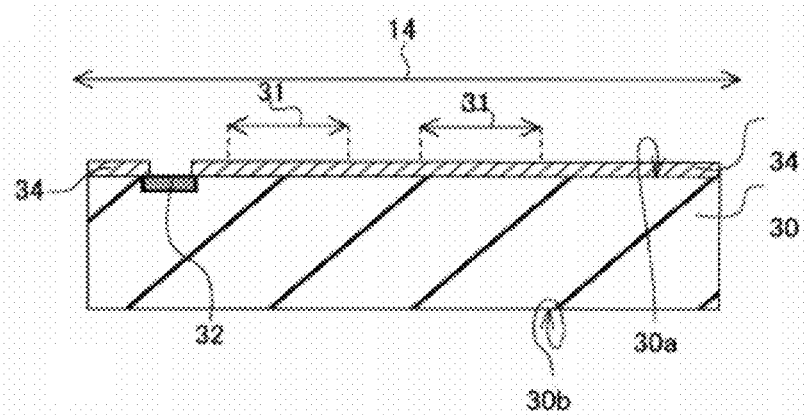
FIGS. 3(A) to 3(C) are schematic views showing a method of producing the semiconductor device according to the first embodiment of the present invention.
Figure 3B:
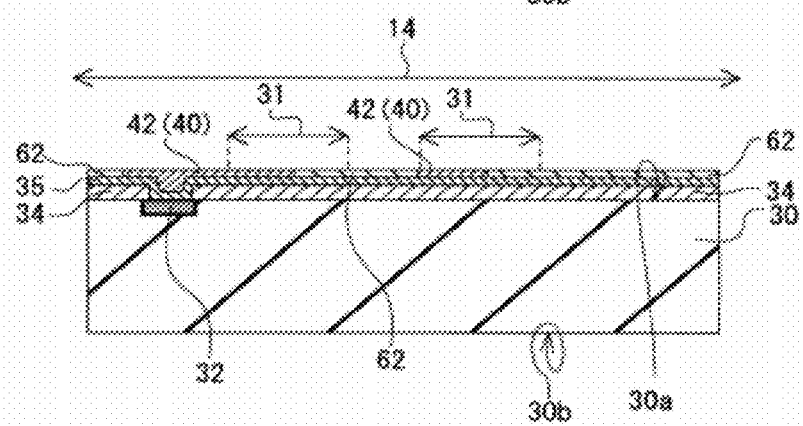
Figure 3C:
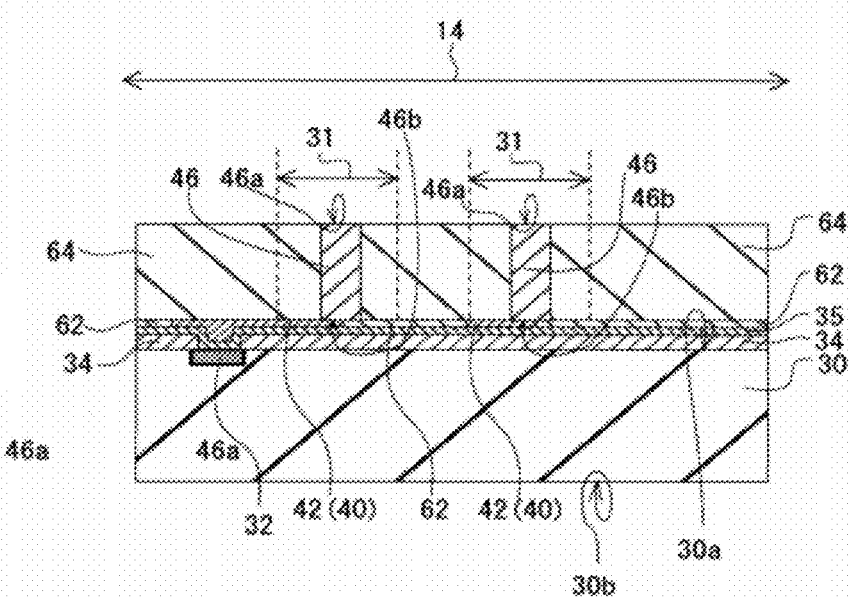
Figure 4A:
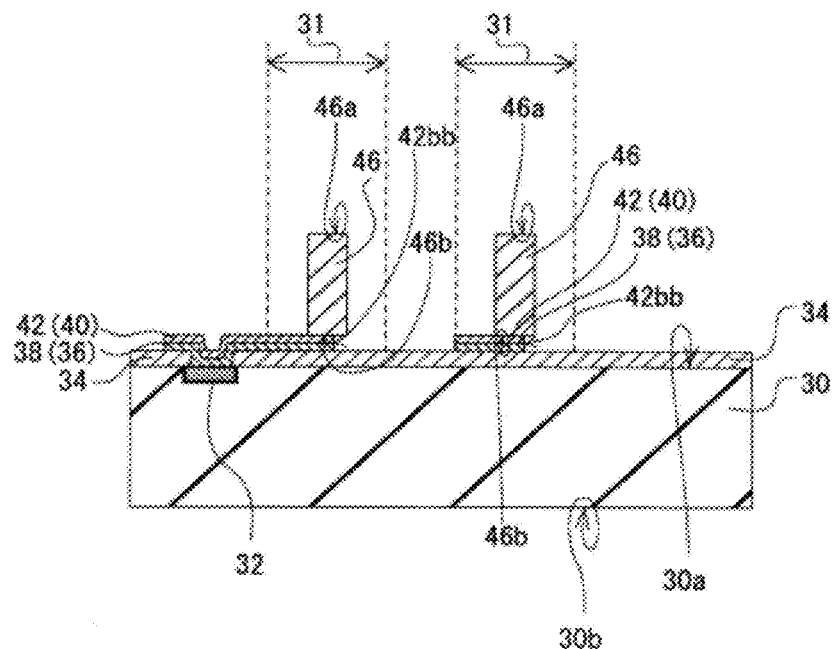
FIGS. 4(A) and 4(B) are schematic views showing the method of producing the semiconductor device continued from FIG. 3(C) according to the first embodiment of the present invention.
Figure 4B:
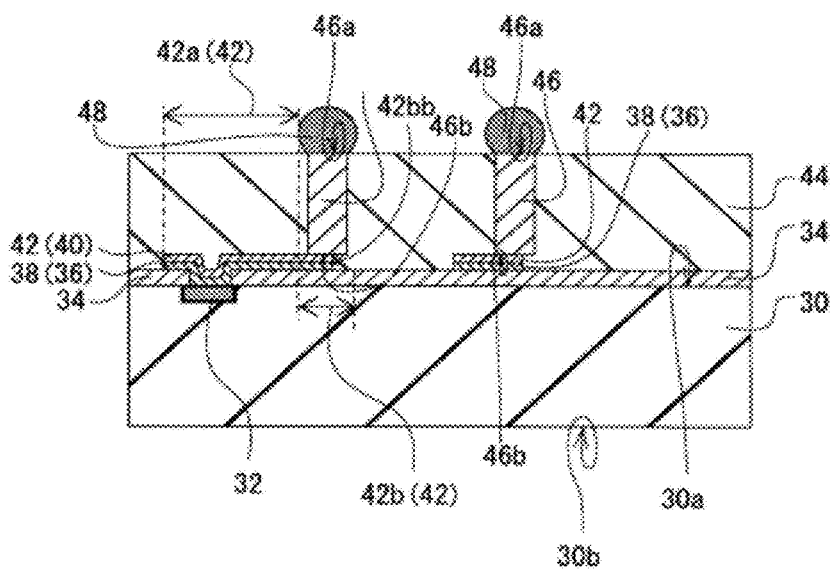

A method of producing the semiconductor device 10 will be explained next with reference to FIGS. 3(A)-3(C) and 4(A)-4(B). FIGS. 3(A) to 3(C) are schematic views showing the method of producing the semiconductor device 10 according to the first embodiment of the present invention. FIGS. 4(A) and 4(B) are schematic views showing the method of producing the semiconductor device 10 continued from FIG. 3(C) according to the first embodiment of the present invention. Each step in the method of producing the semiconductor device 10 proceeds a wafer level, and just a part of the wafer will be described.

First, a semiconductor substrate (semiconductor wafer) is prepared. A plurality of semiconductor chip areas is defined on the semiconductor substrate in a matrix pattern. Each of the semiconductor chip areas becomes a semiconductor chip after a cutting process. A scribe line is defined between adjacent semiconductor chip areas.

As shown in FIG. 3(A), the semiconductor chip 30 has the first main surface 30a, the second main surface 30b opposite to the first main surface 30a, and several side surfaces between the first main surface 30a and the second main surface 30b. The electrode pads 32 are exposed from the first main surface 30a in a semiconductor chip area 14 of the semiconductor substrate. The electrode pads 32 are arranged in a line with an equal interval (not shown) along the scribe line or a side edge of the semiconductor chip area 14.

The interlayer insulation layer 34 as an insulation layer is formed on the first main surface 30a, so that the electrode pads 32 are partially exposed from the interlayer insulation layer 34. Post electrode mounting areas 31 are defined on the interlayer insulation layer 34 or on the first main surface 30a in advance, so that the post electrodes 46 are finally situated in the post electrode mounting areas 31. The post electrode mounting areas 31 are arranged at positions corresponding to the number and arrangement of the post electrodes 46.

In the next step, a precursor base metal layer 35 is formed on the interlayer insulation layer 34 and the electrode pads 32 thus exposed, i.e., a whole exposed surface. The precursor base metal layer 35 may be formed of an arbitrary material with such a well-known method as a sputtering method and a deposition method. When the precursor base metal layer 35 is formed of a laminated structure, the laminated structure may constitute titanium (Ti), tungsten (W), and chrome (Cr) laminated in this order, or copper (Cu), nickel (Ni), gold (Au), and palladium (Pd) laminated in this order.

As shown in FIG. 3(B), a first resist pattern 62 for forming the re-wiring layer 40 is formed with well-known photolithography. The re-wiring layer 40 may be formed using such an appropriate material as copper with a manufacturing process of a wiring pattern in a manufacturing process of a conventional W-CSP. Preferably, the re-wiring layer 40 is formed with a well-known electroplating method using the base metal layer 35 as a common electrode.

In the next step, the first resist pattern 62 is removed using a solvent selected according to a material of the first resist pattern 62. Accordingly, it is possible to form the wiring patterns 42 having the post electrode mounting portions 42b.

In the next step, as shown in FIG. 3(C), a second resist pattern 64 for forming the post electrodes 46 is formed. The second resist pattern 64 has openings at positions corresponding to the post electrode forming areas 31. The second resist pattern 64 may be formed with well-known photolithography in a manufacturing process of a conventional W-CSP. With the second resist pattern 64 as a mask, the post electrodes 46 are formed. Similar to the re-wiring layer 40, the post electrodes 46 may be formed using such an appropriate material as copper. Preferably, the post electrodes 46 are formed with a well-known electroplating method using the base metal layer 35 as a common electrode.

Accordingly, the post electrodes 46 are formed on the post electrode mounting portions 42b of the wiring patterns 42 having the configuration described above. As described above, each of the post electrodes 46 has the bottom surface 46b having the contour crossing the contour of the upper surface of the post electrode mounting portion 42b at the two points at least.

In the next step, as shown in FIG. 4(A), the second resist pattern 64 is removed using a solvent selected according to a material of the second resist pattern 64. A portion of the precursor base metal layer 35 exposed from the wiring patterns 42 is removed with an etching process suitable for a material of the precursor base metal layer 35.

As a result, the precursor base metal layer 35 is formed in a pattern same as that of the wiring patterns 42 in the re-wiring layer 40 situated above the interlayer insulation layer 34 and just below the re-wiring layer 40, thereby forming the base metal patterns 36.

In the next step, as shown in FIG. 4(B), the sealing portion 44 is formed to cover the wiring patterns 42 thus exposed, the base metal patterns 36, the post electrodes 46, and the interlayer insulation layer 34. At this time, a sealing resin is filled in the recess portions 42bb of the post electrode mounting portions 42b of the wiring patterns 42, i.e., lower portions of the bottom surfaces 46b of the post electrodes 46 thus exposed. The sealing portion 44 may be formed using a well-known sealing material such as an epoxy type mold resin with a well-known method.

In the step of forming the sealing portion 44, after the sealing resin covers the top surfaces 46a of the post electrodes 46, the sealing resin is ground from a front side thereof with a well-known grinding method or a polishing method, so that the top surfaces 46a of the post electrodes 46 are exposed.

In the next step, as shown in FIG. 4(B), solder balls 48a as the outer terminals 48 are formed on the top surfaces 46a of the post electrodes 46 exposed from a flat surface of the sealing portion 44. In the last step, the semiconductor wafer is cut between the semiconductor chip areas 14 along the scribe line, thereby individually obtaining the semiconductor device 10 having the semiconductor chip 30. It is preferred that the semiconductor wafer is cut with a blade rotating at a high speed.

Second Embodiment

Figure 5A:
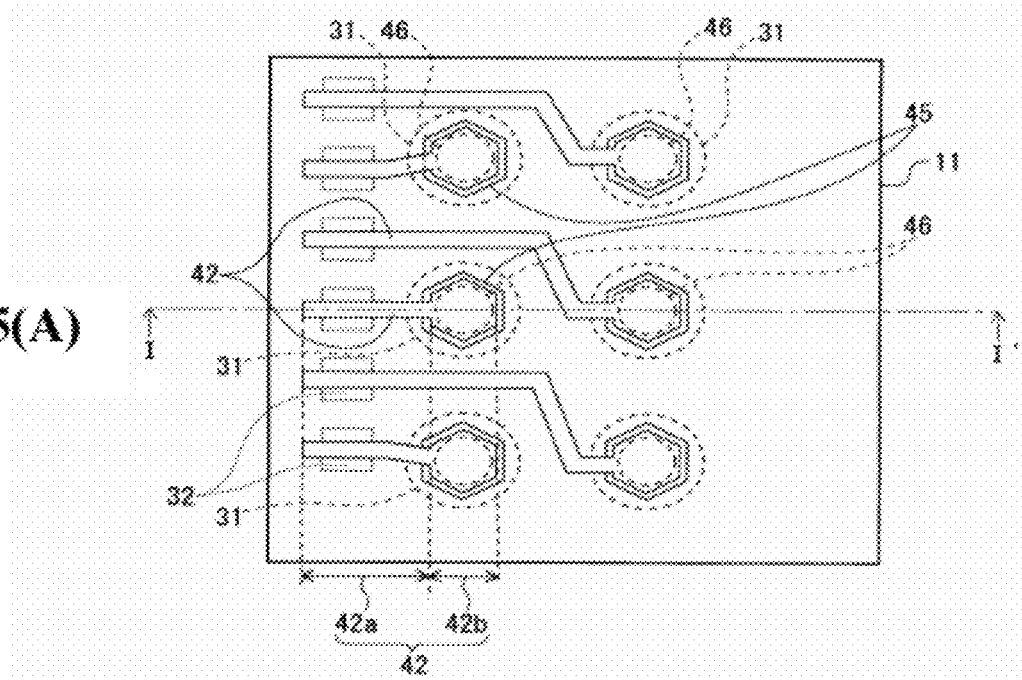
FIG. 5(A) is a schematic plan view showing a wiring pattern of a semiconductor device according to a second embodiment of the present invention.

A second embodiment of the present invention will be explained next with reference to FIGS. 5(A) and 5(B). FIG. 5(A) is a schematic plan view showing a wiring pattern of a semiconductor device according to the second embodiment of the present invention, and FIG. 5(B) is a schematic sectional view taken along a projected line I-I' in FIG. 5(A).

In the second embodiment, the semiconductor device is characterized that a stress resistance resin pattern is formed below a post electrode mounting area of a wiring pattern, i.e., just below a base metal pattern. Other than the stress resistance resin pattern, components in the second embodiment same as those in the first embodiment are designated by the same reference numerals, and explanations thereof are omitted.

Figure 5B:
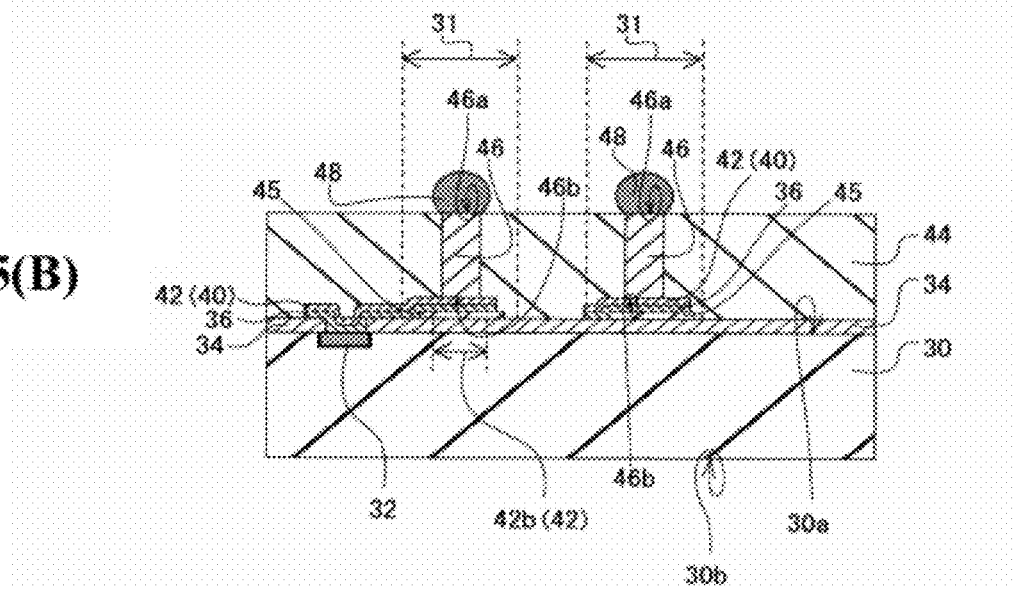
FIG. 5(B) is a schematic sectional view taken along a projected line I-I' in FIG. 5(A)

As shown in FIGS. 5(A) and 5(B), similar to the first embodiment, the semiconductor device or a W-CSP (Wafer level Chip Size Package) includes the semiconductor chip 30. Further, each of the wiring patterns 42 includes the post electrode mounting portion 42b integrally connected to the other end portion of the linear portion 42a extending from the electrode pad 32.

In the embodiment, the post electrode mounting portion 42b has an upper contour having a regular hexagon shape. The shape of the upper contour is not limited thereto, and may be any arbitrary shape as far as the bottom surface 46b of the post electrode 46 is completely accommodated in the upper contour. The post electrode mounting portions 42b are situated in the post electrode forming areas 31 defined in advance. The base metal patterns 36 are situated just below the post electrode mounting portions 42b, and have a size and a shape same as those of the post electrode mounting portions 42b.

In the embodiment, stress resistance resin patterns 45 are formed in the post electrode forming areas 31 just below the post electrode mounting portions 42b. The stress resistance resin patterns 45 may have any arbitrary shape and size as far as the post electrode mounting portions 42b are completely accommodated in a contour of the stress resistance resin patterns 45.

In the embodiment, the stress resistance resin patterns 45 have a regular hexagonal shape. The stress resistance resin patterns 45 may be formed of any arbitrary material such as a photosensitive resin, as far as the material does not pose any negative influence on surrounding component such as the base metal patterns 36, the wiring patterns 42, and the post electrodes 46. Preferably, the stress resistance resin patterns 45 are formed of a material same as that of the interlayer insulation layer 34 in consideration of adhesion. Further, the stress resistance resin patterns 45 preferably have a thickness between 2.0 µm to 10.0 µm, especially about 5.0 µm.

In the embodiment, the post electrodes 46 are disposed on the post electrode mounting portions 42b, so that the bottom surfaces 46b thereof are completely accommodated in the plan contours of the post electrode mounting portions 42b having a hexagonal shape.

With the configuration described above, when an external stress is applied to the post electrodes 46, the stress resistance resin patterns 45 alleviate the external stress. Accordingly, it is possible to prevent the post electrodes 46 and the wiring patterns 42 connected thereto from being damaged.

Figure 6A:
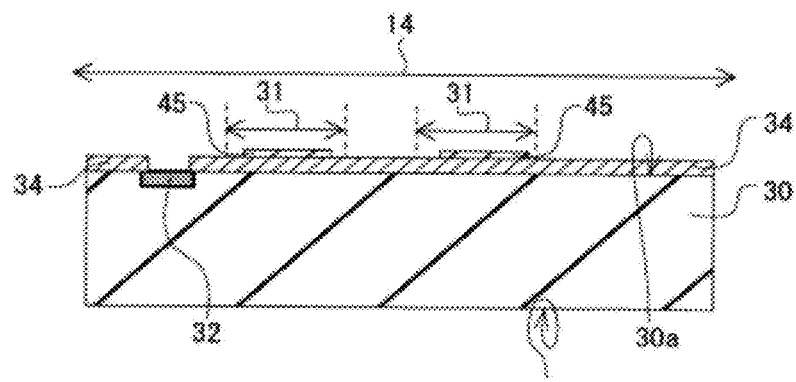
FIGS. 6(A) to 6(C) are schematic views showing a method of producing the semiconductor device according to the second embodiment of the present invention.
Figure 6B:
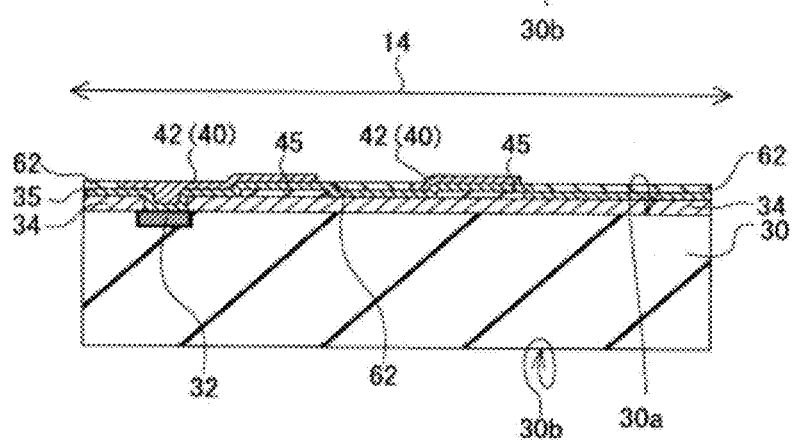
Figure 6C:
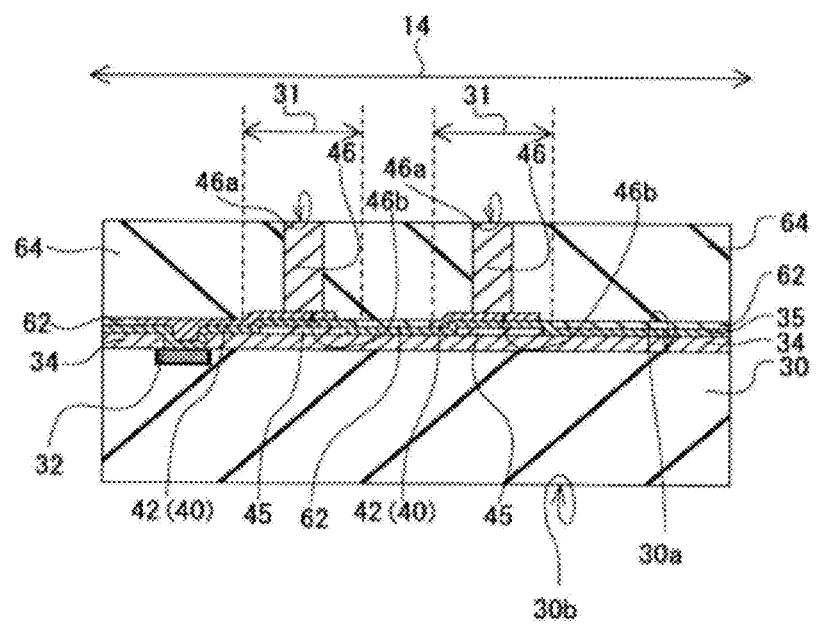
Figure 7A:
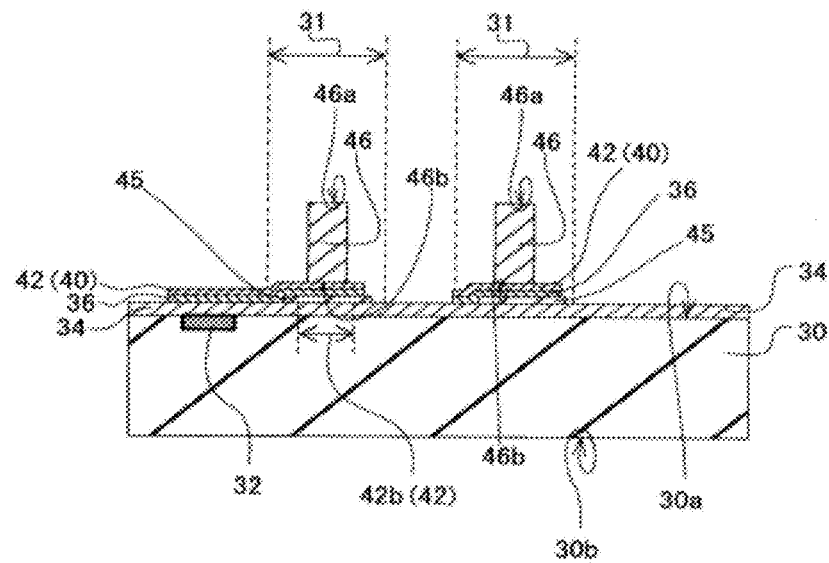
FIGS. 7(A) and 7(B) are schematic views showing the method of producing the semiconductor device continued from FIG. 6(C) according to the second embodiment of the present invention.
Figure 7B:
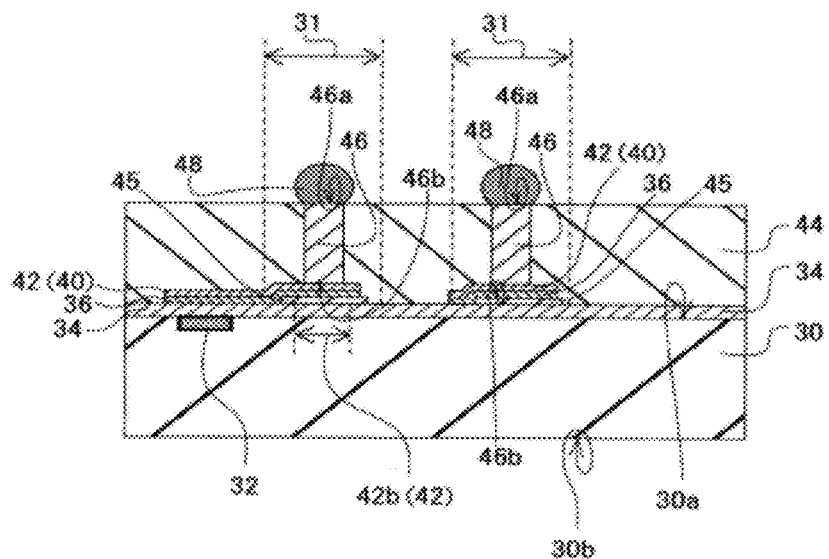

A method of producing the semiconductor device will be explained next with reference to FIGS. 6(A)-6(C) and 7(A)-7(B). FIGS. 6(A) to 6(C) are schematic views showing the method of producing the semiconductor device according to the second embodiment of the present invention. FIGS. 7(A) and 7(B) are schematic views showing the method of producing the semiconductor device continued from FIG. 6(C) according to the second embodiment of the present invention. Each of steps in the method proceeds a wafer level, and just a part of the wafer will be described.

First, a semiconductor substrate (semiconductor wafer) is prepared. A plurality of semiconductor chip areas is defined on the semiconductor substrate in a matrix pattern. Each of the semiconductor chip areas becomes a semiconductor chip after a cutting process. A scribe line is defined between adjacent semiconductor chip areas.

As shown in FIG. 6(A), the semiconductor chip 30 has the first main surface 30a, the second main surface 30b opposite to the first main surface 30a, and several side surfaces between the first main surface 30a and the second main surface 30b. The electrode pads 32 are exposed from the first main surface 30a in the semiconductor chip area 14 of the semiconductor substrate. The electrode pads 32 are arranged in a line with an equal interval (not shown) along the scribe line or a side edge of the semiconductor chip area 14.

The interlayer insulation layer 34 as an insulation layer is formed on the first main surface 30a, so that the electrode pads 32 are partially exposed from the interlayer insulation layer 34. The post electrode mounting areas 31 are defined on the interlayer insulation layer 34 or on the first main surface 30a in advance, so that the post electrodes 46 are finally situated in the post electrode mounting areas 31. The post electrode mounting areas 31 are arbitrarily arranged at positions according to a design.

In the next step, the stress resistance resin pattern 45 is formed in each of the post electrode mounting areas 31. In forming the stress resistance resin pattern 45, an arbitrary photosensitive resin is coated a whole exposed surface. Then, the photosensitive resin is patterned with a conventional patterning method such as photolithography according to the photosensitive resin, thereby forming the stress resistance resin pattern 45.

In the next step, the precursor base metal layer 35 is formed on the interlayer insulation layer 34, the stress resistance resin patterns 45, and the electrode pads 32 thus exposed, i.e., a whole exposed surface. The precursor base metal layer 35 may be formed of an arbitrary material with a well-known sputtering method and the likes. When the precursor base metal layer 35 is formed of a laminated structure, the laminated structure may constitute titanium (Ti), tungsten (W), and chrome (Cr) laminated in this order, or copper (Cu), nickel (Ni), gold (Au), and palladium (Pd) laminated in this order.

As shown in FIG. 6(B), the first resist pattern 62 for forming the re-wiring layer 40 is formed with well-known photolithography. The re-wiring layer 40 may be formed using such an appropriate material as copper with a manufacturing process of a wiring pattern in a manufacturing process of a conventional W-CSP. Preferably, the re-wiring layer 40 is formed with a well-known electroplating method using the precursor base metal layer 35 as a common electrode.

In the next step, the first resist pattern 62 is removed using a solvent selected according to a material of the first resist pattern 62. Accordingly, it is possible to form the wiring patterns 42 having the post electrode mounting portions 42b situated on the stress resistance resin patterns 45.

In the next step, as shown in FIG. 6(C), the second resist pattern 64 for forming the post electrodes 46 is formed. The second resist pattern 64 has openings at positions corresponding to the post electrode forming areas 31. The second resist pattern 64 may be formed with well-known photolithography in a manufacturing process of a conventional W-CSP. With the second resist pattern 64 as a mask, the post electrodes 46 are formed. Similar to the re-wiring layer 40, the post electrodes 46 may be formed using such an appropriate material as copper. Preferably, the post electrodes 46 are formed with a well-known electroplating method using the precursor base metal layer 35 as a common electrode. Accordingly, the post electrodes 46 are formed on the post electrode mounting portions 42b of the wiring patterns 42 having the configuration described above.

In the next step, as shown in FIG. 7(A), the second resist pattern 64 is removed using a solvent selected according to a material of the second resist pattern 64. A portion of the precursor base metal layer 35 exposed from the wiring patterns 42 is removed with an etching process suitable for a material of the precursor base metal layer 35.

As a result, the precursor base metal layer 35 is formed in a pattern same as that of the wiring patterns 42 in the re-wiring layer 40 situated above the interlayer insulation layer 34 and just below the re-wiring layer 40, thereby forming the base metal patterns 36.

In the next step, as shown in FIG. 7(B), the sealing portion 44 is formed to cover the wiring patterns 42 thus exposed, the stress resistance resin patterns 45, the base metal patterns 36, the post electrodes 46, and the interlayer insulation layer 34. The sealing portion 44 may be formed using a well-known sealing material such as an epoxy type mold resin with a well-known method. In the step of forming the sealing portion 44, after the sealing resin covers the top surfaces 46a of the post electrodes 46, the sealing resin is ground from a front side thereof with a well-known grinding method or a polishing method, so that the top surfaces 46a of the post electrodes 46 are exposed.

In the next step, as shown in FIG. 7(B), solder balls 48a as the outer terminals 48 are formed on the top surfaces 46a of the post electrodes 46 exposed from a flat surface of the sealing portion 44. In the last step, the semiconductor wafer is cut between the semiconductor chip areas 14 along the scribe line, thereby individually obtaining the semiconductor device having the semiconductor chip 30. It is preferred that the semiconductor wafer is cut with a blade rotating at a high speed.

Third Embodiment

Figure 8A:
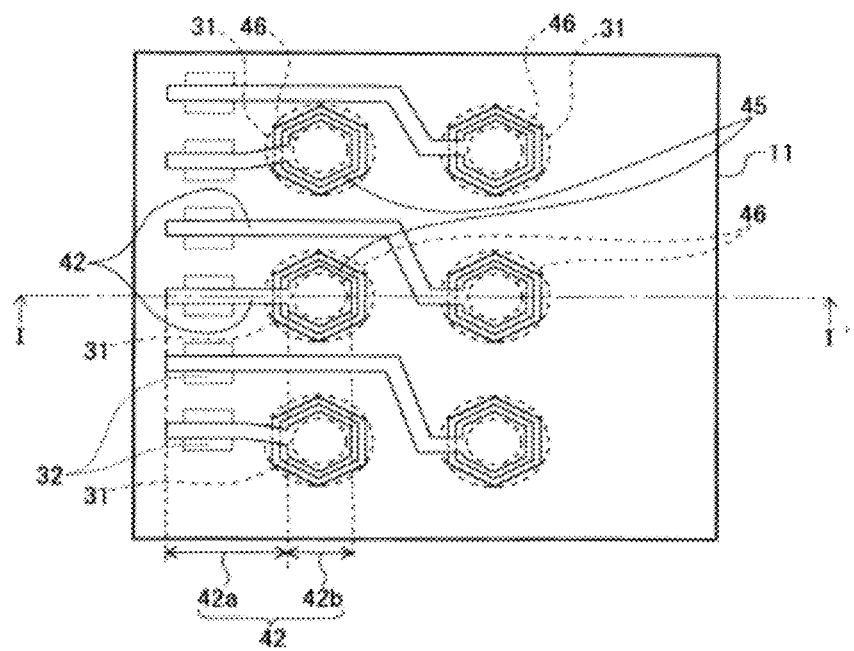
FIG. 8(A) is a schematic plan view showing a wiring pattern of the semiconductor device according to a third embodiment of the present invention.

A third embodiment of the present invention will be explained next with reference to FIGS. 8(A) and 8(B). FIG. 8(A) is a schematic plan view showing a wiring pattern of a semiconductor device according to the third embodiment of the present invention, and FIG. 8(B) is a schematic sectional view taken along a projected line I-I' in FIG. 8(A).

In the third embodiment, the semiconductor device is characterized that a stress resistance resin pattern and a stress resistance metal pattern are formed below a post electrode mounting area of a wiring pattern, i.e., just below a base metal pattern. Other than the stress resistance resin pattern and the stress resistance metal pattern, components in the third embodiment same as those in the first embodiment are designated by the same reference numerals, and explanations thereof are omitted.

Figure 8B:
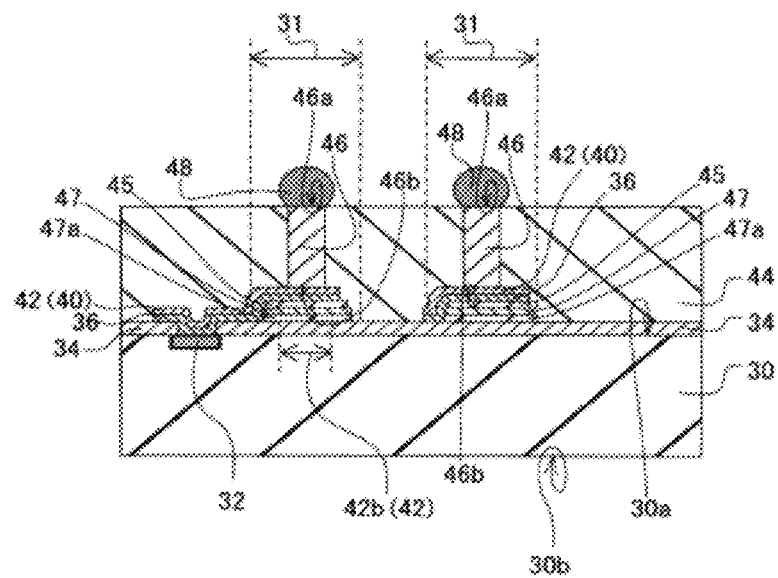
FIG. 8(B) is a schematic sectional view taken along a projected line I-I' in FIG. 8(A)

As shown in FIGS. 8(A) and 8(B), similar to the first embodiment, the semiconductor device or a W-CSP (Wafer level Chip Size Package) includes the semiconductor chip 30. Further, each of the wiring patterns 42 includes the post electrode mounting portion 42b integrally connected to the other end portion of the linear portion 42a extending from the electrode pad 32.

In the embodiment, the post electrode mounting portion 42b has an upper contour having a regular hexagon shape. The shape of the upper contour is not limited thereto, and may be any arbitrary shape as far as the bottom surface 46b of the post electrode 46 is completely accommodated in the upper contour. The post electrode mounting portions 42b are situated in the post electrode forming areas 31 defined in advance. The base metal patterns 36 are situated just below the post electrode mounting portions 42b, and have a size and a shape same as those of the post electrode mounting portions 42b.

In the embodiment, the stress resistance resin patterns 45 are formed in the post electrode forming areas 31 just below the base metal patterns 36. The stress resistance resin patterns 45 may have any arbitrary shape and size as far as the post electrode mounting portions 42b are completely accommodated in a contour of the stress resistance resin patterns 45.

In the embodiment, the stress resistance resin patterns 45 have a regular hexagonal shape. The stress resistance resin patterns 45 may be formed of any arbitrary material such as a photosensitive resin, as far as the material does not pose any negative influence on surrounding component such as the base metal patterns 36, the wiring patterns 42, and the post electrodes 46. Preferably, the stress resistance resin patterns 45 are formed of a material same as that of the interlayer insulation layer 34. Further, the stress resistance resin patterns 45 preferably have a thickness between 2.0 μm to 10.0 μm, especially about 5.0 μm.

In the embodiment, in addition to the stress resistance resin patterns 45, stress resistance metal patterns 47 are formed in the post electrode forming areas 31 just below the stress resistance resin patterns 45. The stress resistance metal patterns 47 may have any arbitrary shape and size as far as the stress resistance resin patterns 45 situated thereabove are completely accommodated in a contour of the stress resistance metal patterns 47. That is, the stress resistance metal patterns 47 may have a plan size viewed from above larger than that of the stress resistance resin patterns 45.

In the embodiment, the stress resistance metal patterns 47 have a regular hexagonal shape larger than that of the stress resistance resin patterns 45. The stress resistance metal patterns 47 may be formed of a metal material, preferably copper (Cu), nickel (Ni) gold (Au), or palladium (Pd). The stress resistance metal patterns 47 may be formed of a laminated structure of several layers according to requirement or limitations of a manufacturing process.

In the embodiment, when the stress resistance metal patterns 47 are formed with an electroplating method, one or more layers of stress resistance base metal patterns 47a are formed just below the stress resistance metal patterns 47. Further, the stress resistance metal patterns 47 preferably have a thickness between 2.0 μm to 10.0 μm, especially about 5.0 μm.

In the embodiment, the stress resistance metal patterns 47 may have a recessed polygonal shape (polygonal star shape) viewed from above. For example, the stress resistance metal patterns 47 may have an upper contour shape of a substantially six-corner star having six acute angle corners (protruding portions).

In the embodiment, the shape and size of the stress resistance metal patterns 47 are arbitrary and may be adjusted as necessary. Preferably, in the polygonal shape of the stress resistance metal patterns 47, recess portions with a blunt angle between the protruding portions are situated within the contours of the stress resistance resin patterns 45, the post electrode mounting portions 42b, and the bottom surfaces 46b of the post electrodes 46.

In the embodiment, the post electrodes 46 are disposed on the post electrode mounting portions 42b. The post electrodes 46 are preferably formed of copper. Each of the post electrodes 46 has a column shape having the top surface 46a with a circular shape and the bottom surface 46b with a circular shape opposite to the top surface 46a. Each of the post electrodes 46 is disposed on one of the post electrode mounting portions 42b, so that a contour of the bottom surface 46b of the post electrode 46 is accommodated in a plan contour of the post electrode mounting portion 42b having a hexagonal shape.

In the embodiment, as shown in FIG. 8(A), the post electrodes 46 are arranged in a matrix pattern with an equal interval. The number and arrangement of the post electrodes 46 are arbitrary and may be adjusted as necessary.

In the embodiment, the sealing portion 44 is disposed to cover the re-wiring layer 40, the post electrodes 46, and the interlayer insulation layer 34 thus exposed. The sealing portion 44 is formed of an arbitrary insulation material formed in an insulation layer. The top surfaces 46a of the post electrodes 46 are exposed from a surface of the sealing portion 44. The outer terminals 48 are disposed on the top surfaces 46a thus exposed. The outer terminals 48 are formed of solder balls.

With the configuration described above, when an external stress is applied to the post electrodes 46, the stress resistance resin patterns 45 alleviate the external stress. Accordingly, it is possible to prevent the post electrodes 46 and the wiring patterns 42 connected thereto from being damaged.

Figure 9A:
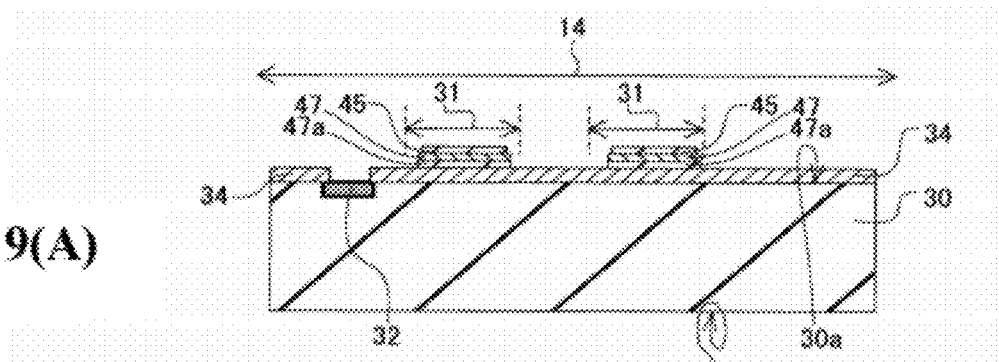
FIGS. 9(A) to 9(C) are schematic views showing a method of producing the semiconductor device according to the third embodiment of the present invention.
Figure 9B:
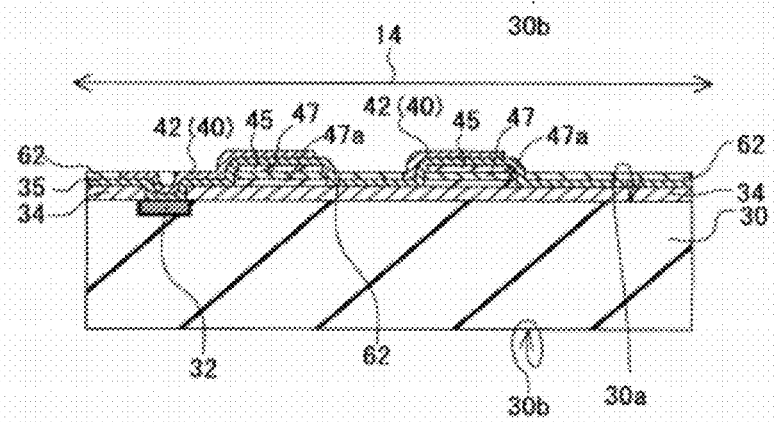
Figure 9C:
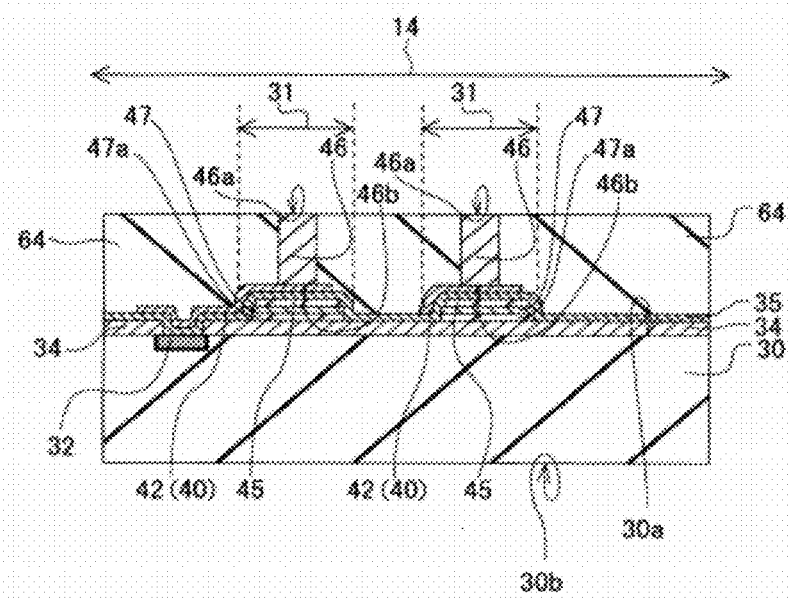
Figure 10A:
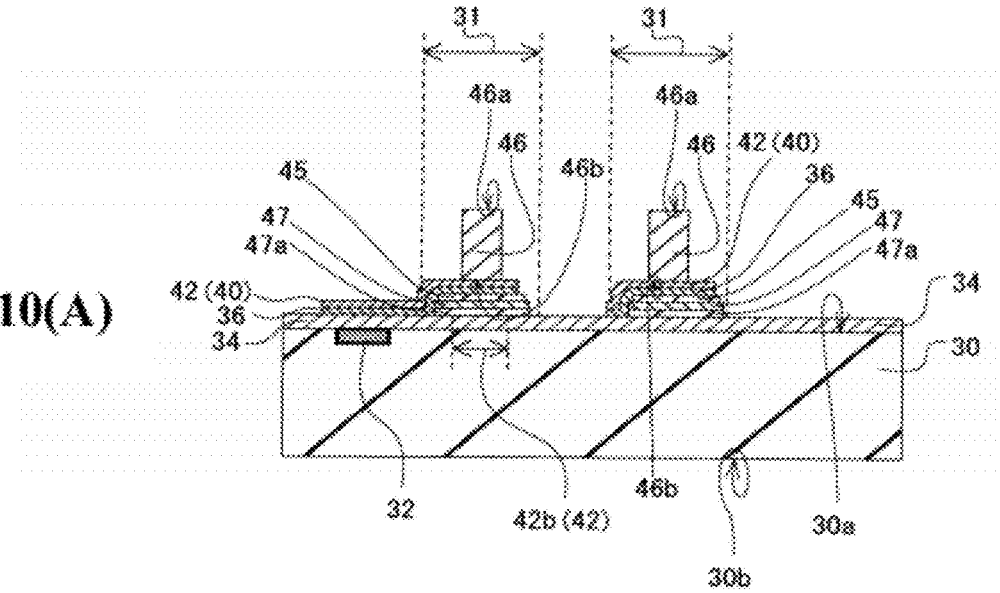
FIGS. 10(A) and 10(B) are schematic views showing the method of producing the semiconductor device continued from FIG. 9(C) according to the third embodiment of the present invention.
Figure 10B:
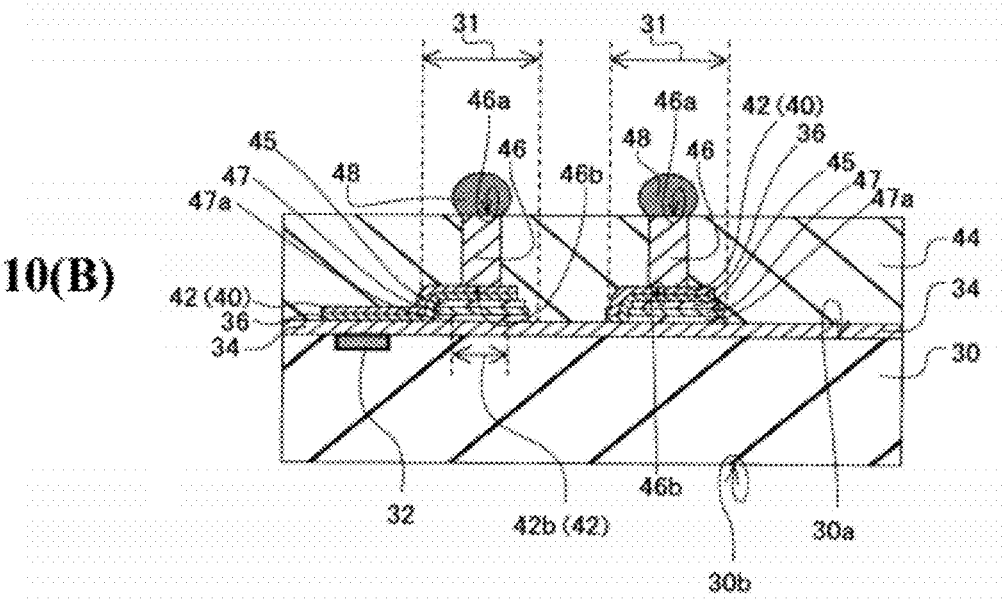

A method of producing the semiconductor device will be explained next with reference to FIGS. 9(A)-9(C) and 10(A)-10(B). FIGS. 9(A) to 9(C) are schematic views showing the method of producing the semiconductor device according to the third embodiment of the present invention. FIGS. 10(A) and 10(B) are schematic views showing the method of producing the semiconductor device continued from FIG. 9(C) according to the third embodiment of the present invention. Each of steps in the method proceeds a wafer level, and just a part of the wafer will be described.

First, a semiconductor substrate (semiconductor wafer) is prepared. A plurality of semiconductor chip areas is defined on the semiconductor substrate in a matrix pattern. Each of the semiconductor chip areas becomes a semiconductor chip after a cutting process. A scribe line is defined between adjacent semiconductor chip areas.

As shown in FIG. 9(A), the semiconductor chip 30 has the first main surface 30a, the second main surface 30b opposite to the first main surface 30a, and several side surfaces between the first main surface 30a and the second main surface 30b. The electrode pads 32 are exposed from the first main surface 30a in the semiconductor chip area 14 of the semiconductor substrate. The electrode pads 32 are arranged in a line with an equal interval (not shown) along the scribe line or a side edge of the semiconductor chip area 14.

The interlayer insulation layer 34 as an insulation layer is formed on the first main surface 30a, so that the electrode pads 32 are partially exposed from the interlayer insulation layer 34. The post electrode mounting areas 31 are defined on the interlayer insulation layer 34 or on the first main surface 30a in advance, so that the post electrodes 46 are finally situated in the post electrode mounting areas 31. The post electrode mounting areas 31 are arbitrarily arranged at positions according to a design.

In the next step, the stress resistance metal patterns 47 having various patterns are formed in the post electrode mounting areas using copper with an electroplating method. Before forming the stress resistance metal patterns 47, precursor stress resistance base metal layer is formed on the interlayer insulation layer 34.

In the embodiment, the precursor stress resistance base metal layer may be formed of an arbitrary material with a well-known sputtering method and the likes suitable for the material thus selected. When the precursor stress resistance base metal layer is formed of a laminated structure having several layers, the laminated structure may constitute titanium (Ti), tungsten (W), and chrome (Cr) laminated in this order, or copper (Cu), nickel (Ni), gold (Au), and palladium (Pd) laminated in this order.

In the next step, a resist pattern for forming the stress resistance metal patterns 47 is formed on the precursor stress resistance base metal layer with well-known photolithography. Then, the stress resistance metal patterns 47 are formed of copper as a material with a well-known electroplating method using the precursor stress resistance base metal layer as a common electrode.

In the next step, the resist pattern is removed using a solvent selected according to a material of the resist pattern. Accordingly, it is possible to form the stress resistance metal patterns 47 on the precursor stress resistance base metal layer in the post electrode mounting areas 31. Further, a portion of the precursor stress resistance base metal layer exposed from the post electrode mounting areas 31 is removed with an etching process suitable for a material of the precursor stress resistance base metal layer.

As shown in FIG. 9(A), through the steps described above, the precursor stress resistance base metal layer is processed to form stress resistance base metal layers 47a situated on the interlayer insulation layer 34 just below the stress resistance metal patterns 47.

In the next step, the stress resistance resin pattern 45 is formed on the stress resistance base metal layer 47a in each of the post electrode mounting areas 31. In forming the stress resistance resin pattern 45, an arbitrary photosensitive resin is coated a whole exposed surface. Then, the photosensitive resin is patterned with a conventional patterning method such as photolithography according to the photosensitive resin, thereby forming the stress resistance resin pattern 45.

In the next step, the precursor base metal layer 35 is formed on the interlayer insulation layer 34, the stress resistance base metal layer 47a, the stress resistance metal patterns 47, the stress resistance resin patterns 45, and the electrode pads 32 thus exposed, i.e., a whole exposed surface. The precursor base metal layer 35 may be formed of an arbitrary material with a well-known sputtering method and the likes. When the precursor base metal layer 35 is formed of a laminated structure, the laminated structure may constitute titanium (Ti), tungsten (W), and chrome (Cr) laminated in this order, or copper (Cu), nickel (Ni), gold (Au), and palladium (Pd) laminated in this order.

As shown in FIG. 9(B), the first resist pattern 62 for forming the re-wiring layer 40 is formed with well-known photolithography. The re-wiring layer 40 may be formed using such an appropriate material as copper with a manufacturing process of a wiring pattern in a manufacturing process of a conventional W-CSP. Preferably, the re-wiring layer 40 is formed with a well-known electroplating method using the precursor base metal layer 35 as a common electrode.

In the next step, the first resist pattern 62 is removed using a solvent selected according to a material of the first resist pattern 62. Accordingly, it is possible to form the wiring patterns 42 having the post electrode mounting portions 42b situated on the stress resistance resin patterns 45.

In the next step, as shown in FIG. 9(C), the second resist pattern 64 for forming the post electrodes 46 is formed. The second resist pattern 64 has openings at positions corresponding to the post electrode forming areas 31. The second resist pattern 64 may be formed with well-known photolithography in a manufacturing process of a conventional W-CSP. With the second resist pattern 64 as a mask, the post electrodes 46 are formed. Similar to the re-wiring layer 40, the post electrodes 46 may be formed using such an appropriate material as copper. Preferably, the post electrodes 46 are formed with a well-known electroplating method using the base metal layer 35 as a common electrode. Accordingly, the post electrodes 46 are formed on the post electrode mounting portions 42b of the wiring patterns 42 having the configuration described above.

In the next step, as shown in FIG. 10(A), the second resist pattern 64 is removed using a solvent selected according to a material of the second resist pattern 64. Then, the precursor base metal layer 35 is removed with an etching process suitable for a material of the precursor base metal layer 35.

As a result, the precursor base metal layer 35 is formed in a pattern same as that of the wiring patterns 42 in the re-wiring layer 40 situated above the stress resistance resin patterns 45 and just below the re-wiring layer 40, thereby forming the base metal patterns 36.

In the next step, as shown in FIG. 10(B), the sealing portion 44 is formed to cover the stress resistance base metal layer 47a, the stress resistance metal patterns 47, the stress resistance resin patterns 45, the base metal patterns 36, the wiring patterns 42, the post electrodes 46, and the interlayer insulation layer 34. The sealing portion 44 may be formed using a well-known sealing material such as an epoxy type mold resin with a well-known method. In the step of forming the sealing portion 44, after the sealing resin covers the top surfaces 46a of the post electrodes 46, the sealing resin is ground from a front side thereof with a well-known grinding method or a polishing method, so that the top surfaces 46a of the post electrodes 46 are exposed.

In the next step, the solder balls 48a as the outer terminals 48 are formed on the top surfaces 46a of the post electrodes 46 exposed from a surface of the sealing portion 44. In the last step, the semiconductor wafer is cut between the semiconductor chip areas 14 along the scribe line, thereby individually obtaining the semiconductor device having the semiconductor chip 30.

Fourth Embodiment

Figure 11A:
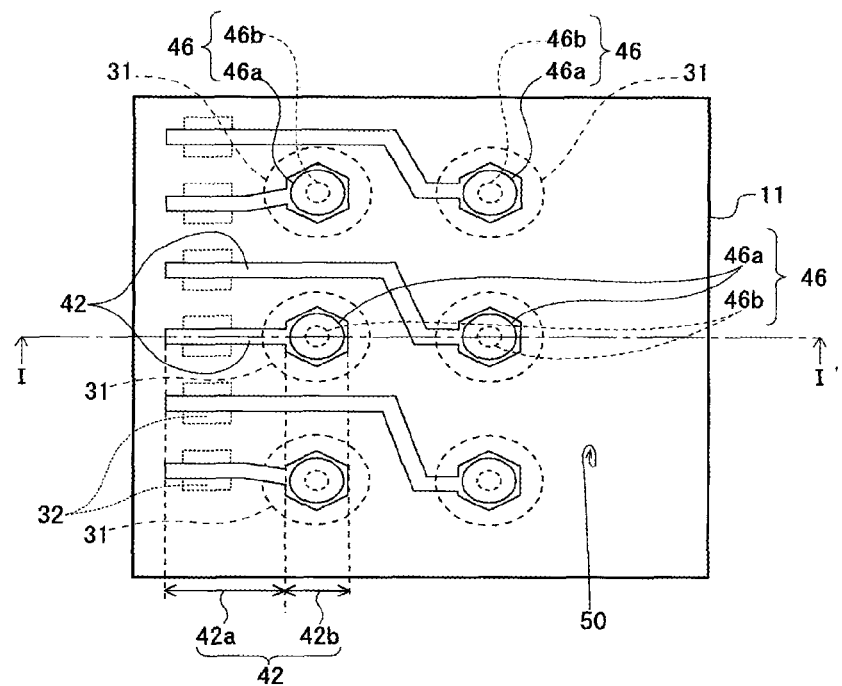
FIG. 11(A) is a schematic plan view showing a wiring pattern of the semiconductor device according to a fourth embodiment of the present invention.

A fourth embodiment of the present invention will be explained next with reference to FIGS. 11(A) and 11(B). FIG. 11(A) is a schematic plan view showing a wiring pattern of a semiconductor device according to the fourth embodiment of the present invention, and FIG. 11(B) is a schematic sectional view taken along a projected line I-I' in FIG. 11(A).

In the fourth embodiment, the semiconductor device is characterized that the post electrode has a specific shape, and a stress absorption resin layer is formed on the wiring pattern. Other than the shape of the post electrode and the stress absorption resin layer, components in the fourth embodiment same as those in the first embodiment are designated by the same reference numerals, and explanations thereof are omitted.

Figure 11B:
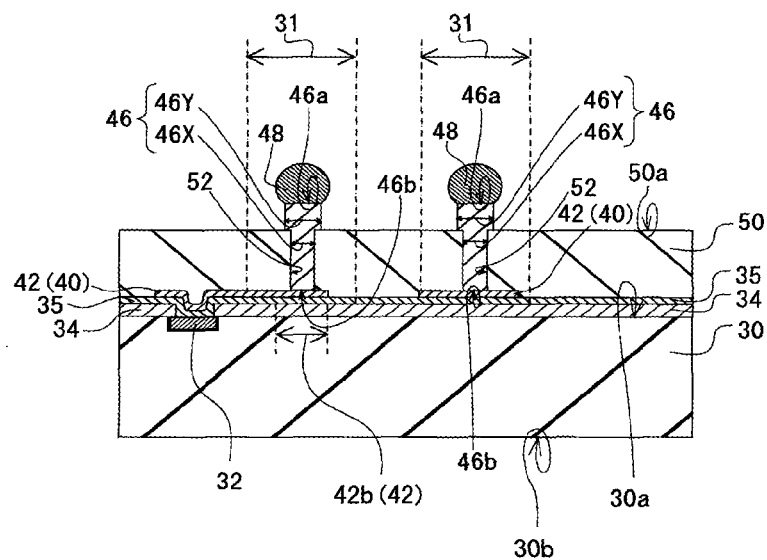
FIG. 11(B) is a schematic sectional view taken along a projected line I-I' in FIG. 11(A)

As shown in FIGS. 11(A) and 11(B), similar to the first embodiment, the semiconductor device or a W-CSP (Wafer level Chip Size Package) includes the semiconductor chip 30. The semiconductor chip 30 includes a circuit element (not shown) having a specific function. Further, the semiconductor chip 30 has the first main surface 30a and the second main surface 30b opposite to the first main surface 30a.

In the embodiment, a base metal layer 35 is disposed on the interlayer insulation layer 34. The base metal layer 35 may be formed of a laminated structure of titanium (Ti), tungsten (W), and chrome (Cr) laminated in this order, or a laminated structure of copper (Cu), nickel (Ni), gold (Au), and palladium (Pd) laminated in this order. When the base metal layer 35 is formed of a laminated structure, each of the layers has a thickness between 100 μm to 300 μm, so that the laminated structure has a thickness of 500 μm to 800 μm.

In the embodiment, the wiring patterns 42 are formed on the base metal layer 35 for electrically connecting to the electrode pads 32. The wiring patterns 42 include the linear portions 42a having a linear shape, a curved shape, or a combination thereof. One end portion of the linear portion 42a is electrically connected to one of the electrode pads 32 through the base metal patterns 36. Further, each of the wiring patterns 42 includes the post electrode mounting portion 42b integrally connected to the other end portion of the linear portion 42a extending from the electrode pad 32.

In the embodiment, an upper contour of the post electrode mounting portions 42b has a regular hexagonal shape. The upper contour of the post electrode mounting portions 42b may be formed in any arbitrary shape, as far as the bottom surfaces 46b of the post electrodes 46 are completely accommodated in the upper contour of the post electrode mounting portions 42b. The post electrode mounting portions 42b are situated in the post electrode forming areas 31 defined in advance.

In the embodiment, the semiconductor device is provided with a stress absorption resin layer 50 having a flat surface. The stress absorption resin layer 50 is integrally disposed to cover the re-wiring layer 40 disposed on the base metal layer 35 in a state that the post electrode mounting portions 42b are partially exposed.

In the embodiment, the stress absorption resin layer 50 includes opening portions 52 (contact holes). The opening portions 52 extend from a surface of the stress absorption resin layer 50 to the post electrode mounting portions 42b, so that the post electrode mounting portions 42b are partially exposed.

In the embodiment, the stress absorption resin layer 50 is formed of an insulation layer made of an insulation material such as a photosensitive resin. Preferably, the stress absorption resin layer 50 is formed of a material same as that of the interlayer insulation layer 34.

In the embodiment, the semiconductor device is provided with the post electrodes 46. The post electrodes 46 are preferably formed of copper. Each of the post electrodes 46 has a first portion 46X and a second portion 46Y having different diameters.

In the embodiment, the first portion 46X extends from a surface 50a of the stress absorption resin layer 50 to one of the post electrode mounting portions 42b, and is filled in one of the opening portions 52. Further, the first portion 46X has a bottom surface 46b connected to the one of the post electrode mounting portions 42b. The first portion 46X has a diameter large enough to electrically connect to the one of the post electrode mounting portions 42b, i.e., the wiring pattern.

In the embodiment, the second portion 46Y is integrated with the first portion 46X, and is situated just above the first portion 46X. The second portion 46Y has a column shape protruding from the surface 50a of the stress absorption resin layer 50. Further, the second portion 46Y has a top surface 46a with a circular shape, and has a diameter larger than that of the first portion 46X. Each of the post electrodes 46 is disposed on one of the post electrode mounting portions 42b, so that the contour of the bottom surface 46b of the post electrode 46 is accommodated in the plan contour of the post electrode mounting portion 42b having a hexagonal shape.

In the embodiment, as shown in FIG. 11(A), the post electrodes 46 are arranged in a matrix pattern with an equal interval. The number and arrangement of the post electrodes 46 are arbitrary and may be adjusted as necessary. The outer terminals 48 are disposed on the top surfaces 46a of the post electrodes 46. The outer terminals 48 are formed of solder balls.

With the configuration described above, when an external stress is applied to the post electrodes 46, the stress absorption resin layer 50 effectively alleviates the external stress. Accordingly, it is possible to prevent the post electrodes 46 and the wiring patterns 42 connected thereto from being damaged.

Figures 12A, 12B, 12C:
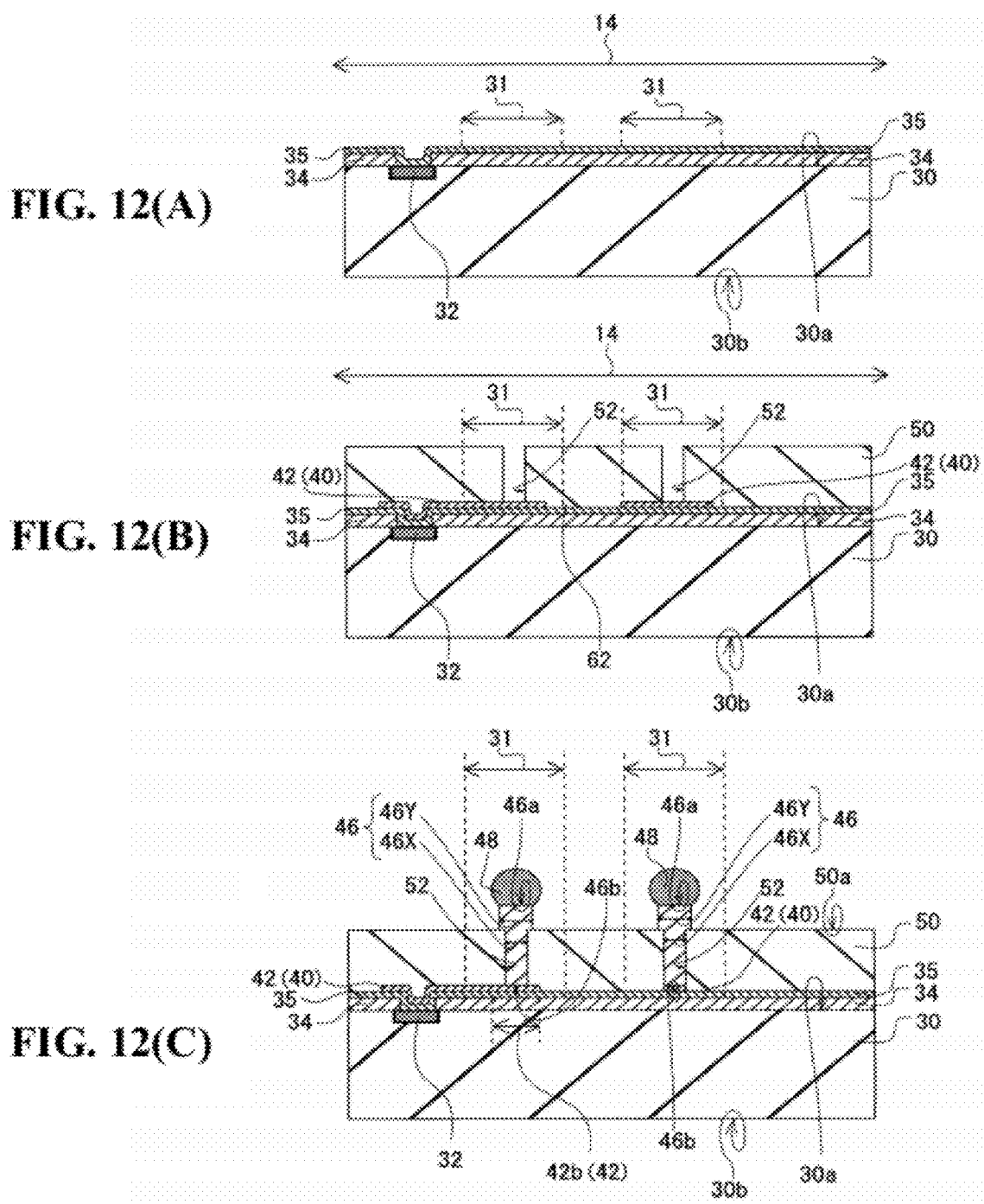
FIGS. 12(A) to 12(C) are schematic sectional views of the semiconductor device during a manufacturing process thereof according to the fourth embodiment of the present invention.

A method of producing the semiconductor device will be explained next with reference to FIGS. 12(A) to 12(C). FIGS. 12(A) to 12(C) are schematic sectional views of the semiconductor device during a manufacturing process thereof according to the fourth embodiment of the present invention. Each of steps in the method proceeds a wafer level, and just a part of the wafer will be described.

First, a semiconductor substrate (semiconductor wafer) is prepared. A plurality of semiconductor chip areas is defined on the semiconductor substrate in a matrix pattern. Each of the semiconductor chip areas becomes a semiconductor chip after a cutting process. A scribe line is defined between adjacent semiconductor chip areas.

As shown in FIGS. 12(A) to 12(C), the semiconductor chip 30 has the first main surface 30a, the second main surface 30b opposite to the first main surface 30a, and several side surfaces between the first main surface 30a and the second main surface 30b. The electrode pads 32 are exposed from the first main surface 30a in the semiconductor chip area 14 of the semiconductor substrate. The electrode pads 32 are arranged in a line with an equal interval (not shown) along the scribe line or a side edge of the semiconductor chip area 14.

The interlayer insulation layer 34 as an insulation layer is formed on the first main surface 30a, so that the electrode pads 32 are partially exposed from the interlayer insulation layer 34. The post electrode mounting areas 31 are defined on the interlayer insulation layer 34 or on the first main surface 30a in advance, so that the post electrodes 46 are finally situated in the post electrode mounting areas 31. The post electrode mounting areas 31 are arbitrarily arranged at positions according to a design.

In the next step, the base metal layer 35 is formed on the interlayer insulation layer 34, and the electrode pads 32 thus exposed, i.e., a whole exposed surface. The base metal layer 35 may be formed of an arbitrary material with a well-known sputtering method and the likes. When the base metal layer 35 is formed of a laminated structure, the laminated structure may constitute titanium (Ti), tungsten (W), and chrome (Cr) laminated in this order, or copper (Cu), nickel (Ni), gold (Au), and palladium (Pd) laminated in this order.

In the next step, the re-wiring layer 40 are formed on the base metal layer 35. The re-wiring layer 40 may be formed using such an appropriate material as copper with a manufacturing process of a wiring pattern in a manufacturing process of a conventional W-CSP. Preferably, the re-wiring layer 40 is formed with a well-known electroplating method using the base metal layer 35 as a common electrode. Accordingly, it is possible to form the wiring patterns 42 having the post electrode mounting portions 42b situated in the post electrode forming areas 31.

In the next step, the stress absorption resin layer 50 is formed to cover the re-wiring layer 40 disposed on the base metal layer 35. When the stress absorption resin layer 50 is formed of a photosensitive resin, a resin layer is patterned with photolithography under an appropriate condition to form the opening portions 52.

In the next step, the opening portions 52 in the post electrode forming areas 31 are filled to form the post electrodes 46. As described above, the post electrodes 46 are integrally include the first portions 46X extending from the surface 50a of the stress absorption resin layer 50 to the wiring patterns 42 and the second portions 46Y having a diameter larger than that of the first portion 46X. At this time, the second portions 46Y are situated in the post electrode forming areas 31 for connecting the surface 50a of the stress absorption resin layer 50 and the first portions 46X.

In particular, a resist pattern for forming the post electrodes 46 is formed with well-known photolithography suitable for a material of the resist pattern. With the resist pattern as a mask, the post electrodes 46 are formed. Similar to the re-wiring layer 40, the post electrodes 46 may be formed using such an appropriate material as copper. Preferably, the post electrodes 46 are formed with a well-known electroplating method. Accordingly, the post electrodes 46 are formed on the post electrode mounting portions 42b of the wiring patterns 42 having the configuration described above.

In the next step, the resist pattern is removed using a solvent selected according to a material of the resist pattern. As shown in FIG. 12(C), the solder balls 48a as the outer terminals 48 are formed on the top surfaces 46a of the post electrodes 46 thus exposed. In the last step, the semiconductor wafer is cut between the semiconductor chip areas 14 along the scribe line, thereby individually obtaining the semiconductor device having the semiconductor chip 30.

Fifth Embodiment

Figure 13A:
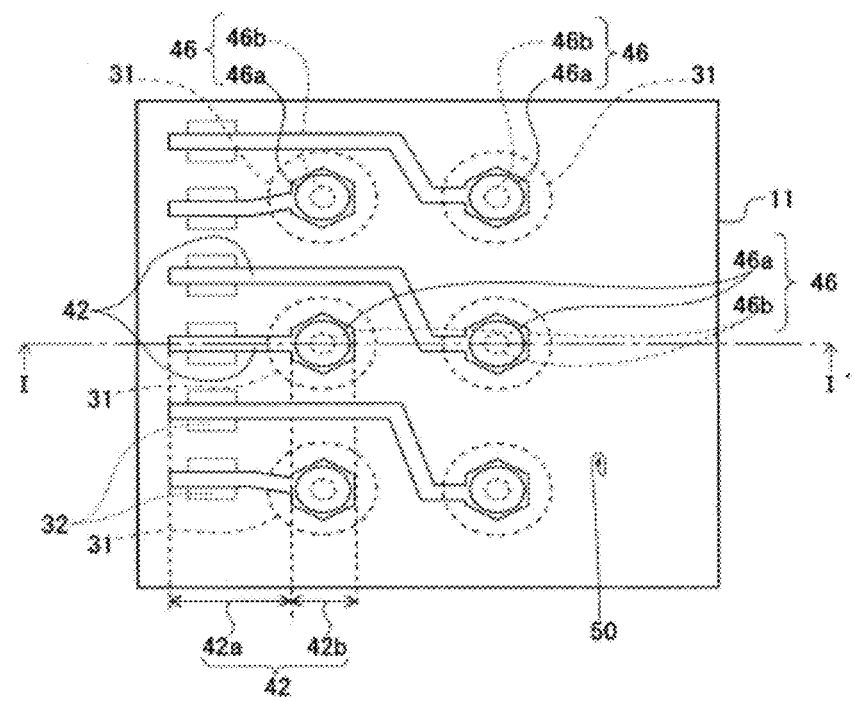
FIG. 13(A) is a schematic plan view showing a wiring pattern of the semiconductor device according to a fifth embodiment of the present invention.

A fifth embodiment of the present invention will be explained next with reference to FIGS. 13(A) and 13(B). FIG. 13(A) is a schematic plan view showing a wiring pattern of a semiconductor device according to the fifth embodiment of the present invention, and FIG. 13(B) is a schematic sectional view taken along a projected line I-I' in FIG. 13(A).

In the fifth embodiment, the semiconductor device is characterized that the post electrode has a specific shape; the stress absorption resin layer is formed on the wiring pattern; and a post electrode base metal pattern is formed just below the stress absorption resin layer. Other than the shape of the post electrode, the stress absorption resin layer, and the post electrode base metal pattern, components in the fifth embodiment same as those in the first embodiment are designated by the same reference numerals, and explanations thereof are omitted.

Figure 13B:
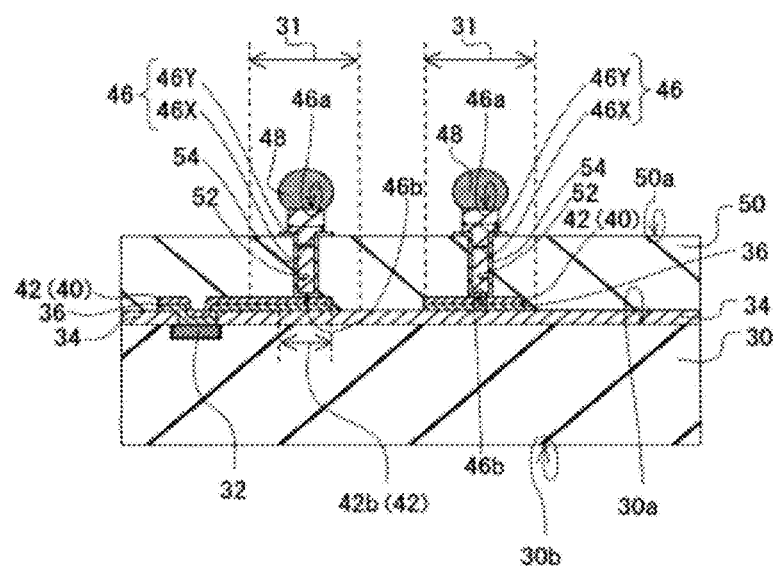
FIG. 13(B) is a schematic sectional view taken along a projected line I-I' in FIG. 13(A)

As shown in FIGS. 13(A) and 13(B), similar to the first embodiment, the semiconductor device or a W-CSP (Wafer level Chip Size Package) includes the semiconductor chip 30. Similar to the first embodiment, the interlayer insulation layer 34 is formed on the first main surface 30a of the semiconductor chip 30, and the base metal layers 36 are disposed on the interlayer insulation layer 34.

In the embodiment, the wiring patterns 42 are formed on the base metal layers 36 for electrically connecting to the electrode pads 32. Each of the wiring patterns 42 includes the post electrode mounting portion 42b integrally connected to the other end portion of the linear portion 42a extending from the electrode pad 32. An upper contour of the post electrode mounting portions 42b has a regular hexagonal shape. The upper contour of the post electrode mounting portions 42b may be formed in any arbitrary shape, as far as the bottom surfaces 46b of the post electrodes 46 are completely accommodated in the upper contour of the post electrode mounting portions 42b. The post electrode mounting portions 42b are situated in the post electrode forming areas 31 defined in advance.

In the embodiment, the semiconductor device is provided with the stress absorption resin layer 50. The stress absorption resin layer 50 is integrally disposed on the base metal layers 36 to cover the re-wiring layer 40 in a state that the post electrode mounting portions 42b are partially exposed.

In the embodiment, the stress absorption resin layer 50 includes the opening portions 52 (contact holes). The opening portions 52 extend from a surface of the stress absorption resin layer 50 in the post electrode forming areas 31 to the post electrode mounting portions 42b, so that the post electrode mounting portions 42b are partially exposed.

In the embodiment, the stress absorption resin layer 50 is formed of an insulation layer made of an insulation material such as a photosensitive resin. Preferably, the stress absorption resin layer 50 is formed of a material same as that of the interlayer insulation layer 34.

In the embodiment, the semiconductor device is provided with post electrode base metal patterns 54. The post electrode base metal patterns 54 cover inside the opening portions 54, i.e., sidewalls and bottom surfaces of the opening portions 54. Further, the post electrode base metal patterns 54 cover a part of the surface of the stress absorption resin layer 50 in the post electrode forming areas 31, i.e., areas surrounding opening edges of the opening portions 52. The post electrode base metal patterns 54 preferably have a thickness substantially constant.

In the embodiment, the semiconductor device is provided with the post electrodes 46. The post electrodes 46 are preferably formed of copper. Each of the post electrodes 46 has the first portion 46X and the second portion 46Y having different diameters.

In the embodiment, the first portion 46X extends from the surface 50a of the stress absorption resin layer 50 to one of the post electrode mounting portions 42b. Further, the first portion 46X is filled in one of the opening portions 52, and is electrically connected to the one of the post electrode mounting portions 42b. The first portion 46X has a diameter large enough to electrically connect to the one of the post electrode mounting portions 42b, i.e., one of the wiring patterns 42.

In the embodiment, the second portion 46Y is integrated with the first portion 46X, and is situated just above the first portion 46X and on a part of the surface 50a of the stress absorption resin layer 50 in the post electrode forming areas 31. The second portion 46Y has a column shape protruding from the surface 50a of the stress absorption resin layer 50. Further, the second portion 46Y has the top surface 46a with a circular shape, and has a diameter larger than that of the first portion 46X.

In the embodiment, each of the post electrodes 46 is disposed on one of the post electrode mounting portions 42b, so that the plan contour of the bottom surface 46b of the post electrode 46 is accommodated in the plan contour of the post electrode mounting portion 42b having a hexagonal shape.

In the embodiment, as shown in FIG. 13(A), the post electrodes 46 are arranged in a matrix pattern with an equal interval. The number and arrangement of the post electrodes 46 are arbitrary and may be adjusted as necessary. The outer terminals 48 are disposed on the top surfaces 46a of the post electrodes 46. The outer terminals 48 are formed of solder balls.

With the configuration described above, when an external stress is applied to the post electrodes 46, the stress absorption resin layer 50 effectively alleviates the external stress. Accordingly, it is possible to prevent the post electrodes 46 and the wiring patterns 42 connected thereto from being damaged.

Further, the base metal layers 36 are not situated below the stress absorption resin layer 50. Accordingly, it is possible to reduce an area of conductive portion, thereby increasing an extent of integration of the post electrodes 46 and reducing a size of the semiconductor device.

Figure 14A:
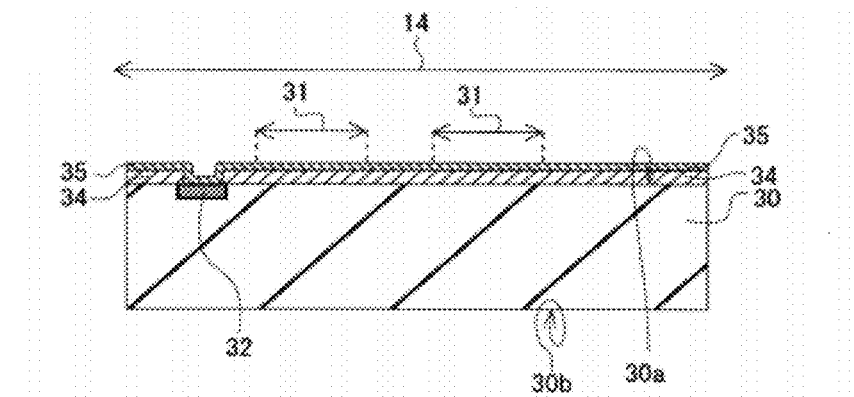
FIGS. 14(A) to 14(C) are schematic sectional views of the semiconductor device during a manufacturing process thereof according to the fifth embodiment of the present invention.
Figure 14B:
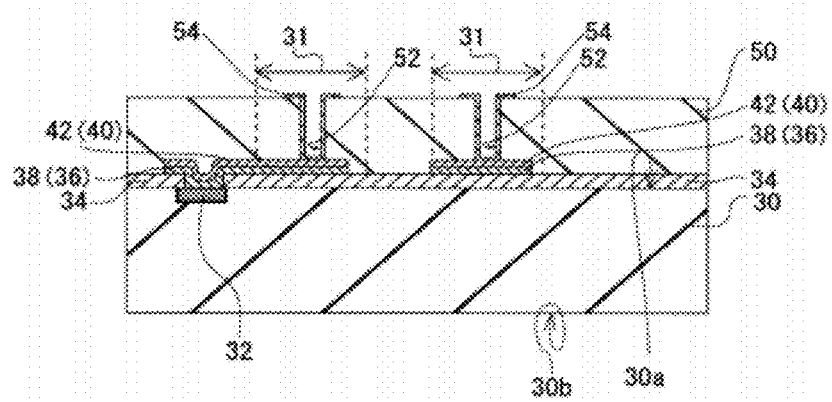
Figure 14C:
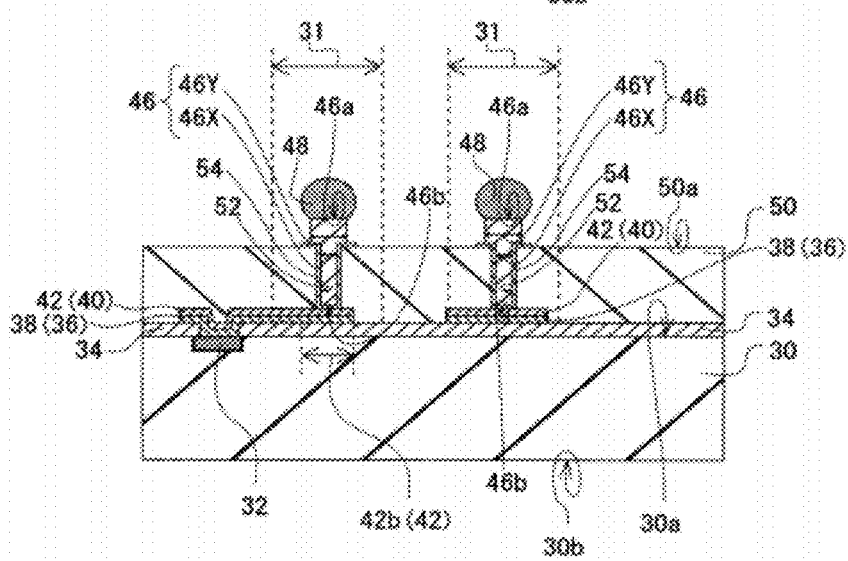

A method of producing the semiconductor device will be explained next with reference to FIGS. 14(A) to 14(C). FIGS. 14(A) to 14(C) are schematic sectional views of the semiconductor device during a manufacturing process thereof according to the fourth embodiment of the present invention. Each of steps in the method proceeds a wafer level, and just a part of the wafer will be described.

First, a semiconductor substrate (semiconductor wafer) is prepared. A plurality of semiconductor chip areas is defined on the semiconductor substrate in a matrix pattern. Each of the semiconductor chip areas becomes a semiconductor chip after a cutting process. A scribe line is defined between adjacent semiconductor chip areas.

As shown in FIGS. 14(A) to 14(C), the semiconductor chip 30 has the first main surface 30a, the second main surface 30b opposite to the first main surface 30a, and several side surfaces between the first main surface 30a and the second main surface 30b. The electrode pads 32 are exposed from the first main surface 30a in the semiconductor chip area 14 of the semiconductor substrate. The electrode pads 32 are arranged in a line with an equal interval (not shown) along the scribe line or a side edge of the semiconductor chip area 14.

The interlayer insulation layer 34 as an insulation layer is formed on the first main surface 30a, so that the electrode pads 32 are partially exposed from the interlayer insulation layer 34. The post electrode mounting areas 31 are defined on the interlayer insulation layer 34 or on the first main surface 30a in advance, so that the post electrodes 46 are finally situated in the post electrode mounting areas 31. The post electrode mounting areas 31 are arbitrarily arranged at positions according to a design.

In the next step, as shown in FIG. 14(B), the precursor base metal layer 35 is formed on the interlayer insulation layer 34, and the electrode pads 32 thus exposed, i.e., a whole exposed surface. The precursor base metal layer 35 may be formed of an arbitrary material with a well-known sputtering method and the likes. When the precursor base metal layer 35 is formed of a laminated structure, the laminated structure may constitute titanium (Ti), tungsten (W), and chrome (Cr) laminated in this order, or copper (Cu), nickel (Ni), gold (Au), and palladium (Pd) laminated in this order.

In the next step, the re-wiring layer 40 are formed on the precursor base metal layer 35. The re-wiring layer 40 may be formed using such an appropriate material as copper with a manufacturing process of a wiring pattern in a manufacturing process of a conventional W-CSP. Preferably, the re-wiring layer 40 is formed with a well-known electroplating method using the precursor base metal layer 35 as a common electrode. Accordingly, it is possible to form the wiring patterns 42 having the post electrode mounting portions 42b situated in the post electrode forming areas 31.

In the next step, portions of the precursor base metal layer 35 exposed from the wiring patterns 42 are removed with an etching process suitable for a material of the precursor base metal layer 35. Accordingly, the precursor base metal layer 35 is situated above the interlayer insulation layer 34 and just below the re-wiring layer 40, thereby forming the base metal layer 36 or the base metal patterns 36 having a pattern same as that of the wiring patterns 42 in the re-wiring layer 40.

In the next step, as shown in FIG. 14(B), the stress absorption resin layer 50 is formed to cover the re-wiring layer 40. When the stress absorption resin layer 50 is formed of a photosensitive resin, a resin layer is patterned with photolithography under an appropriate condition to form the opening portions 52.

In the next step, the post electrode base metal patterns 54 are disposed to cover inside the opening portions 54, i.e., the sidewalls and the bottom surfaces of the opening portions 54. The post electrode base metal patterns 54 are formed with a method similar to that of the base metal patterns 36. That is, the post electrode base metal patterns 54 may be formed of an arbitrary material with a well-known sputtering method suitable for the material thus selected, and are patterned with an etching process and photolithography under an appropriate condition suitable for the material thus selected. The post electrode base metal patterns 54 preferably have a thickness substantially constant.

In the next step, as shown in FIG. 14(C), the opening portions 52 in the post electrode forming areas 31 are filled to form the post electrodes 46. As described above, the post electrodes 46 are integrally include the first portions 46X extending from the surface 50a of the stress absorption resin layer 50 to the wiring patterns 42 and the second portions 46Y having a diameter larger than that of the first portion 46X. At this time, the second portions 46Y are situated in the post electrode forming areas 31 for connecting the surface 50a of the stress absorption resin layer 50 and the first portions 46X.

In particular, a resist pattern (not shown) for forming the post electrodes 46 is formed with well-known photolithography suitable for a material of the resist pattern. With the resist pattern as a mask, the post electrodes 46 are formed. Similar to the re-wiring layer 40, the post electrodes 46 may be formed using such an appropriate material as copper. Preferably, the post electrodes 46 are formed with a well-known electroplating method. Accordingly, the post electrodes 46 are formed on the post electrode mounting portions 42b of the wiring patterns 42 having the configuration described above.

In the next step, the resist pattern is removed using a solvent selected according to a material of the resist pattern. As shown in FIG. 14(C), the solder balls 48a as the outer terminals 48 are formed on the top surfaces 46a of the post electrodes 46 thus exposed. In the last step, the semiconductor wafer is cut between the semiconductor chip areas 14 along the scribe line, thereby individually obtaining the semiconductor device having the semiconductor chip 30.

In the first to fifth embodiments described above, the configurations of the main components may be arbitrarily combined to be disposed in the semiconductor device, as far as the object of the present invention can be obtained. Hereunder, embodiments of the combination of the first to fifth embodiments will be described. In the following embodiments, only configurations are explained. A manufacturing method may be referred to the description in the first to fifth embodiments.

Sixth Embodiment

A sixth embodiment of the present invention will be explained next with reference to FIGS. 15(A) and 15(B). FIG. 15(A) is a schematic plan view showing a wiring pattern of the semiconductor device according to the sixth embodiment of the present invention. FIG. 15(B) is a schematic sectional view taken along a projected line I-I' in FIG. 15(A). A main configuration of the semiconductor device in the sixth embodiment is similar to that in the first embodiment shown in FIGS. 1(A) and 1(B), and duplicate illustrations thereof are omitted. Components in the sixth embodiment same as those in the first embodiment are designated by the same reference numerals, and explanations thereof are omitted.

In the sixth embodiment, the semiconductor device is characterized in the wiring pattern in the re-wiring layer. In particular, the semiconductor device is characterized that the post electrode has a specific shape, and the stress resistance resin layer is formed below the wiring pattern or the post electrode mounting area, i.e., just below the base metal pattern.

As shown in FIGS. 15(A) and 15(B), similar to the first embodiment, the semiconductor device or a W-CSP (Wafer level Chip Size Package) includes the semiconductor chip 30. The semiconductor chip 30 includes the base metal patterns 36 formed on the interlayer insulation layer 34 on the first main surface 30a. The wiring patterns 42 electrically connected to the electrode pads 32 are disposed on the base metal patterns 36. The base metal patterns 36 have a plane shape same as that of the wiring patterns 42.

A specific configuration of the wiring patterns 42 of the semiconductor device will be explained next. The wiring patterns 42 include the linear portions 42a having a linear shape, a curved shape, or a combination thereof. One end portion of the linear portion 42a is electrically connected to one of the electrode pads 32 through the base metal pattern 36. Further, each of the wiring patterns 42 includes the post electrode mounting portion 42b with a recessed polygonal shape (polygonal star shape) integrally connected to the other end portion of the linear portion 42a extending from the electrode pad 32. In the embodiment, the post electrode mounting portion 42b has an upper contour shape of a substantially six-corner star having six acute angle corners 42ba (protruding portions). The base metal patterns 36 situated just below the post electrode mounting portions 42b have a shape and a size same as those of the post electrode mounting portions 42b.

In the embodiment, the semiconductor device is provided with the stress resistance resin patterns 45 formed just below the post electrode mounting portions 42b. The stress resistance resin patterns 45 are situated in the post electrode forming areas 31, and have a regular hexagonal shape.

In the embodiment, the post electrodes 46 are disposed on the post electrode mounting portions 42b. Each of the post electrodes 46 has a column shape having the top surface 46a with a circular shape and the bottom surface 46b with a circular shape opposite to the top surface 46a. Each of the post electrodes 46 is disposed on one of the post electrode mounting portions 42b, so that a contour of the bottom surface 46b of the post electrode 46 crosses a plan contour of the post electrode mounting portion 42b.

In the embodiment, the post electrode mounting portion 42b preferably has a plane shape or an upper contour shape crossing the contour of the bottom surface 46b of the post electrode 46 at least two points. That is, when the post electrode 46 is disposed on the post electrode mounting portion 42b, it is preferred that the protruding portion 42ba of the post electrode mounting portion 42b protrudes from the bottom surface 46b of the post electrode 46.

As described above, the post electrode mounting portions 42b have the substantially six-corner star shape having six of the protruding portions 42ba. Accordingly, the contour of the upper surface of the post electrode mounting portion 42b crosses the contour of the bottom surface 46b of the post electrode 46 at twelve points at least, depending on a connecting arrangement between the linear portion 42a and the post electrode mounting portion 42b. Note that the bottom surfaces 46b of the post electrodes 46 face the surface of the interlayer insulation layer 34 at the recess portions 42bb of the post electrode mounting portions 42b situated between the protruding portions 42ba.

In the embodiment, the sealing portion 44 is disposed to cover the re-wiring layer 40, the post electrodes 46 and the interlayer insulation layer 34 thus exposed. The sealing portion 44 is formed of an insulation material formed in an insulation layer. The top surfaces 46a of the post electrodes 46 are exposed from the surface of the sealing portion 44. The outer terminals 48 are disposed on the top surfaces 46a thus exposed. The outer terminals 48 are formed of solder balls.

As described above, the semiconductor device is provided with the specific structure formed just below the post electrodes 46 for alleviating and blocking an external stress applied to the W-CSP, or preventing damage from propagating further. Accordingly, it is possible to spread the stress with the specific structure, thereby preventing the post electrodes 46 and the re-wiring layer 40 connected thereto due to the external stress applied to the W-CSP.

Further, even when a crack is generated in a component near the interlayer insulation layer 34, the post electrodes 46, or the re-wiring layer 40, it is possible to prevent the damage from propagating continuously and directly through the post electrodes 46 and the re-wiring layer 40.

With the configuration described above, when an external stress is applied to the post electrodes 46, the stress resistance resin patterns 45 alleviate the external stress. Accordingly, it is possible to prevent the post electrodes 46 and the wiring patterns 42 connected thereto from being damaged. That is, it is possible to effectively prevent the components from being damaged, or prevent the damage from propagating, thereby improving reliability of the semiconductor device.

Seventh Embodiment

Figure 16A:
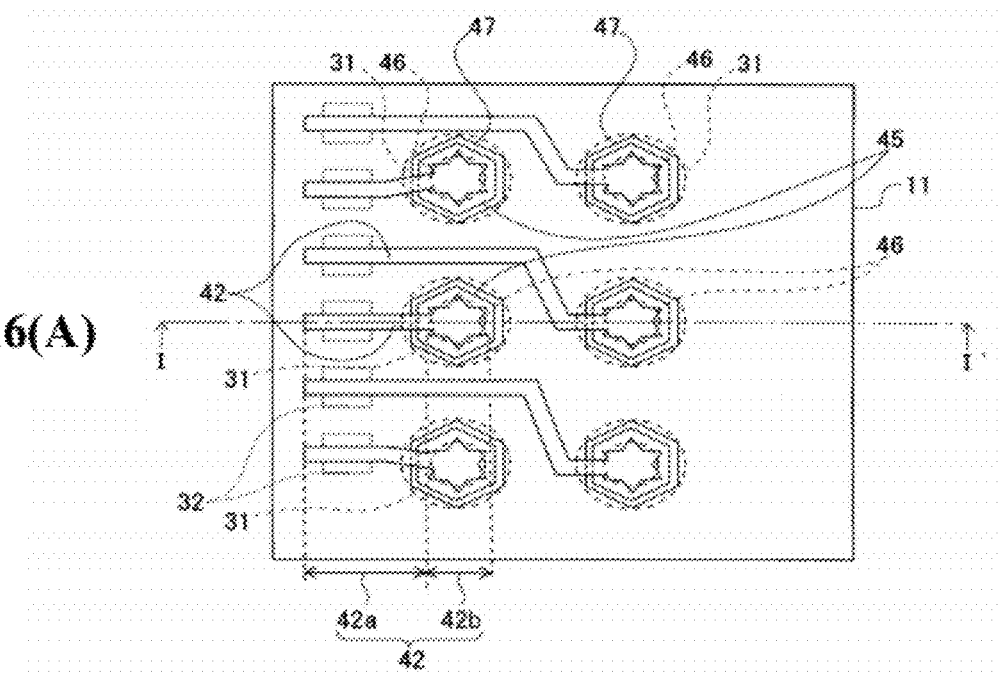
FIG. 16(A) is a schematic plan view showing a wiring pattern of the semiconductor device according to a seventh embodiment of the present invention.
Figure 16B:
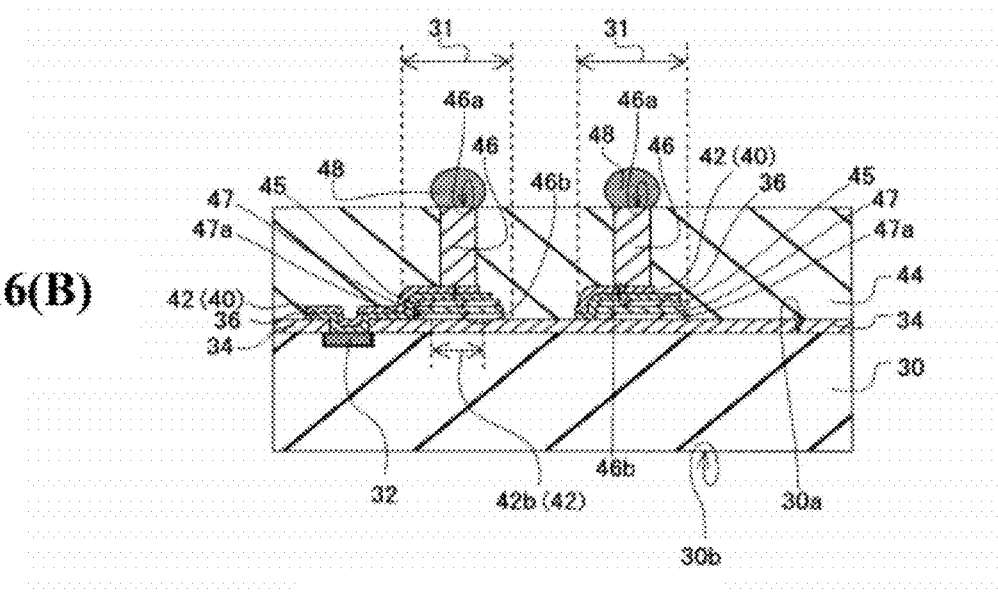
FIG. 16(B) is a schematic sectional view taken along a projected line I-I' in FIG. 16(A)

A seventh embodiment of the present invention will be explained next with reference to FIGS. 16(A) and 16(B). FIG. 16(A) is a schematic plan view showing a wiring pattern of the semiconductor device according to the seventh embodiment of the present invention. FIG. 16(B) is a schematic sectional view taken along a projected line I-I' in FIG. 16(A). A main configuration of the semiconductor device in the seventh embodiment is similar to that in the first embodiment shown in FIGS. 1(A) and 1(B), and duplicate illustrations thereof are omitted. Components in the sixth embodiment same as those in the first embodiment are designated by the same reference numerals, and explanations thereof are omitted.

In the seventh embodiment, the semiconductor device is characterized in the wiring pattern in the re-wiring layer. In particular, the semiconductor device is characterized that the post electrode has a specific shape, and the stress resistance resin pattern and the stress resistance metal pattern are formed below the wiring pattern or the post electrode mounting area, i.e., just below the base metal pattern.

As shown in FIGS. 16(A) and 16(B), similar to the first embodiment, the semiconductor device or a W-CSP (Wafer level Chip Size Package) includes the semiconductor chip 30. The semiconductor chip 30 includes the base metal patterns 36 and the wiring patterns 42 electrically connected to the electrode pads 32 thus exposed are disposed on the interlayer insulation layer 34 on the first main surface 30a. The base metal patterns 36 have a plane shape same as that of the wiring patterns 42.

In the embodiment, the semiconductor device is provided with the stress resistance resin patterns 45 formed just below the post electrode mounting portions 42b of the wiring patterns 42. The stress resistance resin patterns 45 have a regular hexagonal shape.

In the embodiment, in addition to the stress resistance resin patterns 45, the stress resistance metal patterns 47 are disposed just below the stress resistance resin patterns 45. Further, the post electrodes 46 are disposed on the post electrode mounting portions 42b, so that the contour of the bottom surface 46b of the post electrode 46 crosses the plan contour of the post electrode mounting portion 42b.

In the embodiment, the post electrode mounting portion 42b preferably has a plane shape or an upper contour shape crossing the contour of the bottom surface 46b of the post electrode 46 at least two points. That is, when the post electrode 46 is disposed on the post electrode mounting portion 42b, it is preferred that the protruding portion 42ba of the post electrode mounting portion 42b protrudes from the bottom surface 46b of the post electrode 46.

In the embodiment, the post electrode mounting portions 42b have a substantially six-corner star shape having six of the protruding portions 42ba. Accordingly, the contour of the upper surface of the post electrode mounting portion 42b crosses the contour of the bottom surface 46b of the post electrode 46 at twelve points at least, depending on a connecting arrangement between the linear portion 42a and the post electrode mounting portion 42b. Note that the bottom surfaces 46b of the post electrodes 46 face the surface of the interlayer insulation layer 34 at the recess portions 42bb of the post electrode mounting portions 42b situated between the protruding portions 42ba.

In the embodiment, the sealing portion 44 is disposed to cover the re-wiring layer 40, the post electrodes 46 and the interlayer insulation layer 34 thus exposed. The top surfaces 46a of the post electrodes 46 are exposed from the surface of the sealing portion 44. The outer terminals 48 are disposed on the top surfaces 46a thus exposed.

As described above, the semiconductor device is provided with the specific structure formed just below the post electrodes 46 for alleviating and blocking an external stress applied to the W-CSP, or preventing damage from propagating further. Accordingly, it is possible to spread the stress with the specific structure, thereby preventing the post electrodes 46 and the re-wiring layer 40 connected thereto due to the external stress applied to the W-CSP.

Further, even when a crack is generated in a component near the interlayer insulation layer 34, the post electrodes 46, or the re-wiring layer 40, it is possible to prevent the damage from propagating continuously and directly through the post electrodes 46 and the re-wiring layer 40.

With the configuration described above, when an external stress is applied to the post electrodes 46, the stress resistance resin patterns 45 alleviate the external stress. Accordingly, it is possible to prevent the post electrodes 46 and the wiring patterns 42 connected thereto from being damaged. Further, it is possible to block the external stress thus applied with the stress resistance metal patterns 47. Accordingly, it is possible to effectively prevent the stress from reaching to other components such as the wiring patterns 42 situated below the stress resistance metal patterns 47. That is, it is possible to effectively prevent the components from being damaged, or prevent the damage from propagating, thereby improving reliability of the semiconductor device.

Eighth Embodiment

Figure 17A:
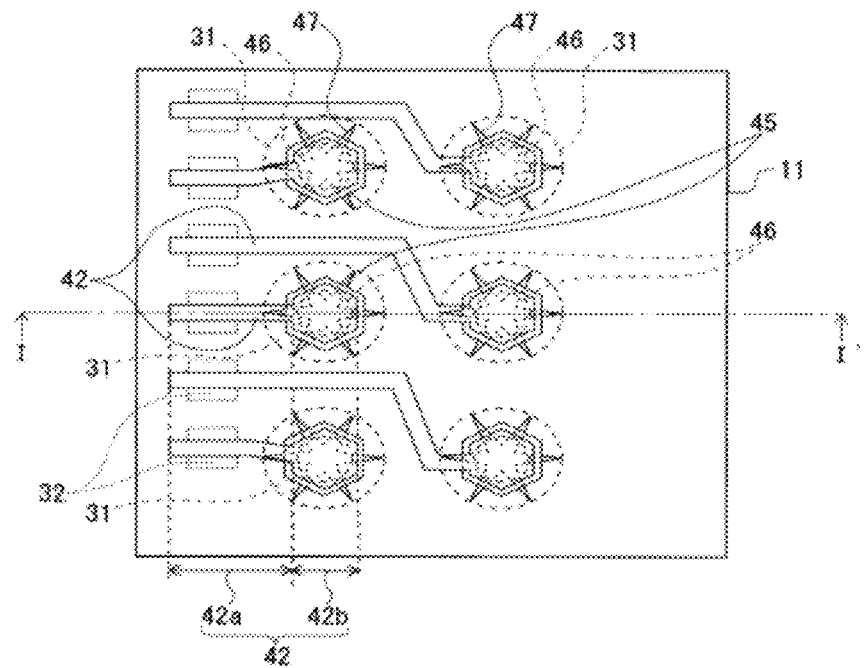
FIG. 17(A) is a schematic plan view showing a wiring pattern of the semiconductor device according to an eighth embodiment of the present invention.
Figure 17B:
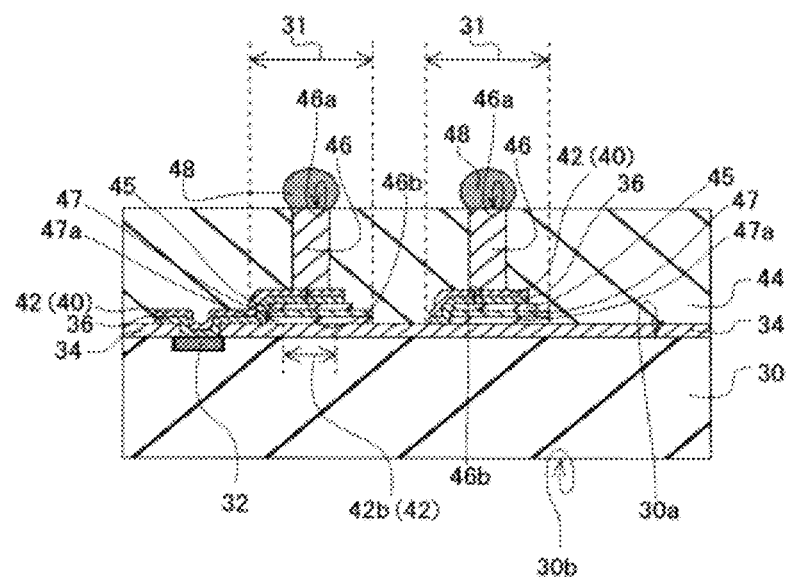
FIG. 17(B) is a schematic sectional view taken along a projected line I-I' in FIG. 17(A)

An eighth embodiment of the present invention will be explained next with reference to FIGS. 17(A) and 17(B). FIG. 17(A) is a schematic plan view showing a wiring pattern of the semiconductor device according to the eighth embodiment of the present invention. FIG. 17(B) is a schematic sectional view taken along a projected line I-I' in FIG. 17(A). A main configuration of the semiconductor device in the eighth embodiment is similar to that in the first embodiment shown in FIGS. 1(A) and 1(B), and duplicate illustrations thereof are omitted.

In the eighth embodiment, the semiconductor device is characterized in the wiring pattern in the re-wiring layer. In particular, the semiconductor device is characterized that the stress resistance metal pattern is formed below the wiring pattern or the post electrode mounting area, i.e., just below the base metal pattern, and the stress resistance metal pattern has a specific shape. Components in the eighth embodiment such as the semiconductor chip 30, the interlayer insulation layer 34, the wiring patterns 42, the base metal patterns 36, the electrode pads 32, the post electrodes 46, the sealing portion 44, the outer terminals 48, and the likes same as those in the first embodiment are designated by the same reference numerals, and explanations thereof are omitted.

As shown in FIGS. 17(A) and 17(B), each of the wiring patterns 42 includes the post electrode mounting portion 42b integrally connected to the other end portion of the linear portion 42a extending from the electrode pad 32. The post electrode mounting portions 42b are situated in the post electrode forming areas 31 defined in advance.

In the embodiment, the stress resistance metal patterns 47 have a recessed polygonal shape (polygonal star shape). Each of the stress resistance metal patterns 47 has an upper contour shape of a substantially six-corner star having six acute angle corners 42ba (protruding portions).

In the embodiment, the shape and size of the stress resistance metal patterns 47 are arbitrary. Preferably, in the polygonal shape of the stress resistance metal patterns 47, recess portions with a blunt angle between the protruding portions are situated within the contours of the stress resistance resin patterns 45, the post electrode mounting portions 42b, and the bottom surfaces 46b of the post electrodes 46.

In the embodiment, the post electrodes 46 are disposed on the post electrode mounting portions 42b, so that the bottom surfaces 46b thereof are completely accommodated in the plan contours of the post electrode mounting portions 42b having a hexagonal shape.

In the embodiment, the sealing portion 44 is disposed to cover the re-wiring layer 40, the post electrodes 46, and the interlayer insulation layer 34 thus exposed. The top surfaces 46a of the post electrodes 46 are exposed from the surface of the sealing portion 44.

With the configuration described above, when an external stress is applied to the post electrodes 46, the stress resistance resin patterns 45 alleviate the external stress. Accordingly, it is possible to prevent the post electrodes 46 and the wiring patterns 42 connected thereto from being damaged.

Further, it is possible to block the external stress thus applied with the stress resistance metal patterns 47. Accordingly, it is possible to effectively prevent the stress from reaching to other components such as the wiring patterns 42 situated below the stress resistance metal patterns 47. Further, even when a crack is generated in the semiconductor device, with the stress resistance metal patterns 47 having the recessed polygonal shape having the protruding portions, it is possible to prevent the crack from propagating through the post electrodes 46 or the re-wiring layer 40.

Ninth Embodiment

Figure 18A:
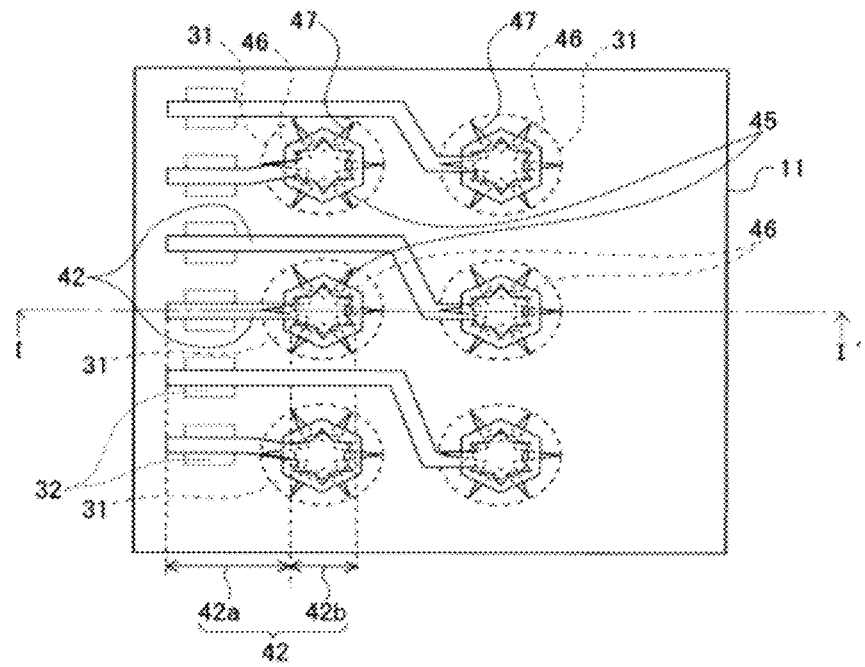
FIG. 18(A) is a schematic plan view showing a wiring pattern of the semiconductor device according to a ninth embodiment of the present invention.
Figure 18B:
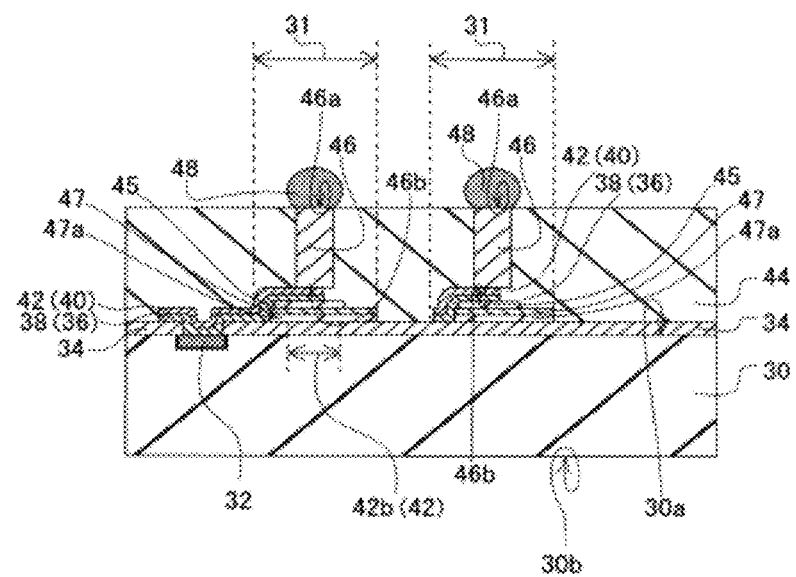
FIG. 18(B) is a schematic sectional view taken along a projected line I-I' in FIG. 18(A)

A ninth embodiment of the present invention will be explained next with reference to FIGS. 18(A) and 18(B). FIG. 18(A) is a schematic plan view showing a wiring pattern of the semiconductor device according to the ninth embodiment of the present invention. FIG. 18(B) is a schematic sectional view taken along a projected line I-I' in FIG. 15(A). A main configuration of the semiconductor device in the ninth embodiment is similar to that in the first embodiment shown in FIGS. 1(A) and 1(B), and duplicate illustrations thereof are omitted.

In the ninth embodiment, the semiconductor device is characterized in the wiring pattern in the re-wiring layer. In particular, the semiconductor device is characterized that the stress resistance resin pattern and the stress resistance metal pattern are formed below the wiring pattern or the post electrode mounting area, i.e., just below the base metal pattern, and the stress resistance metal pattern has a specific shape. Components in the ninth embodiment such as the semiconductor chip 30, the interlayer insulation layer 34, the wiring patterns 42, the base metal patterns 36, the electrode pads 32, the post electrodes 46, the sealing portion 44, the outer terminals 48, and the likes same as those in the first embodiment are designated by the same reference numerals, and explanations thereof are omitted.

As shown in FIGS. 18(A) and 18(B), the semiconductor device or a W-CSP (Wafer level Chip Size Package) includes the semiconductor chip 30. The base metal patterns 36 are disposed just below the wiring patterns 42.

A specific configuration of the wiring patterns 42 of the semiconductor device will be explained next. The wiring patterns 42 include the post electrode mounting portions 42b having a substantially recessed polygonal shape (polygonal star shape) and electrically connected to one end portions of the linear portions 42a. In the embodiment, the post electrode mounting portion 42b has an upper contour shape of a substantially six-corner star having six acute angle corners (protruding portions).

In the embodiment, the semiconductor device is provided with the stress resistance resin patterns 45 formed just below the base metal patterns 36. The stress resistance resin patterns 45 have a regular hexagonal shape. Further, the semiconductor device is provided with the stress resistance metal patterns 47 formed just below the stress resistance resin patterns 45, respectively.

In the embodiment, the stress resistance metal patterns 47 have a recessed polygonal shape (polygonal star shape), and have an upper contour shape of a substantially six-corner star having six acute angle corners (protruding portions).

In the embodiment, the post electrodes 46 are disposed on the post electrode mounting portions 42b, so that the bottom surfaces 46b thereof cross the plan contours of the post electrode mounting portions 42b. In particular, each of the post electrode mounting portions 42b has a plane shape or a contour shape of an upper surface thereof crossing the contour of the bottom surface 46b of the post electrode 46 at two points at least. When the post electrodes 46 are mounted on the post electrode mounting portions 42b, the protruding portions 42ba of the post electrode mounting portions 42b protrude from the bottom surfaces 46b of the post electrodes 46.

In the embodiment, the post electrodes 46 are disposed on the post electrode mounting portions 42b, so that the bottom surfaces 46b thereof are completely accommodated in the plan contours of the post electrode mounting portions 42b having a regular hexagonal shape.

In the embodiment, the sealing portion 44 is disposed to cover the re-wiring layer 40, the post electrodes 46, and the interlayer insulation layer 34 thus exposed. The top surfaces 46a of the post electrodes 46 are exposed from the surface of the sealing portion 44. The outer terminals 48 are disposed on the top surfaces 46a thus exposed.

With the configuration described above, even when a crack is generated in a component near the interlayer insulation layer 34, the post electrodes 46, or the re-wiring layer 40 connected thereto, it is possible to prevent the damage from propagating directly through the post electrodes 46 and the re-wiring layer 40.

Further, when an external stress is applied to the post electrodes 46, the stress resistance resin patterns 45 alleviate the external stress. Accordingly, it is possible to prevent the post electrodes 46 and the wiring patterns 42 connected thereto from being damaged. Further, it is possible to block the external stress thus applied with the stress resistance metal patterns 47. Accordingly, it is possible to effectively prevent the stress from reaching to other components such as the wiring patterns 42 situated below the stress resistance metal patterns 47. Further, with the stress resistance metal patterns 47 having the protruding portions, when a crack is generated in a surface protection layer and the likes, it is possible to prevent the crack from reaching the post electrodes 46 and the re-wiring layer 40.

Tenth Embodiment

Figure 19A:
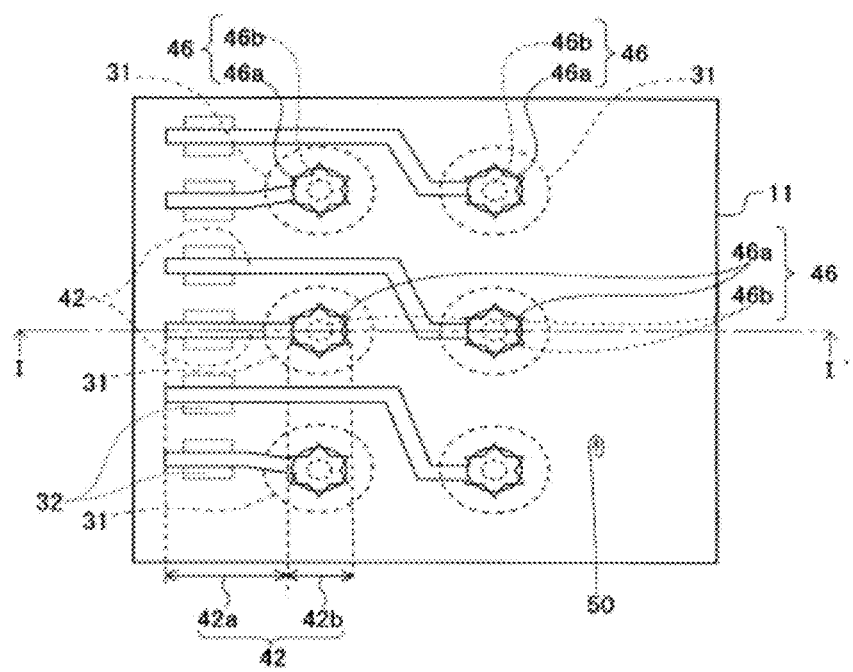
FIG. 19(A) is a schematic plan view showing a wiring pattern of the semiconductor device according to a tenth embodiment of the present invention.
Figure 19B:
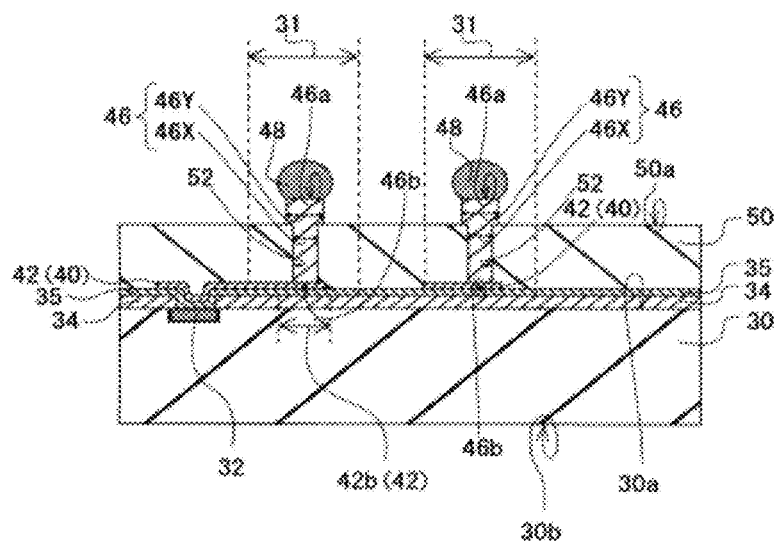
FIG. 19(B) is a schematic sectional view taken along a projected line I-I' in FIG. 19(A)

A tenth embodiment of the present invention will be explained next with reference to FIGS. 19(A) and 19(B). FIG. 19(A) is a schematic plan view showing a wiring pattern of the semiconductor device according to the tenth embodiment of the present invention. FIG. 19(B) is a schematic sectional view taken along a projected line I-I' in FIG. 19(A). A main configuration of the semiconductor device in the tenth embodiment is similar to that in the first embodiment shown in FIGS. 1(A) and 1(B), and duplicate illustrations thereof are omitted.

In the tenth embodiment, the semiconductor device is characterized that the wiring pattern and the post electrode have specific shapes, and the stress absorption resin layer is formed on the wiring pattern. Components in the tenth embodiment such as the semiconductor chip 30, the interlayer insulation layer 34, the wiring patterns 42, the base metal patterns 36, the electrode pads 32, the post electrodes 46, the sealing portion 44, the outer terminals 48, and the likes same as those in the first embodiment are designated by the same reference numerals, and explanations thereof are omitted.

As shown in FIGS. 19(A) and 19(B), similar to the first embodiment, the semiconductor device or a W-CSP (Wafer level Chip Size Package) includes the semiconductor chip 30. The wiring patterns 42 electrically connected to the electrode pads 32 are disposed on the base metal layer 35. Each of the wiring patterns 42 includes the post electrode mounting portion 42*b* integrally connected to the other end portion of the linear portion 42*a* extending from the electrode pad 32. The post electrode mounting portions 42*b* have a recessed polygonal shape (polygonal star shape). Each of the post electrode mounting portions 42*b* has an upper contour shape of a substantially six-corner star having six acute angle corners (protruding portions).

In the embodiment, the semiconductor device is provided with the stress absorption resin layer 50. The stress absorption resin layer 50 is integrally disposed to cover the re-wiring layer 40 disposed on the base metal layer 35 in a state that the post electrode mounting portions 42*b* are partially exposed.

In the embodiment, the stress absorption resin layer 50 includes the opening portions 52 (contact holes). Further, the semiconductor device is provided with the post electrodes 46. Each of the post electrodes 46 has the first portion 46X and the second portion 46Y having different diameters. The outer terminals 48 are disposed on the top surfaces 46*a* of the post electrodes 46.

With the configuration described above, when a crack is generated in a component near the post electrodes 46 or the re-wiring layer 40 connected thereto, it is possible to prevent the damage from propagating continuously and directly through the post electrodes 46 and the re-wiring layer 40.

Further, when an external stress is applied to the post electrodes 46, the stress absorption resin layer 50 alleviates the external stress. Accordingly, it is possible to prevent the post electrodes 46 and the wiring patterns 42 connected thereto from being damaged.

Eleventh Embodiment

Figure 20A:
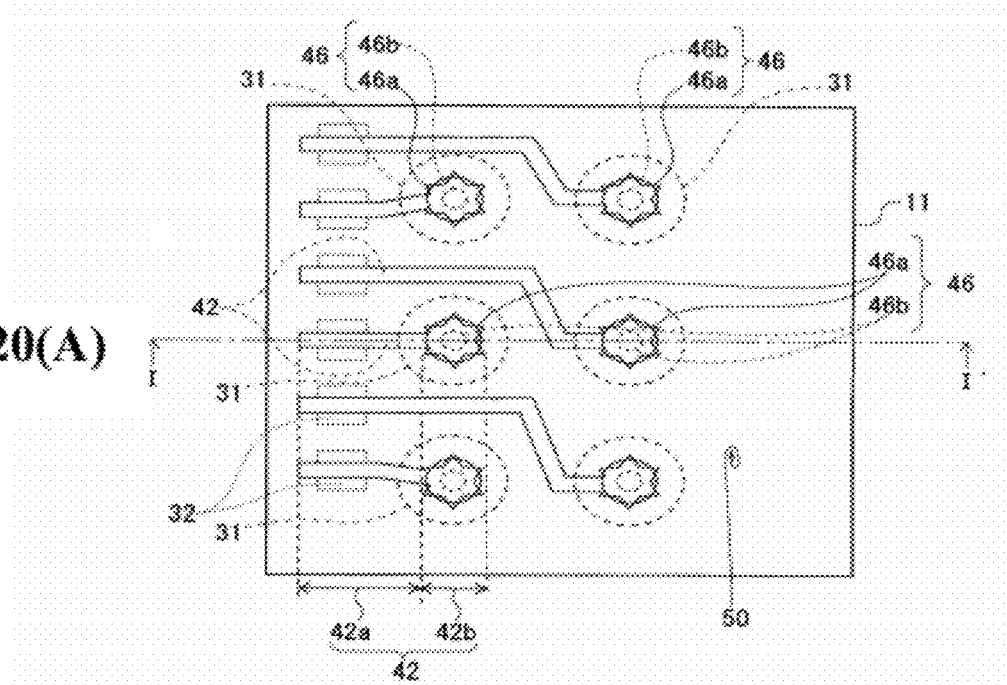
FIG. 20(A) is a schematic plan view showing a wiring pattern of the semiconductor device according to an eleventh embodiment of the present invention.
Figure 20B:
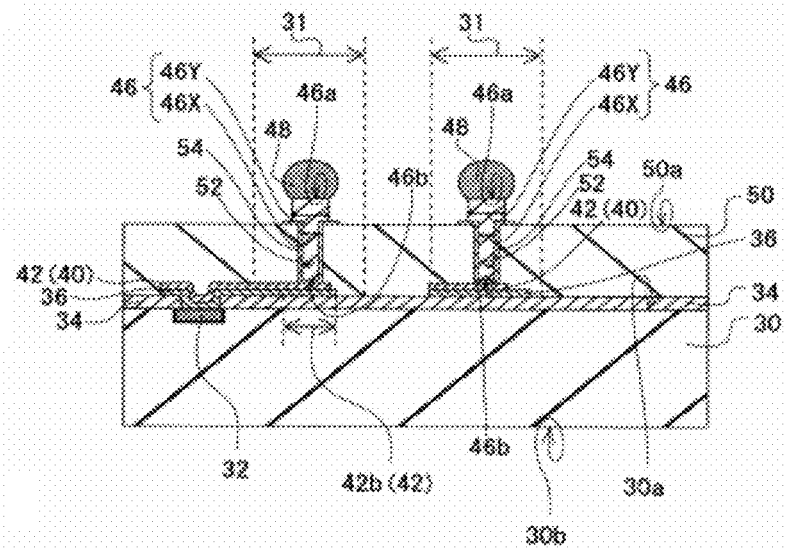
FIG. 20(B) is a schematic sectional view taken along a projected line I-I' in FIG. 20(A)

An eleventh embodiment of the present invention will be explained next with reference to FIGS. 20(A) and 20(B). FIG. 20(A) is a schematic plan view showing a wiring pattern of the semiconductor device according to the eleventh embodiment of the present invention. FIG. 20(B) is a schematic sectional view taken along a projected line I-I' in FIG. 20(A). A main configuration of the semiconductor device in the eleventh embodiment is similar to that in the first embodiment shown in FIGS. 1(A) and 1(B), and duplicate illustrations thereof are omitted.

In the eleventh embodiment, the semiconductor device is characterized in the wiring pattern in the re-wiring layer. In particular, the semiconductor device is characterized that the wiring pattern and the post electrode have specific shapes. Further, the semiconductor device is characterized that the stress absorption resin layer is formed on the wiring pattern, and the post electrode base metal pattern is disposed just below the stress absorption resin layer. Components in the eleventh embodiment such as the semiconductor chip 30, the interlayer insulation layer 34, the wiring patterns 42, the base metal patterns 36, the electrode pads 32, the post electrodes 46, the sealing portion 44, the outer terminals 48, and the likes same as those in the first embodiment are designated by the same reference numerals, and explanations thereof are omitted.

As shown in FIGS. 20(A) and 20(B), similar to the first embodiment, the semiconductor device or a W-CSP (Wafer level Chip Size Package) includes the semiconductor chip 30. The base metal patterns 36 or the base metal layers are disposed on the interlayer insulation layer 34. The base metal patterns 36 have a plane shape same as that of the wiring patterns 42. The wiring patterns 42 electrically connected to the electrode pads 32 are disposed on the base metal patterns 36.

In the embodiment, each of the wiring patterns 42 includes the post electrode mounting portion 42*b* integrally connected to the other end portion of the linear portion 42*a* extending from the electrode pad 32. The post electrode mounting portions 42*b* have a recessed polygonal shape (polygonal star shape). Each of the post electrode mounting portions 42*b* has an upper contour shape of a substantially six-corner star having six acute angle corners (protruding portions).

In the embodiment, the semiconductor device is provided with the stress absorption resin layer 50. The stress absorption resin layer 50 is disposed such that the post electrode mounting portions 42*b* are partially exposed. The stress absorption resin layer 50 includes the opening portions 52 (contact holes). Further, the semiconductor device is provided with the post electrodes 46. The opening portions 52 extend from the surface of the stress absorption resin layer 50 to the post electrode mounting portions 42*b*, so that the post electrode mounting portions 42*b* are partially exposed.

In the embodiment, the semiconductor device is provided with the post electrode base metal patterns 54. The post electrode base metal patterns 54 cover inside the opening portions 54, i.e., the sidewalls and the bottom surfaces of the opening portions 54. Further, the post electrode base metal patterns 54 cover a part of the surface of the stress absorption resin layer 50 in the post electrode forming areas 31.

In the embodiment, the semiconductor device is provided with the post electrodes 46. Each of the post electrodes 46 has the first portion 46X and the second portion 46Y having different diameters. The post electrodes 46 are disposed on the post electrode mounting portions 42b, so that the bottom surfaces 46b thereof are completely accommodated in the plan contours of the post electrode mounting portions 42b having a regular hexagonal shape. The outer terminals 48 are disposed on the top surfaces 46a of the post electrodes 46.

With the configuration described above, even when a crack is generated in a component near the interlayer insulation layer 34, the post electrodes 46, or the re-wiring layer 40 connected thereto, it is possible to prevent the damage from propagating directly through the post electrodes 46 and the re-wiring layer 40.

Further, when an external stress is applied to the post electrodes 46, the stress absorption resin layer 50 alleviates the external stress. Accordingly, it is possible to prevent the post electrodes 46 and the wiring patterns 42 connected thereto from being damaged.

Further, the base metal layers 36 are not situated below the stress absorption resin layer 50. Accordingly, it is possible to reduce an area of conductive portion, thereby increasing an extent of integration of the post electrodes 46 and reducing a size of the semiconductor device.

Twelfth Embodiment

Figure 21A:
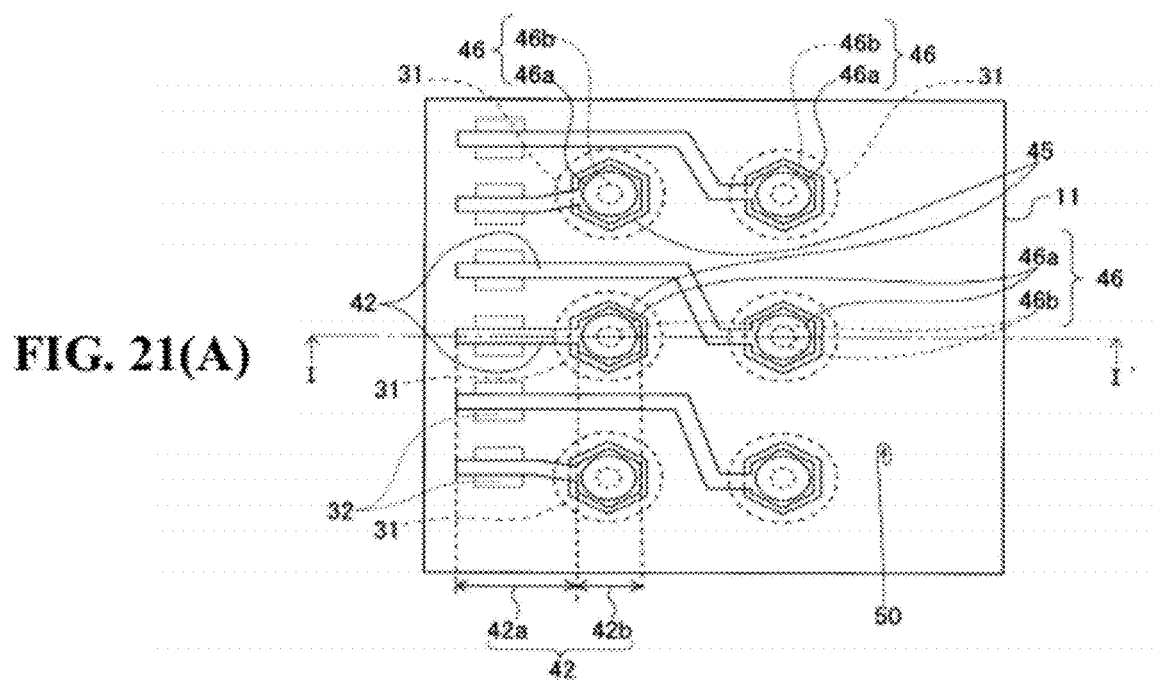
FIG. 21(A) is a schematic plan view showing a wiring pattern of the semiconductor device according to a twelfth embodiment of the present invention.
Figure 21B:
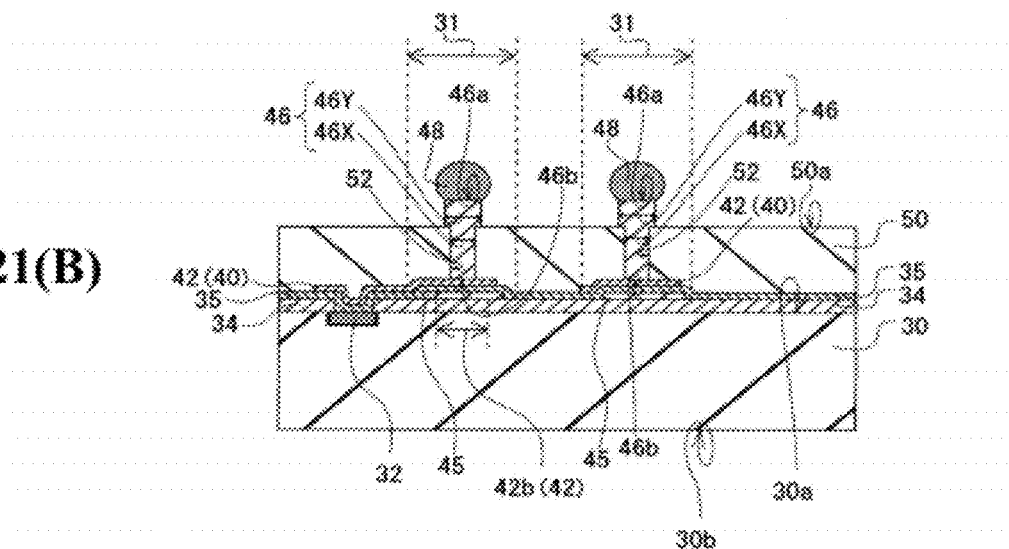
FIG. 21(B) is a schematic sectional view taken along a projected line I-I' in FIG. 21(A)

A twelfth embodiment of the present invention will be explained next with reference to FIGS. 21(A) and 21(B). FIG. 21(A) is a schematic plan view showing a wiring pattern of the semiconductor device according to the twelfth embodiment of the present invention. FIG. 21(B) is a schematic sectional view taken along a projected line I-I' in FIG. 21(A). A main configuration of the semiconductor device in the twelfth embodiment is similar to that in the first embodiment shown in FIGS. 1(A) and 1(B), and duplicate illustrations thereof are omitted.

In the twelfth embodiment, the semiconductor device is characterized that the stress resistance resin pattern and the post electrode have specific shapes, and the stress absorption resin layer is formed on the wiring pattern. Components in the twelfth embodiment such as the semiconductor chip 30, the interlayer insulation layer 34, the wiring patterns 42, the base metal patterns 36, the electrode pads 32, the post electrodes 46, the sealing portion 44, the outer terminals 48, and the likes same as those in the first embodiment are designated by the same reference numerals, and explanations thereof are omitted.

As shown in FIGS. 21(A) and 21(B), similar to the first embodiment, the semiconductor device or a W-CSP (Wafer level Chip Size Package) includes the semiconductor chip 30. The base metal layer 35 is formed on the interlayer insulation layer 34. The wiring patterns 42 electrically connected to the electrode pads 32 are disposed on the base metal layer 35. Each of the wiring patterns 42 includes the post electrode mounting portion 42b integrally connected to the other end portion of the linear portion 42a extending from the electrode pad 32.

In the embodiment, the post electrode mounting portions 42b have a hexagonal shape. The post electrode mounting portions 42b may have any arbitrary shape, as far as the bottom surfaces 46b of the post electrodes 46 are completely accommodated in the contours thereof.

In the embodiment, the semiconductor device is provided with the stress resistance resin patterns 45 formed just below the post electrode mounting portions 42b. The stress resistance resin patterns 45 have a regular hexagonal shape. The base metal layer 35 is disposed to cover the interlayer insulation layer 34 and the stress resistance resin patterns 45 exposed from the wiring patterns 42.

In the embodiment, the semiconductor device is provided with the stress absorption resin layer 50. The stress absorption resin layer 50 includes the opening portions 52 (contact holes). The opening portions 52 extend from the surface of the stress absorption resin layer 50 to the post electrode mounting portions 42b, so that the post electrode mounting portions 42b are partially exposed.

In the embodiment, the semiconductor device is provided with the post electrodes 46. Each of the post electrodes 46 is disposed on one of the post electrode mounting portions 42b, so that the contour of the bottom surface 46b of the post electrode 46 is accommodated in the plan contour of the post electrode mounting portion 42b having a hexagonal shape. The outer terminals 48 are disposed on the top surfaces 46a of the post electrodes 46.

With the configuration described above, when an external stress is applied to the post electrodes 46, the stress resistance resin patterns 45 alleviate the external stress. Accordingly, it is possible to prevent the post electrodes 46 and the wiring patterns 42 connected thereto from being damaged.

Further, when an external stress is applied to the post electrodes 46, the stress absorption resin layer 50 alleviates the external stress. Accordingly, it is possible to prevent the post electrodes 46 and the wiring patterns 42 connected thereto from being damaged.

Thirteenth Embodiment

Figure 22A:
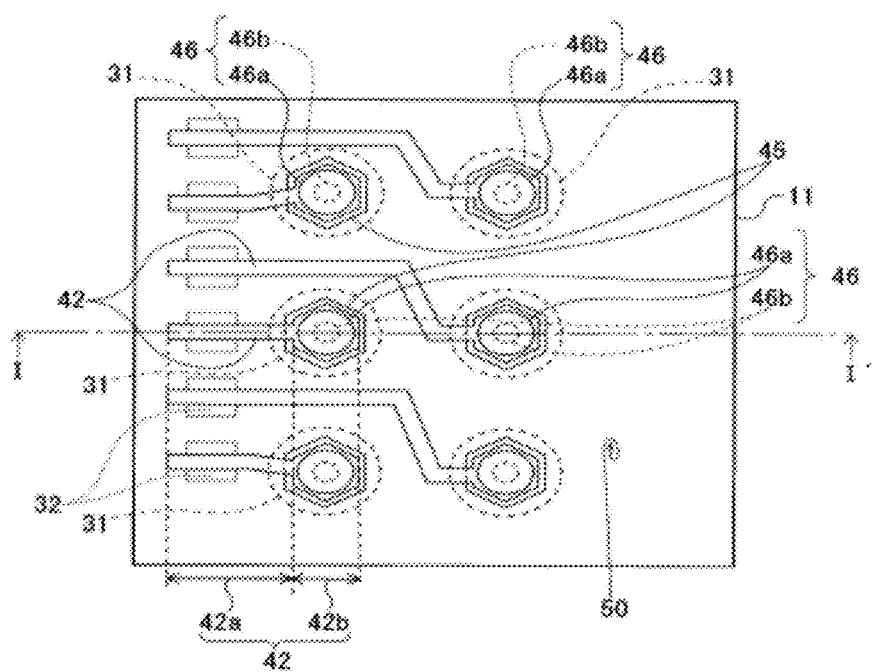
FIG. 22(A) is a schematic plan view showing a wiring pattern of the semiconductor device according to a thirteenth embodiment of the present invention.
Figure 22B:
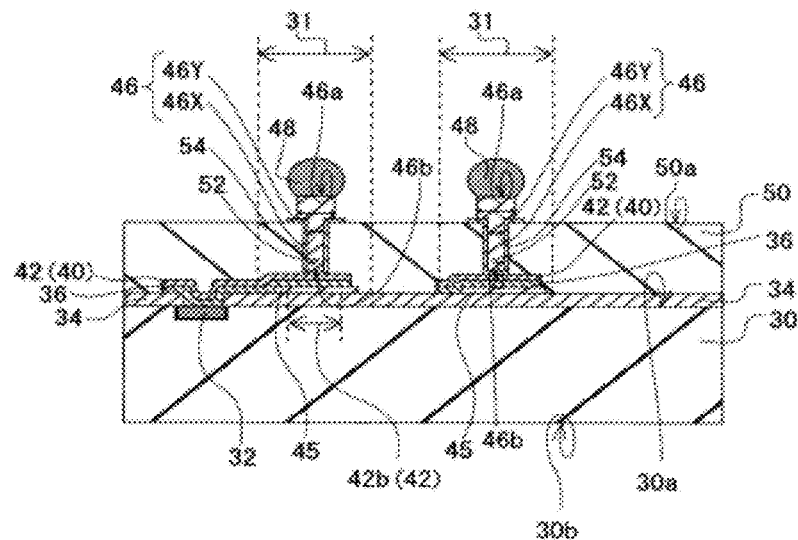
FIG. 22(B) is a schematic sectional view taken along a projected line I-I' in FIG. 22(A)

A thirteenth embodiment of the present invention will be explained next with reference to FIGS. 22(A) and 22(B). FIG. 22(A) is a schematic plan view showing a wiring pattern of the semiconductor device according to the thirteenth embodiment of the present invention. FIG. 22(B) is a schematic sectional view taken along a projected line I-I' in FIG. 22(A). A main configuration of the semiconductor device in the thirteenth embodiment is similar to that in the first embodiment shown in FIGS. 1(A) and 1(B), and duplicate illustrations thereof are omitted.

In the thirteenth embodiment, the semiconductor device is characterized that the post electrode has specific shapes, and the stress resistance resin pattern has a specific pattern, in addition to the stress absorption resin layer formed on the wiring pattern and the post electrode base metal pattern formed just below the stress absorption resin layer. Components in the thirteenth embodiment such as the semiconductor chip 30, the interlayer insulation layer 34, the wiring patterns 42, the base metal patterns 36, the electrode pads 32, the post electrodes 46, the sealing portion 44, the outer terminals 48, and the likes same as those in the first embodiment are designated by the same reference numerals, and explanations thereof are omitted.

As shown in FIGS. 22(A) and 22(B), similar to the first embodiment, the semiconductor device or a W-CSP (Wafer level Chip Size Package) includes the semiconductor chip 30.

In the embodiment, the semiconductor device is provided with the stress resistance resin patterns 45 formed on the interlayer insulation layer 34. The stress resistance resin patterns 45 have a regular hexagonal shape. The base metal patterns 36 or the base metal layers are disposed on the stress resistance resin patterns 45. The base metal patterns 36 have a plane shape same as that of the wiring patterns 42.

In the embodiment, the wiring patterns 42 electrically connected to the electrode pads 32 are disposed on the base metal layers 36. Each of the wiring patterns 42 includes the post electrode mounting portion 42b integrally connected to the other end portion of the linear portion 42a extending from the electrode pad 32. The post electrode mounting portions 42b have the upper contour in a regular hexagonal.

In the embodiment, the semiconductor device is provided with the stress absorption resin layer 50. The stress absorption resin layer 50 is disposed such that the post electrode mounting portions 42b are partially exposed. The stress absorption resin layer 50 is integrally disposed to cover the re-wiring layer 40 disposed on the base metal layers 36. The stress absorption resin layer 50 includes the opening portions 52 (contact holes). Further, the semiconductor device is provided with the post electrodes 46. The opening portions 52 extend from the surface of the stress absorption resin layer 50 to the post electrode mounting portions 42b, so that the post electrode mounting portions 42b are partially exposed.

In the embodiment, the semiconductor device is provided with the post electrode base metal patterns 54. The post electrode base metal patterns 54 cover inside the opening portions 54, i.e., the sidewalls and the bottom surfaces of the opening portions 54. Further, the post electrode base metal patterns 54 cover a part of the surface of the stress absorption resin layer 50 in the post electrode forming areas 31.

In the embodiment, the semiconductor device is provided with the post electrodes 46. Each of the post electrodes 46 has the first portion 46X and the second portion 46Y having different diameters. The post electrodes 46 are disposed on the post electrode mounting portions 42b, so that the bottom surfaces 46b thereof are completely accommodated in the plan contours of the post electrode mounting portions 42b having a regular hexagonal shape. The outer terminals 48 are disposed on the top surfaces 46a of the post electrodes 46.

With the configuration described above, when an external stress is applied to the post electrodes 46, the stress resistance resin patterns 45 alleviate the external stress. Accordingly, it is possible to prevent the post electrodes 46 and the wiring patterns 42 connected thereto from being damaged.

Further, when an external stress is applied to the post electrodes 46, the stress absorption resin layer 50 alleviates the external stress. Accordingly, it is possible to prevent the post electrodes 46 and the wiring patterns 42 connected thereto from being damaged.

Further, the base metal layers 36 are not situated below the stress absorption resin layer 50. Accordingly, it is possible to reduce an area of conductive portion, thereby increasing an extent of integration of the post electrodes 46 and reducing a size of the semiconductor device.

Fourteenth Embodiment

Figure 23A:
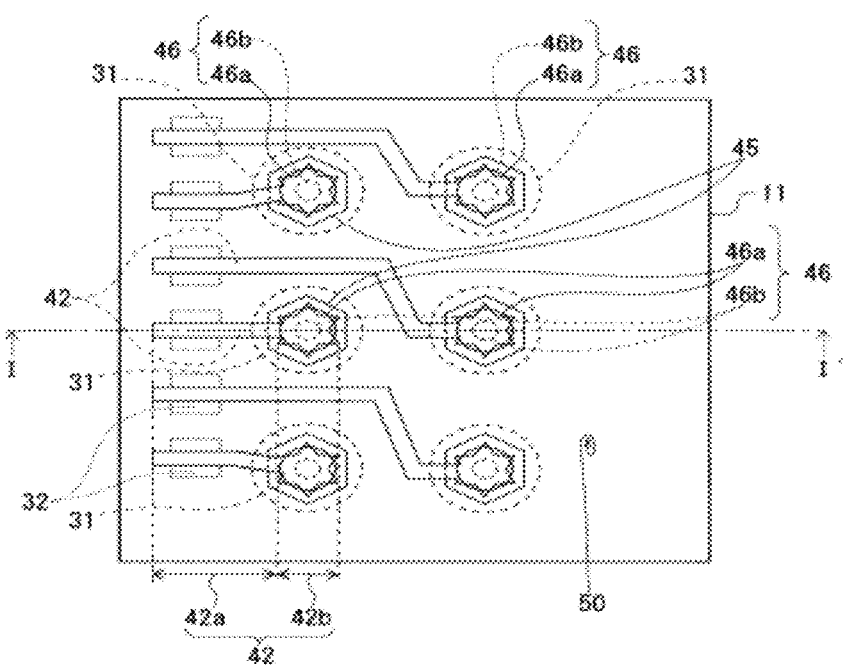
FIG. 23(A) is a schematic plan view showing a wiring pattern of the semiconductor device according to a fourteenth embodiment of the present invention.
Figure 23B:
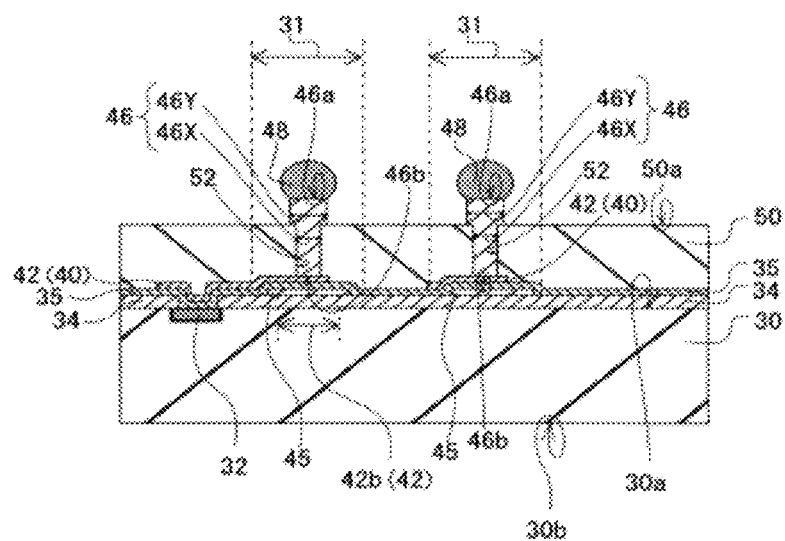
FIG. 23(B) is a schematic sectional view taken along a projected line I-I' in FIG. 23(A)

A fourteenth embodiment of the present invention will be explained next with reference to FIGS. 23(A) and 23(B). FIG. 23(A) is a schematic plan view showing a wiring pattern of the semiconductor device according to the fourteenth embodiment of the present invention. FIG. 23(B) is a schematic sectional view taken along a projected line I-I' in FIG. 23(A). A main configuration of the semiconductor device in the fourteenth embodiment is similar to that in the first embodiment shown in FIGS. 1(A) and 1(B), and duplicate illustrations thereof are omitted.

In the fourteenth embodiment, the semiconductor device is characterized that the wiring pattern, the stress resistance resin pattern, and the post electrode have specific shapes, and the stress absorption resin layer is formed on the wiring pattern. Components in the fourteenth embodiment such as the semiconductor chip 30, the interlayer insulation layer 34, the wiring patterns 42, the base metal patterns 36, the electrode pads 32, the post electrodes 46, the sealing portion 44, the outer terminals 48, and the likes same as those in the first embodiment are designated by the same reference numerals, and explanations thereof are omitted.

As shown in FIGS. 23(A) and 23(B), similar to the first embodiment, the semiconductor device or a W-CSP (Wafer level Chip Size Package) includes the semiconductor chip 30. The base metal layer 35 is formed on the interlayer insulation layer 34. The wiring patterns 42 electrically connected to the electrode pads 32 are disposed on the base metal layer 35. Each of the wiring patterns 42 includes the post electrode mounting portion 42b integrally connected to the other end portion of the linear portion 42a extending from the electrode pad 32.

In the embodiment, the post electrode mounting portions 42b have a recessed polygonal shape (polygonal star shape). That is, each of the post electrode mounting portions 42b has an upper contour shape of a substantially six-corner star having six acute angle corners (protruding portions).

In the embodiment, the semiconductor device is provided with the stress resistance resin patterns 45 formed just below the post electrode mounting portions 42b. The stress resistance resin patterns 45 are situated in the post electrode forming areas 31 and have a regular hexagonal shape. The base metal layer 35 covers the interlayer insulation layer 34 and the stress resistance resin patterns 45 exposed from the wiring patterns 42.

In the embodiment, the semiconductor device is provided with the stress absorption resin layer 50. The stress absorption resin layer 50 is integrally disposed to cover the re-wiring layer 40 disposed on the base metal layer 35 in a state that the post electrode mounting portions 42b are partially exposed.

In the embodiment, the stress absorption resin layer 50 includes the opening portions 52 (contact holes). Further, the semiconductor device is provided with the post electrodes 46. Each of the post electrodes 46 has the first portion 46X and the second portion 46Y having different diameters. The post electrodes 46 are disposed on the post electrode mounting portions 42b, so that the bottom surfaces 46b thereof are completely accommodated in the plan contours of the post electrode mounting portions 42b having a regular hexagonal shape. The outer terminals 48 are disposed on the top surfaces 46a of the post electrodes 46.

With the configuration described above, even when a crack is generated in a component near the interlayer insulation layer 34, the post electrodes 46, or the re-wiring layer 40 connected thereto, it is possible to prevent the damage from propagating continuously and directly through the post electrodes 46 and the re-wiring layer 40.

Further, when an external stress is applied to the post electrodes 46, the stress resistance resin patterns 45 alleviate the external stress. Accordingly, it is possible to prevent the post electrodes 46 and the wiring patterns 42 connected thereto from being damaged.

Further, when an external stress is applied to the post electrodes 46, the stress absorption resin layer 50 alleviates the external stress. Accordingly, it is possible to prevent the post electrodes 46 and the wiring patterns 42 connected thereto from being damaged.

Fifteenth Embodiment

A fifteenth embodiment of the present invention will be explained next with reference to FIGS. 24(A) and 24(B). FIG.

24(A) is a schematic plan view showing a wiring pattern of the semiconductor device according to the fifteenth embodiment of the present invention. FIG. 24(B) is a schematic sectional view taken along a projected line I-I' in FIG. 24(A). A main configuration of the semiconductor device in the fifteenth embodiment is similar to that in the first embodiment shown in FIGS. 1(A) and 1(B), and duplicate illustrations thereof are omitted.

In the fifteenth embodiment, the semiconductor device is characterized that the post electrode has specific shapes, and the stress resistance resin pattern is provided, in addition to the stress absorption resin layer formed on the wiring pattern and the post electrode base metal pattern formed just below the stress absorption resin layer. Components in the fifteenth embodiment such as the semiconductor chip 30, the interlayer insulation layer 34, the wiring patterns 42, the base metal patterns 36, the electrode pads 32, the post electrodes 46, the sealing portion 44, the solder balls 48a, and the likes same as those in the first embodiment are designated by the same reference numerals, and explanations thereof are omitted.

As shown in FIGS. 24(A) and 24(B), similar to the first embodiment, the semiconductor device or a W-CSP (Wafer level Chip Size Package) includes the semiconductor chip 30.

In the embodiment, the semiconductor device is provided with the stress resistance resin patterns 45 formed on the interlayer insulation layer 34. The stress resistance resin patterns 45 are situated in the post electrode forming areas 31, and have a regular hexagonal shape. The base metal patterns 36 or the base metal layers are formed on the stress resistance resin patterns 45. The base metal patterns 36 have a plane shape same as that of the wiring patterns 42. The wiring patterns 42 electrically connected to the electrode pads 32 are disposed on the base metal patterns 36.

In the embodiment, the wiring patterns 42 include the post electrode mounting portions 42b having a substantially recessed polygonal shape (polygonal star shape) and electrically connected to one end portions of the linear portions 42a. The post electrode mounting portion 42b has an upper contour shape of a substantially six-corner star having six acute angle corners (protruding portions).

In the embodiment, the semiconductor device is provided with the stress absorption resin layer 50. The stress absorption resin layer 50 is integrally disposed to cover the re-wiring layer 40 disposed on the base metal layers 36 in a state that the post electrode mounting portions 42b are partially exposed. The stress absorption resin layer 50 includes the opening portions 52 (contact holes).

In the embodiment, the semiconductor device is provided with the post electrode base metal patterns 54. The post electrode base metal patterns 54 cover inside the opening portions 54, i.e., the sidewalls and the bottom surfaces of the opening portions 54. Further, the post electrode base metal patterns 54 cover a part of the surface of the stress absorption resin layer 50 in the post electrode forming areas 31.

In the embodiment, the semiconductor device is provided with the post electrodes 46. Each of the post electrodes 46 has the first portion 46X and the second portion 46Y having different diameters. The outer terminals 48 are disposed on the top surfaces 46a of the post electrodes 46.

With the configuration described above, even when a crack is generated in a component near the interlayer insulation layer 34, the post electrodes 46, or the re-wiring layer 40 connected thereto, it is possible to prevent the damage from propagating continuously and directly through the post electrodes 46 and the re-wiring layer 40.

Further, when an external stress is applied to the post electrodes 46, the stress resistance resin patterns 45 alleviate the external stress. Accordingly, it is possible to prevent the post electrodes 46 and the wiring patterns 42 connected thereto from being damaged.

Further, when an external stress is applied to the post electrodes 46, the stress absorption resin layer 50 alleviates the external stress. Accordingly, it is possible to prevent the post electrodes 46 and the wiring patterns 42 connected thereto from being damaged.

Further, the base metal layers 36 are not situated below the stress absorption resin layer 50. Accordingly, it is possible to reduce an area of conductive portion, thereby increasing an extent of integration of the post electrodes 46 and reducing a size of the semiconductor device.

Sixteenth Embodiment

Figure 25A:
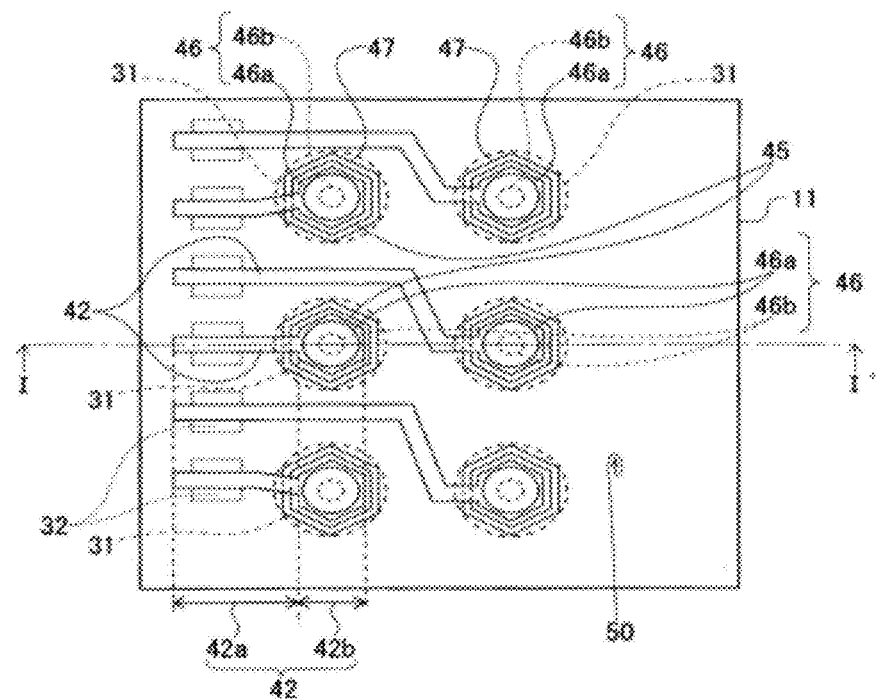
FIG. 25(A) is a schematic plan view showing a wiring pattern of the semiconductor device according to a sixteenth embodiment of the present invention.
Figure 25B:
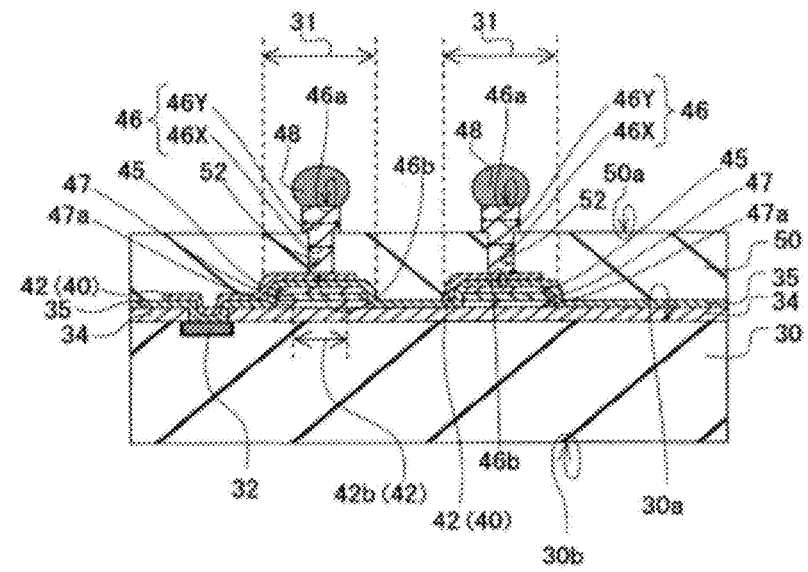
FIG. 25(B) is a schematic sectional view taken along a projected line I-I' in FIG. 25(A)

A sixteenth embodiment of the present invention will be explained next with reference to FIGS. 25(A) and 25(B). FIG. 25(A) is a schematic plan view showing a wiring pattern of the semiconductor device according to the sixteenth embodiment of the present invention. FIG. 25(B) is a schematic sectional view taken along a projected line I-I' in FIG. 25(A). A main configuration of the semiconductor device in the sixteenth embodiment is similar to that in the first embodiment shown in FIGS. 1(A) and 1(B), and duplicate illustrations thereof are omitted.

In the sixteenth embodiment, the semiconductor device is characterized that the stress resistance resin pattern, the stress resistance metal pattern, and the post electrode have specific shapes, and the stress absorption resin layer is provided. Components in the sixteenth embodiment such as the semiconductor chip 30, the interlayer insulation layer 34, the wiring patterns 42, the base metal patterns 36, the electrode pads 32, the post electrodes 46, the sealing portion 44, the solder balls 48a, and the likes same as those in the first embodiment are designated by the same reference numerals, and explanations thereof are omitted.

As shown in FIGS. 25(A) and 25(B), similar to the first embodiment, the semiconductor device or a W-CSP (Wafer level Chip Size Package) includes the semiconductor chip 30. The base metal layer 35 is formed on the interlayer insulation layer 34. The wiring patterns 42 electrically connected to the electrode pads 32 are disposed on the base metal layer 35. Each of the wiring patterns 42 includes the post electrode mounting portion 42b integrally connected to the other end portion of the linear portion 42a extending from the electrode pad 32. The post electrode mounting portions 42b have a regular hexagonal shape.

In the embodiment, the semiconductor device is provided with the stress resistance resin patterns 45 formed just below the post electrode mounting portions 42b. The stress resistance resin patterns 45 have a regular hexagonal shape.

In the embodiment, in addition to the stress resistance resin patterns 45, the stress resistance metal patterns 47 are formed in the post electrode forming areas 31 just below the stress resistance resin patterns 45. The stress resistance metal patterns 47 have a regular hexagonal shape larger than that of the stress resistance resin patterns 45. The base metal layer 35 is disposed to cover the interlayer insulation layer 34 and the stress resistance resin patterns 45 exposed from the wiring patterns 42.

In the embodiment, the semiconductor device is provided with the stress absorption resin layer 50. The stress absorption resin layer 50 is integrally disposed to cover the re-wiring layer 40 disposed on the base metal layer 35, so that the post electrode mounting portions 42b are partially exposed. The stress absorption resin layer 50 includes the opening portions 52 (contact holes).

In the embodiment, the semiconductor device is provided with the post electrodes 46. Each of the post electrodes 46 has the first portion 46X and the second portion 46Y having different diameters. Each of the post electrodes 46 is disposed on one of the post electrode mounting portions 42b, so that the contour of the bottom surface 46b of the post electrode 46 is accommodated in the plan contour of the post electrode mounting portion 42b having a hexagonal shape. The outer terminals 48 are disposed on the top surfaces 46a of the post electrodes 46.

With the configuration described above, when an external stress is applied to the post electrodes 46, the stress absorption resin layer 50 alleviates the external stress. Accordingly, it is possible to prevent the post electrodes 46 and the wiring patterns 42 connected thereto from being damaged.

Seventeenth Embodiment

A seventeenth embodiment of the present invention will be explained next with reference to FIGS. 25(A) and 25(B). FIG. 25(A) is a schematic plan view showing a wiring pattern of the semiconductor device according to the seventeenth embodiment of the present invention. FIG. 25(B) is a schematic sectional view taken along a projected line I-I' in FIG. 25(A). A main configuration of the semiconductor device in the seventeenth embodiment is similar to that in the first embodiment shown in FIGS. 1(A) and 1(B), and duplicate illustrations thereof are omitted.

In the seventeenth embodiment, the semiconductor device is characterized that the post electrode have specific a shape, and there are provided the stress resistance resin pattern, the stress resistance metal pattern, the stress absorption resin layer formed on the wiring pattern, and the post electrode base metal pattern formed just below the stress absorption resin layer. Components in the seventeenth embodiment such as the semiconductor chip 30, the interlayer insulation layer 34, the wiring patterns 42, the base metal patterns 36, the electrode pads 32, the post electrodes 46, the sealing portion 44, the solder balls 48a, and the likes same as those in the first embodiment are designated by the same reference numerals, and explanations thereof are omitted.

As shown in FIGS. 26(A) and 26(B), similar to the first embodiment, the semiconductor device or a W-CSP (Wafer level Chip Size Package) includes the semiconductor chip 30.

In the embodiment, the semiconductor device is provided with the stress resistance resin patterns 45 formed on the interlayer insulation layer 34 in the post electrode forming areas 31. The stress resistance resin patterns 45 have a regular hexagonal shape.

In the embodiment, in addition to the stress resistance resin patterns 45, the stress resistance metal patterns 47 are formed in the post electrode forming areas 31 just below the stress resistance resin patterns 45. The stress resistance metal patterns 47 have a regular hexagonal shape larger than that of the stress resistance resin patterns 45. The base metal patterns 36 or the base metal layers are disposed on the stress resistance resin patterns 45. The base metal patterns 36 have a plane shape same as that of the wiring patterns 42.

The wiring patterns 42 electrically connected to the electrode pads 32 are disposed on the base metal layers 36. Each of the wiring patterns 42 includes the post electrode mounting portion 42b integrally connected to the other end portion of the linear portion 42a extending from the electrode pad 32.

The post electrode mounting portions 42b have the upper contour of a regular hexagonal shape.

In the embodiment, the semiconductor device is provided with the stress absorption resin layer 50. The stress absorption resin layer 50 is integrally disposed to cover the re-wiring layer 40 disposed on the base metal layer 35, so that the post electrode mounting portions 42b are partially exposed. The stress absorption resin layer 50 includes the opening portions 52 (contact holes).

In the embodiment, the semiconductor device is provided with the post electrode base metal patterns 54. The post electrode base metal patterns 54 cover inside the opening portions 54, i.e., the sidewalls and the bottom surfaces of the opening portions 54. Further, the post electrode base metal patterns 54 cover a part of the surface of the stress absorption resin layer 50 in the post electrode forming areas 31. The post electrode base metal patterns 54 are formed integrally as a whole, and preferably have a thickness substantially constant.

In the embodiment, the semiconductor device is provided with the post electrodes 46. Each of the post electrodes 46 has the first portion 46X and the second portion 46Y having different diameters. The outer terminals 48 are disposed on the top surfaces 46a of the post electrodes 46.

With the configuration described above, when an external stress is applied to the post electrodes 46, the stress absorption resin layer 50 effectively alleviates the external stress. Accordingly, it is possible to prevent the post electrodes 46 and the wiring patterns 42 connected thereto from being damaged.

Further, the base metal layers 36 are not situated below the stress absorption resin layer 50. Accordingly, it is possible to reduce an area of conductive portion, thereby increasing an extent of integration of the post electrodes 46 and reducing a size of the semiconductor device.

Eighteenth Embodiment

Figures 27A, 27B:
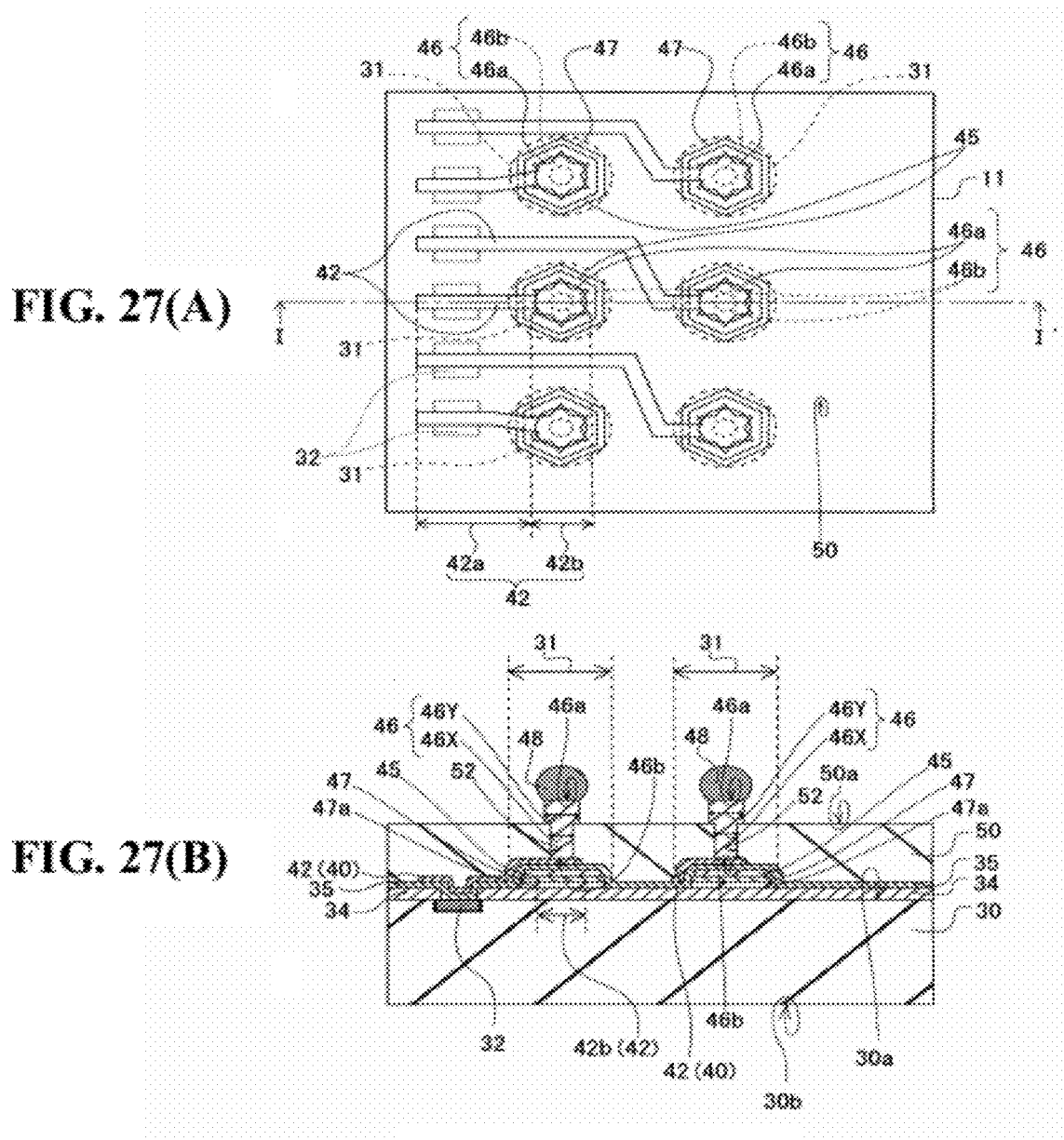
FIG. 27(A) is a schematic plan view showing a wiring pattern of the semiconductor device according to an eighteenth embodiment of the present invention.
FIG. 27(B) is a schematic sectional view taken along a projected line I-I' in FIG. 27(A)

An eighteenth embodiment of the present invention will be explained next with reference to FIGS. 27(A) and 27(B). FIG. 27(A) is a schematic plan view showing a wiring pattern of the semiconductor device according to the eighteenth embodiment of the present invention. FIG. 27(B) is a schematic sectional view taken along a projected line I-I' in FIG. 27(A). A main configuration of the semiconductor device in the eighteenth embodiment is similar to that in the first embodiment shown in FIGS. 1(A) and 1(B), and duplicate illustrations thereof are omitted.

In the eighteenth embodiment, the semiconductor device is characterized that the wiring pattern, the stress resistance resin pattern, the stress resistance metal pattern, and the post electrode have specific shapes, and the stress absorption resin layer is formed on the wiring pattern. Components in the eighteenth embodiment such as the semiconductor chip 30, the interlayer insulation layer 34, the wiring patterns 42, the base metal patterns 36, the electrode pads 32, the post electrodes 46, the sealing portion 44, the outer terminals 48, and the likes same as those in the first embodiment are designated by the same reference numerals, and explanations thereof are omitted.

As shown in FIGS. 27(A) and 27(B), similar to the first embodiment, the semiconductor device or a W-CSP (Wafer level Chip Size Package) includes the semiconductor chip 30. The base metal layer 35 is formed on the interlayer insulation layer 34. The wiring patterns 42 electrically connected to the electrode pads 32 are disposed on the base metal layer 35. Each of the wiring patterns 42 includes the post electrode mounting portion 42b integrally connected to the other end portion of the linear portion 42a extending from the electrode pad 32.

In the embodiment, the post electrode mounting portions 42b have a recessed polygonal shape (polygonal star shape). That is, each of the post electrode mounting portions 42b has an upper contour shape of a substantially six-corner star having six acute angle corners (protruding portions).

In the embodiment, the semiconductor device is provided with the stress resistance resin patterns 45 formed just below the post electrode mounting portions 42b. The stress resistance resin patterns 45 are situated in the post electrode forming areas 31 and have a regular hexagonal shape.

In the embodiment, in addition to the stress resistance resin patterns 45, the stress resistance metal patterns 47 are formed in the post electrode forming areas 31 just below the stress resistance resin patterns 45. The stress resistance metal patterns 47 have a regular hexagonal shape larger than that of the stress resistance resin patterns 45. The base metal layer 35 is disposed to cover the interlayer insulation layer 34 and the stress resistance resin patterns 45 exposed from the wiring patterns 42.

In the embodiment, the semiconductor device is provided with the stress absorption resin layer 50. The stress absorption resin layer 50 is integrally disposed to cover the re-wiring layer 40 disposed on the base metal layer 35, so that the post electrode mounting portions 42b are partially exposed. The stress absorption resin layer 50 includes the opening portions 52 (contact holes).

In the embodiment, the semiconductor device is provided with the post electrodes 46. Each of the post electrodes 46 has the first portion 46X and the second portion 46Y having different diameters. Each of the post electrodes 46 is disposed on one of the post electrode mounting portions 42b, so that the contour of the bottom surface 46b of the post electrode 46 is accommodated in the plan contour of the post electrode mounting portion 42b having a hexagonal shape. The outer terminals 48 are disposed on the top surfaces 46a of the post electrodes 46.

With the configuration described above, even when a crack is generated in a component near the interlayer insulation layer 34, the post electrodes 46, or the re-wiring layer 40 connected thereto, it is possible to prevent the damage from propagating continuously and directly through the post electrodes 46 and the re-wiring layer 40.

Further, when an external stress is applied to the post electrodes 46, the stress resistance resin patterns 45 alleviate the external stress. Accordingly, it is possible to prevent the post electrodes 46 and the wiring patterns 42 connected thereto from being damaged.

Further, when an external stress is applied to the post electrodes 46, the stress resistance metal patterns 47 block the external stress. Accordingly, it is possible to prevent the external stress from reaching other component such as the wiring patterns 42 disposed below the stress resistance metal patterns 47.

Further, when an external stress is applied to the post electrodes 46, the stress absorption resin layer 50 alleviates the external stress. Accordingly, it is possible to prevent the post electrodes 46 and the wiring patterns 42 connected thereto from being damaged.

Nineteenth Embodiment

A nineteenth embodiment of the present invention will be explained next with reference to FIGS. 28(A) and 28(B). FIG. 28(A) is a schematic plan view showing a wiring pattern of the semiconductor device according to the nineteenth embodiment of the present invention. FIG. 28(B) is a schematic sectional view taken along a projected line I-I' in FIG. 28(A). A main configuration of the semiconductor device in the nineteenth embodiment is similar to that in the first embodiment shown in FIGS. 1(A) and 1(B), and duplicate illustrations thereof are omitted.

In the nineteenth embodiment, the semiconductor device is characterized that the wiring pattern, the stress resistance resin pattern, the stress resistance metal pattern, and the post electrode have specific shapes. Further, the semiconductor device is characterized that the stress absorption resin layer is formed on the wiring pattern, and the post electrode base metal pattern is disposed just below the stress absorption resin layer. Components in the nineteenth embodiment such as the semiconductor chip 30, the interlayer insulation layer 34, the wiring patterns 42, the base metal patterns 36, the electrode pads 32, the post electrodes 46, the sealing portion 44, the outer terminals 48, and the likes same as those in the first embodiment are designated by the same reference numerals, and explanations thereof are omitted.

As shown in FIGS. 28(A) and 28(B), similar to the first embodiment, the semiconductor device or a W-CSP (Wafer level Chip Size Package) includes the semiconductor chip 30.

In the embodiment, the semiconductor device is provided with the stress resistance resin patterns 45 on the interlayer insulation layer 34. The stress resistance resin patterns 45 have a regular hexagonal shape. The base metal layers 36 are formed on the stress resistance resin patterns 45, and include a plurality of the base metal patterns 36. The base metal patterns 36 have a plane shape same as that of the wiring patterns 42. The wiring patterns 42 electrically connected to the electrode pads 32 are disposed on the base metal layers 36.

The wiring patterns 42 include the post electrode mounting portions 42b integrally connected to the other end portions of the linear portions 42a extending from the electrode pads 32 and having a substantially recessed polygonal shape (polygonal star shape). In the embodiment, the post electrode mounting portion 42b has an upper contour shape of a substantially six-corner star having six acute angle corners (protruding portions). The post electrode mounting portions 42b are disposed in the post electrode forming areas 31 defined in advance.

In the embodiment, the semiconductor device is provided with the stress absorption resin layer 50. The stress absorption resin layer 50 is integrally disposed to cover the re-wiring layer 40 disposed on the base metal layer 35 in a state that the post electrode mounting portions 42b are partially exposed.

In the embodiment, the stress absorption resin layer 50 includes the opening portions 52 (contact holes). The opening portions 52 extend from the surface of the stress absorption resin layer 50 to the post electrode mounting portions 42b, so that the post electrode mounting portions 42b are partially exposed.

In the embodiment, the semiconductor device is provided with the post electrode base metal patterns 54. The post electrode base metal patterns 54 cover inside the opening portions 54, i.e., the sidewalls and the bottom surfaces of the opening portions 54. Further, the post electrode base metal patterns 54 cover a part of the surface of the stress absorption resin layer 50 in the post electrode forming areas 31. The post electrode base metal patterns 54 are formed integrally as a whole, and preferably have a thickness substantially constant.

In the embodiment, the semiconductor device is provided with the post electrodes 46. Each of the post electrodes 46 has the first portion 46X and the second portion 46Y having different diameters. The post electrodes 46 are disposed on the post electrode mounting portions 42*b*, so that the bottom surfaces 46*b* thereof are completely accommodated in the plan contours of the post electrode mounting portions 42*b* having a regular hexagonal shape. The outer terminals 48 are disposed on the top surfaces 46*a* thus exposed.

With the configuration described above, even when a crack is generated in a component near the interlayer insulation layer 34, the post electrodes 46, or the re-wiring layer 40 connected thereto, it is possible to prevent the damage from propagating continuously and directly through the post electrodes 46 and the re-wiring layer 40.

Further, when an external stress is applied to the post electrodes 46, the stress resistance resin patterns 45 alleviate the external stress. Accordingly, it is possible to prevent the post electrodes 46 and the wiring patterns 42 connected thereto from being damaged.

Further, when an external stress is applied to the post electrodes 46, the stress resistance metal patterns 47 block the external stress. Accordingly, it is possible to prevent the external stress from reaching other component such as the wiring patterns 42 disposed below the stress resistance metal patterns 47.

Further, when an external stress is applied to the post electrodes 46, the stress absorption resin layer 50 alleviates the external stress. Accordingly, it is possible to prevent the post electrodes 46 and the wiring patterns 42 connected thereto from being damaged.

Further, the base metal layers 36 are not situated below the stress absorption resin layer 50. Accordingly, it is possible to reduce an area of conductive portion, thereby increasing an extent of integration of the post electrodes 46 and reducing a size of the semiconductor device.

Twentieth Embodiment

Figure 29A:
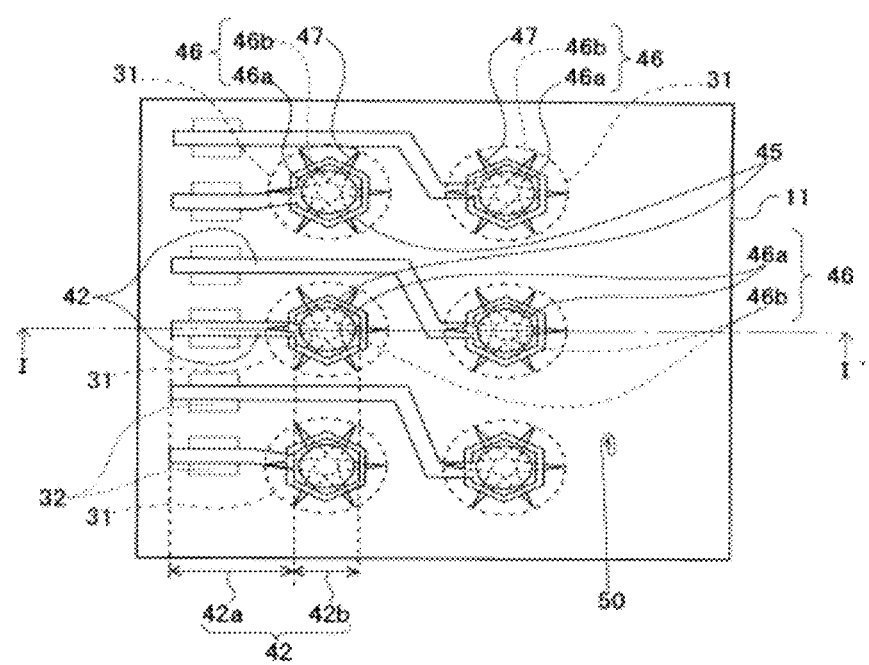
FIG. 29(A) is a schematic plan view showing a wiring pattern of the semiconductor device according to a twentieth embodiment of the present invention.
Figure 29B:
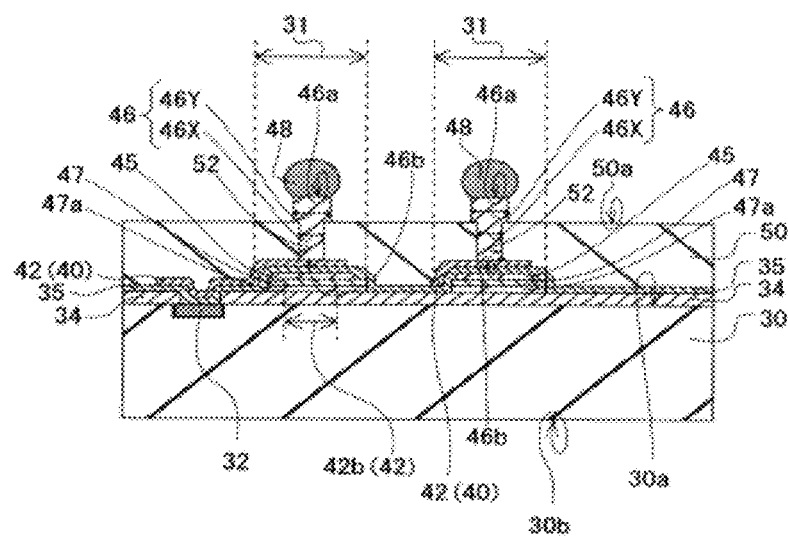
FIG. 29(B) is a schematic sectional view taken along a projected line I-I' in FIG. 29(A)

A nineteenth embodiment of the present invention will be explained next with reference to FIGS. 29(A) and 29(B). FIG. 29(A) is a schematic plan view showing a wiring pattern of the semiconductor device according to the twentieth embodiment of the present invention. FIG. 29(B) is a schematic sectional view taken along a projected line I-I' in FIG. 29(A). A main configuration of the semiconductor device in the twentieth embodiment is similar to that in the first embodiment shown in FIGS. 1(A) and 1(B), and duplicate illustrations thereof are omitted.

In the twentieth embodiment, the semiconductor device is characterized that the stress resistance resin pattern, the stress resistance metal pattern, and the post electrode have specific shapes. Further, the semiconductor device is characterized that the stress absorption resin layer is formed on the wiring pattern. Components in the twentieth embodiment such as the semiconductor chip 30, the interlayer insulation layer 34, the wiring patterns 42, the base metal patterns 36, the electrode pads 32, the post electrodes 46, the sealing portion 44, the outer terminals 48, and the likes same as those in the first embodiment are designated by the same reference numerals, and explanations thereof are omitted.

As shown in FIGS. 29(A) and 29(B), similar to the first embodiment, the semiconductor device or a W-CSP (Wafer level Chip Size Package) includes the semiconductor chip 30. The base metal layer 35 is formed on the interlayer insulation layer 34. The wiring patterns 42 electrically connected to the electrode pads 32 are disposed on the base metal layer 35. Each of the wiring patterns 42 includes the post electrode mounting portion 42*b* integrally connected to the other end portion of the linear portion 42*a* extending from the electrode pad 32. The post electrode mounting portions 42*b* have a regular hexagonal shape.

In the embodiment, in addition to the stress resistance resin patterns 45, the stress resistance metal patterns 47 are formed in the post electrode forming areas 31 just below the stress resistance resin patterns 45. The stress resistance metal patterns 47 have a regular hexagonal shape larger than that of the stress resistance resin patterns 45. The base metal patterns 36 or the base metal layers are disposed on the stress resistance resin patterns 45. The base metal patterns 36 have a plane shape same as that of the wiring patterns 42.

In the embodiment, the stress resistance metal patterns 47 have a recessed polygonal shape (polygonal star shape). That is, each of the stress resistance metal patterns 47 has an upper contour shape of a substantially six-corner star having six acute angle corners (protruding portions).

In the embodiment, the shape and size of the stress resistance metal patterns 47 are arbitrary. Preferably, in the polygonal shape of the stress resistance metal patterns 47, recess portions with a blunt angle between the protruding portions are situated within the contours of the stress resistance resin patterns 45, the post electrode mounting portions 42*b*, and the bottom surfaces 46*b* of the post electrodes 46.

When the stress resistance metal patterns 47 are formed of copper with a electroplating method and the likes, one or more layers of the stress resistance base metal patterns 47*a* are formed just below the stress resistance metal patterns 47. The base metal layer 35 is disposed to cover the interlayer insulation layer 34 and the stress resistance resin patterns 45 exposed from the wiring patterns 42.

In the embodiment, the semiconductor device is provided with the stress absorption resin layer 50. The stress absorption resin layer 50 is disposed such that the post electrode mounting portions 42*b* are partially exposed. The stress absorption resin layer 50 is integrally disposed to cover the re-wiring layer 40 disposed on the base metal layers 36.

In the embodiment, the stress absorption resin layer 50 includes the opening portions 52 (contact holes). The opening portions 52 extend from the surface of the stress absorption resin layer 50 to the post electrode mounting portions 42*b*, so that the post electrode mounting portions 42*b* are partially exposed.

In the embodiment, the semiconductor device is provided with the post electrodes 46. Each of the post electrodes 46 has the first portion 46X and the second portion 46Y having different diameters. The post electrodes 46 are disposed on the post electrode mounting portions 42*b*, so that the bottom surfaces 46*b* thereof are completely accommodated in the plan contours of the post electrode mounting portions 42*b* having a regular hexagonal shape. The outer terminals 48 are disposed on the top surfaces 46*a* of the post electrodes 46.

With the configuration described above, when an external stress is applied to the post electrodes 46, the stress absorption resin layer 50 alleviates the external stress. Accordingly, it is possible to prevent the post electrodes 46 and the wiring patterns 42 connected thereto from being damaged.

Further, even when a crack is generated in the semiconductor device, with the stress resistance metal patterns 47 having the recessed polygonal shape having the protruding portions, it is possible to prevent the crack from propagating through the post electrodes 46 or the re-wiring layer 40.

Twenty-First Embodiment

A twenty-first embodiment of the present invention will be explained next with reference to FIGS. 30(A) and 30(B). FIG.

30(A) is a schematic plan view showing a wiring pattern of the semiconductor device according to the twenty-first embodiment of the present invention. FIG. 30(B) is a schematic sectional view taken along a projected line I-I' in FIG. 30(A). A main configuration of the semiconductor device in the twenty-first embodiment is similar to that in the first embodiment shown in FIGS. 1(A) and 1(B), and duplicate illustrations thereof are omitted.

In the twenty-first embodiment, the semiconductor device is characterized that the post electrode has a specific shape. Further, the semiconductor device is characterized that the stress resistance resin pattern and the stress resistance metal pattern are disposed. Further, the semiconductor device is characterized that the stress absorption resin layer is formed on the wiring pattern, and the post electrode base metal pattern is disposed just below the stress absorption resin layer. Components in the twenty-first embodiment such as the semiconductor chip 30, the interlayer insulation layer 34, the wiring patterns 42, the base metal patterns 36, the electrode pads 32, the post electrodes 46, the sealing portion 44, the outer terminals 48, and the likes same as those in the first embodiment are designated by the same reference numerals, and explanations thereof are omitted.

Figures 30A, 30B:
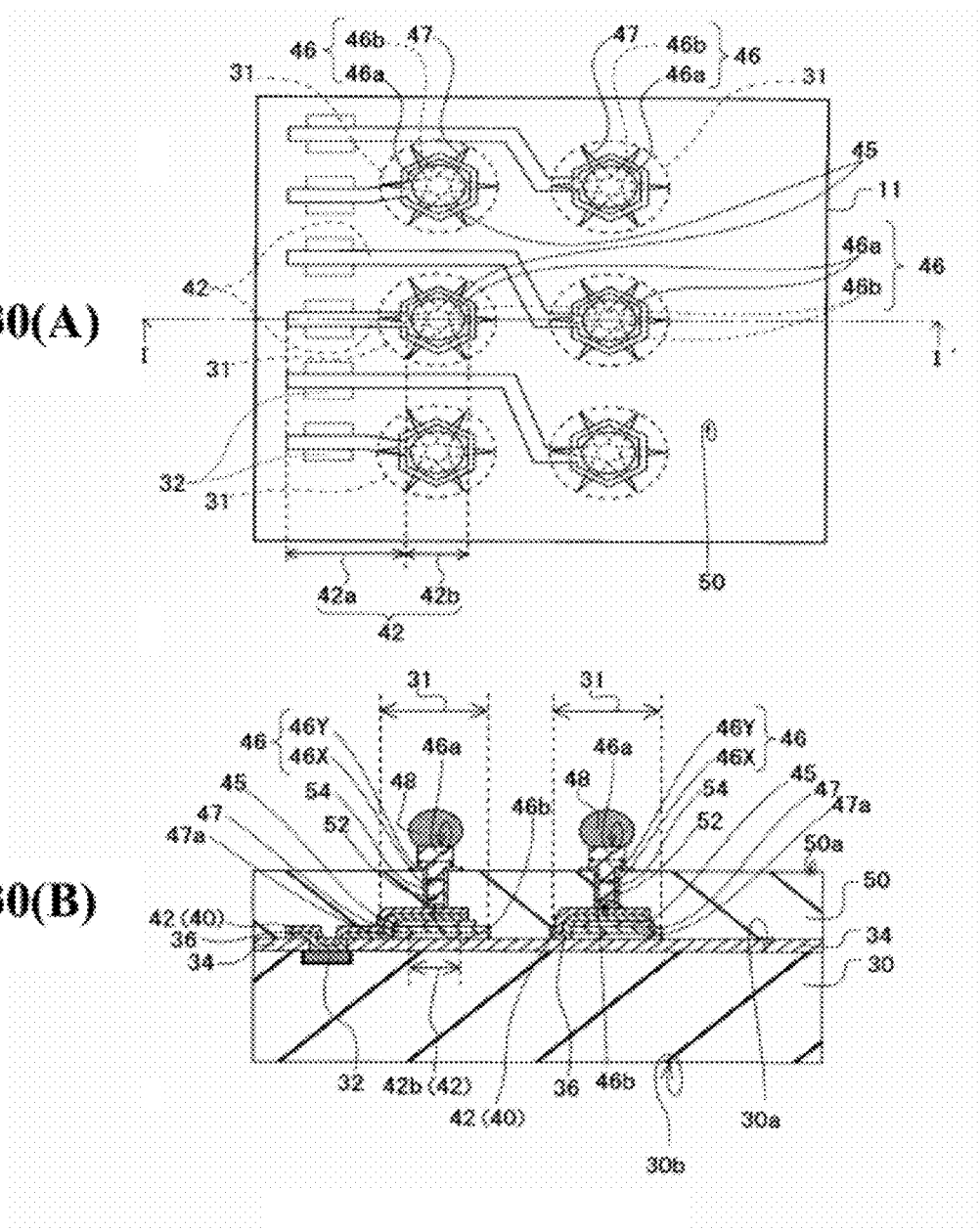
FIG. 30(A) is a schematic plan view showing a wiring pattern of the semiconductor device according to a twenty-first embodiment of the present invention.
FIG. 30(B) is a schematic sectional view taken along a projected line I-I' in FIG. 30(A)

As shown in FIGS. 30(A) and 30(B), similar to the first embodiment, the semiconductor device or a W-CSP (Wafer level Chip Size Package) includes the semiconductor chip 30.

In the embodiment, the semiconductor device is provided with the stress resistance resin patterns 45 on the interlayer insulation layer 34. The stress resistance resin patterns 45 are disposed in the post electrode forming areas 31.

In the embodiment, in addition to the stress resistance resin patterns 45, the stress resistance metal patterns 47 are formed in the post electrode forming areas 31 just below the stress resistance resin patterns 45. The stress resistance metal patterns 47 have a regular hexagonal shape larger than that of the stress resistance resin patterns 45.

In the embodiment, the stress resistance metal patterns 47 have a recessed polygonal shape (polygonal star shape). That is, each of the stress resistance metal patterns 47 has an upper contour shape of a substantially six-corner star having six acute angle corners (protruding portions).

In the embodiment, the shape and size of the stress resistance metal patterns 47 are arbitrary. Preferably, in the polygonal shape of the stress resistance metal patterns 47, recess portions with a blunt angle between the protruding portions are situated within the contours of the stress resistance resin patterns 45, the post electrode mounting portions 42b, and the bottom surfaces 46b of the post electrodes 46.

When the stress resistance metal patterns 47 are formed of copper with a electroplating method and the likes, one or more layers of the stress resistance base metal patterns 47a are formed just below the stress resistance metal patterns 47.

In the embodiment, the base metal patterns 36 or the base metal layers are disposed on the stress resistance resin patterns 45. The base metal patterns 36 have a plane shape same as that of the wiring patterns 42.

The wiring patterns 42 include the post electrode mounting portions 42b integrally connected to the other end portions of the linear portions 42a extending from the electrode pads 32. In the embodiment, the post electrode mounting portion 42b has an upper contour shape of a regular hexagonal shape.

In the embodiment, the semiconductor device is provided with the stress absorption resin layer 50. The stress absorption resin layer 50 is integrally disposed to cover the re-wiring layer 40 disposed on the base metal layer 35 in a state that the post electrode mounting portions 42b are partially exposed.

In the embodiment, the stress absorption resin layer 50 includes the opening portions 52 (contact holes). The opening portions 52 extend from the surface of the stress absorption resin layer 50 to the post electrode mounting portions 42b, so that the post electrode mounting portions 42b are partially exposed.

In the embodiment, the semiconductor device is provided with the post electrode base metal patterns 54. The post electrode base metal patterns 54 cover inside the opening portions 54, i.e., the sidewalls and the bottom surfaces of the opening portions 54. Further, the post electrode base metal patterns 54 cover a part of the surface of the stress absorption resin layer 50 in the post electrode forming areas 31. The post electrode base metal patterns 54 are formed integrally as a whole, and preferably have a thickness substantially constant.

In the embodiment, the semiconductor device is provided with the post electrodes 46. Each of the post electrodes 46 has the first portion 46X and the second portion 46Y having different diameters. The post electrodes 46 are disposed on the post electrode mounting portions 42b, so that the bottom surfaces 46b thereof are completely accommodated in the plan contours of the post electrode mounting portions 42b having a regular hexagonal shape. The outer terminals 48 are disposed on the top surfaces 46a thus exposed.

With the configuration described above, when an external stress is applied to the post electrodes 46, the stress absorption resin layer 50 alleviates the external stress. Accordingly, it is possible to prevent the post electrodes 46 and the wiring patterns 42 connected thereto from being damaged.

Further, the base metal layers 36 are not situated below the stress absorption resin layer 50. Accordingly, it is possible to reduce an area of conductive portion, thereby increasing an extent of integration of the post electrodes 46 and reducing a size of the semiconductor device.

Further, with the stress resistance metal patterns 47 having the recessed polygonal shape with the protruding portions, when a crack is generated in a surface protection layer and the likes, it is possible to prevent the crack from reaching the post electrodes 46 and the re-wiring layer 40.

Twenty-Second Embodiment

Figure 31A:
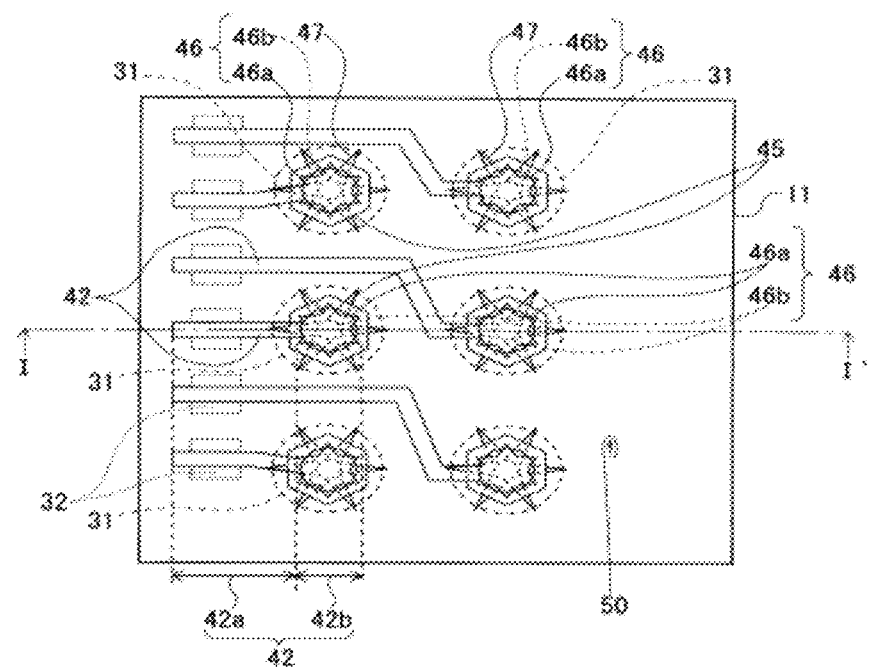
FIG. 31(A) is a schematic plan view showing a wiring pattern of the semiconductor device according to a twenty-second embodiment of the present invention.
Figure 31B:
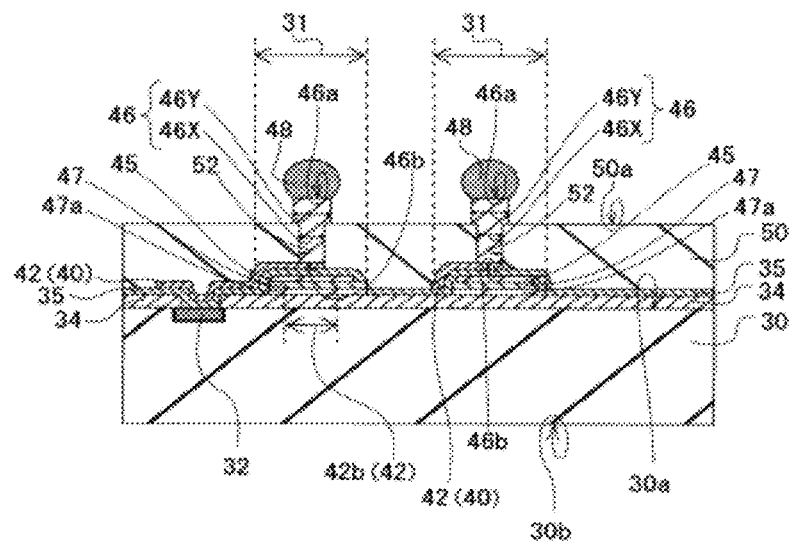
FIG. 31(B) is a schematic sectional view taken along a projected line I-I' in FIG. 31(A)

A twenty-second embodiment of the present invention will be explained next with reference to FIGS. 31(A) and 31(B). FIG. 31(A) is a schematic plan view showing a wiring pattern of the semiconductor device according to the twenty-second embodiment of the present invention. FIG. 31(B) is a schematic sectional view taken along a projected line I-I' in FIG. 31(A). A main configuration of the semiconductor device in the twenty-second embodiment is similar to that in the first embodiment shown in FIGS. 1(A) and 1(B), and duplicate illustrations thereof are omitted.

In the twenty-second embodiment, the semiconductor device is characterized that the wiring pattern and the post electrode have specific shapes. Further, the semiconductor device is characterized that the stress resistance resin pattern and the stress resistance metal pattern are disposed. Further, the semiconductor device is characterized that the stress absorption resin layer is formed on the wiring pattern. Components in the twenty-second embodiment such as the semiconductor chip 30, the interlayer insulation layer 34, the wiring patterns 42, the base metal patterns 36, the electrode pads 32, the post electrodes 46, the sealing portion 44, the outer terminals 48, and the likes same as those in the first embodiment are designated by the same reference numerals, and explanations thereof are omitted.

As shown in FIGS. 31(A) and 31(B), similar to the first embodiment, the semiconductor device or a W-CSP (Wafer level Chip Size Package) includes the semiconductor chip 30.

In the embodiment, the semiconductor device is provided with the stress resistance resin patterns 45 on the interlayer insulation layer 34. The base metal layer 35 is formed on the interlayer insulation layer 34. The wiring patterns 42 electrically connected to the electrode pads 32 are disposed on the base metal layer 35. Each of the wiring patterns 42 includes the post electrode mounting portion 42b integrally connected to the other end portion of the linear portion 42a extending from the electrode pad 32. The post electrode mounting portions 42b have a recessed polygonal shape (polygonal star shape). That is, each of the post electrode mounting portions 42b has an upper contour shape of a substantially six-corner star having six acute angle corners (protruding portions).

In the embodiment, the semiconductor device is provided with the stress resistance resin patterns 45 just below the base metal layer 35. The stress resistance resin patterns 45 are disposed in the post electrode forming areas 31. The stress resistance resin patterns 45 have a regular hexagonal shape.

In the embodiment, the stress resistance metal patterns 47 have a recessed polygonal shape (polygonal star shape). That is, each of the stress resistance metal patterns 47 has an upper contour shape of a substantially six-corner star having six acute angle corners (protruding portions).

In the embodiment, the shape and size of the stress resistance metal patterns 47 are arbitrary. Preferably, in the polygonal shape of the stress resistance metal patterns 47, recess portions with a blunt angle between the protruding portions are situated within the contours of the stress resistance resin patterns 45, the post electrode mounting portions 42b, and the bottom surfaces 46b of the post electrodes 46. It is preferred that the protruding portions of the stress resistance metal patterns 47 be situated on the recessed portions of the post electrode mounting portions 42b.

When the stress resistance metal patterns 47 are formed of copper with a electroplating method and the likes, one or more layers of the stress resistance base metal patterns 47a are formed just below the stress resistance metal patterns 47. The base metal layer 35 is disposed to cover the interlayer insulation layer 34 and the stress resistance resin patterns 45 exposed from the wiring patterns 42.

In the embodiment, the semiconductor device is provided with the stress absorption resin layer 50. The stress absorption resin layer 50 is integrally disposed to cover the re-wiring layer 40 disposed on the base metal layer 35 in a state that the post electrode mounting portions 42b are partially exposed.

In the embodiment, the stress absorption resin layer 50 includes the opening portions 52 (contact holes). The opening portions 52 extend from the surface of the stress absorption resin layer 50 to the post electrode mounting portions 42b, so that the post electrode mounting portions 42b are partially exposed.

In the embodiment, the semiconductor device is provided with the post electrodes 46. Each of the post electrodes 46 has the first portion 46X and the second portion 46Y having different diameters. The post electrodes 46 are disposed on the post electrode mounting portions 42b, so that the bottom surfaces 46b thereof are completely accommodated in the plan contours of the post electrode mounting portions 42b having a regular hexagonal shape. The outer terminals 48 are disposed on the top surfaces 46a thus exposed.

With the configuration described above, even when a crack is generated in a component near the interlayer insulation layer 34, the post electrodes 46, or the re-wiring layer 40 connected thereto, it is possible to prevent the damage from propagating continuously and directly through the post electrodes 46 and the re-wiring layer 40.

Further, when an external stress is applied to the post electrodes 46, the stress absorption resin layer 50 alleviates the external stress. Accordingly, it is possible to prevent the post electrodes 46 and the wiring patterns 42 connected thereto from being damaged.

Further, with the stress resistance metal patterns 47 having the recessed polygonal shape with the protruding portions, when a crack is generated in a surface protection layer and the likes, it is possible to prevent the crack from reaching the post electrodes 46 and the re-wiring layer 40.

Twenty-Third Embodiment

Figure 32A:
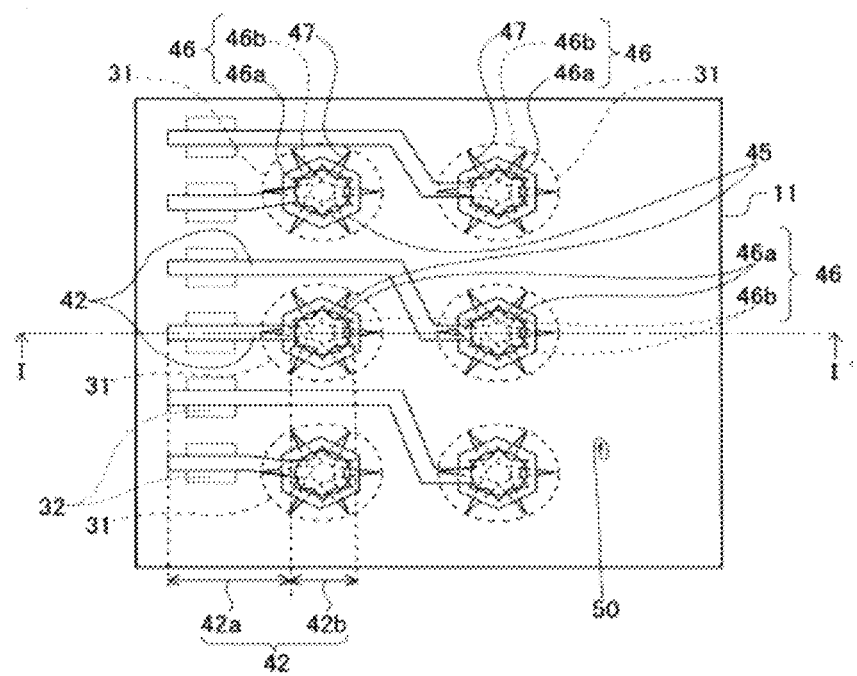
FIG. 32(A) is a schematic plan view showing a wiring pattern of the semiconductor device according to a twenty-third embodiment of the present invention.
Figure 32B:
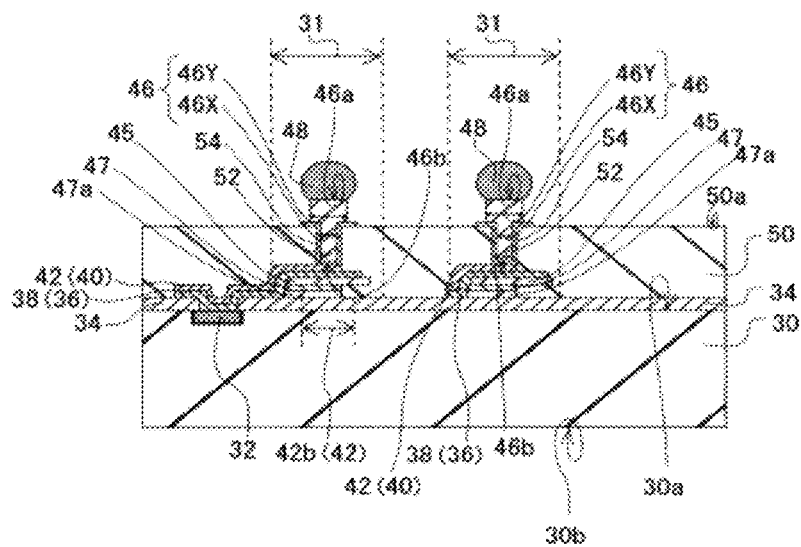
FIG. 32(B) is a schematic sectional view taken along a projected line I-I' in FIG. 32(A).

A twenty-third embodiment of the present invention will be explained next with reference to FIGS. 32(A) and 32(B). FIG. 32(A) is a schematic plan view showing a wiring pattern of the semiconductor device according to the twenty-third embodiment of the present invention. FIG. 32(B) is a schematic sectional view taken along a projected line I-I' in FIG. 32(A). A main configuration of the semiconductor device in the twenty-third embodiment is similar to that in the first embodiment shown in FIGS. 1(A) and 1(B), and duplicate illustrations thereof are omitted.

In the twenty-third embodiment, the semiconductor device is characterized that the wiring pattern and the post electrode have specific shapes. Further, the semiconductor device is characterized that the stress resistance resin pattern and the stress resistance metal pattern are disposed. Further, the semiconductor device is characterized that the stress absorption resin layer is formed on the wiring pattern, and the post electrode base metal pattern is disposed just below the stress absorption resin layer. Components in the twenty-third embodiment such as the semiconductor chip 30, the interlayer insulation layer 34, the wiring patterns 42, the base metal patterns 36, the electrode pads 32, the post electrodes 46, the sealing portion 44, the outer terminals 48, and the likes same as those in the first embodiment are designated by the same reference numerals, and explanations thereof are omitted.

As shown in FIGS. 32(A) and 32(B), similar to the first embodiment, the semiconductor device or a W-CSP (Wafer level Chip Size Package) includes the semiconductor chip 30.

In the embodiment, the semiconductor device is provided with the stress resistance resin patterns 45 on the interlayer insulation layer 34. The stress resistance resin patterns 45 are disposed in the post electrode forming areas 31. The stress resistance resin patterns 45 have a regular hexagonal shape.

In the embodiment, in addition to the stress resistance resin patterns 45, the stress resistance metal patterns 47 are formed in the post electrode forming areas 31 just below the stress resistance resin patterns 45. The stress resistance metal patterns 47 are disposed in the post electrode forming areas 31.

In the embodiment, the stress resistance metal patterns 47 have a recessed polygonal shape (polygonal star shape). That is, each of the stress resistance metal patterns 47 has an upper contour shape of a substantially six-corner star having six acute angle corners (protruding portions).

In the embodiment, the shape and size of the stress resistance metal patterns 47 are arbitrary. Preferably, in the polygonal shape of the stress resistance metal patterns 47, recess portions with a blunt angle between the protruding portions are situated within the contours of the stress resistance resin patterns 45, the post electrode mounting portions 42b, and the bottom surfaces 46b of the post electrodes 46. It is preferred that the protruding portions of the stress resistance metal patterns 47 be situated on the recessed portions of the post electrode mounting portions 42b.

When the stress resistance metal patterns 47 are formed of copper with a electroplating method and the likes, one or more layers of the stress resistance base metal patterns 47a are formed just below the stress resistance metal patterns 47.

In the embodiment, the base metal patterns 36 or the base metal layers are disposed on the stress resistance resin patterns 45. The base metal patterns 36 have a plane shape same as that of the wiring patterns 42. The wiring patterns 42 electrically connected to the electrode pads 32 are disposed on the base metal layer 36. Each of the wiring patterns 42 includes the post electrode mounting portion 42b integrally connected to the other end portion of the linear portion 42a extending from the electrode pad 32. The post electrode mounting portions 42b have a recessed polygonal shape (polygonal star shape). That is, each of the post electrode mounting portions 42b has an upper contour shape of a substantially six-corner star having six acute angle corners (protruding portions). The post electrode mounting portions 42b are disposed in the post electrode forming areas 31 defined in advance.

In the embodiment, the semiconductor device is provided with the stress absorption resin layer 50. The stress absorption resin layer 50 is integrally disposed to cover the re-wiring layer 40 disposed on the base metal layer 35 in a state that the post electrode mounting portions 42b are partially exposed.

In the embodiment, the stress absorption resin layer 50 includes the opening portions 52 (contact holes). The opening portions 52 extend from the surface of the stress absorption resin layer 50 to the post electrode mounting portions 42b, so that the post electrode mounting portions 42b are partially exposed.

In the embodiment, the semiconductor device is provided with the post electrode base metal patterns 54. The post electrode base metal patterns 54 cover inside the opening portions 54, i.e., the sidewalls and the bottom surfaces of the opening portions 54. Further, the post electrode base metal patterns 54 cover a part of the surface of the stress absorption resin layer 50 in the post electrode forming areas 31. The post electrode base metal patterns 54 are formed integrally as a whole, and preferably have a thickness substantially constant.

In the embodiment, the semiconductor device is provided with the post electrodes 46. Each of the post electrodes 46 has the first portion 46X and the second portion 46Y having different diameters. The post electrodes 46 are disposed on the post electrode mounting portions 42b, so that the bottom surfaces 46b thereof are completely accommodated in the plan contours of the post electrode mounting portions 42b having a regular hexagonal shape. The outer terminals 48 are disposed on the top surfaces 46a thus exposed.

With the configuration described above, even when a crack is generated in a component near the interlayer insulation layer 34, the post electrodes 46, or the re-wiring layer 40 connected thereto, it is possible to prevent the damage from propagating continuously and directly through the post electrodes 46 and the re-wiring layer 40.

Further, when an external stress is applied to the post electrodes 46, the stress absorption resin layer 50 alleviates the external stress. Accordingly, it is possible to prevent the post electrodes 46 and the wiring patterns 42 connected thereto from being damaged.

Further, the base metal layers 36 are not situated below the stress absorption resin layer 50. Accordingly, it is possible to reduce an area of conductive portion, thereby increasing an extent of integration of the post electrodes 46 and reducing a size of the semiconductor device.

Further, with the stress resistance metal patterns 47 having the recessed polygonal shape with the protruding portions, when a crack is generated in a surface protection layer and the likes, it is possible to prevent the crack from reaching the post electrodes 46 and the re-wiring layer 40.

The disclosure of Japanese Patent Application No. 2006-194658, filed on Jul. 14, 2006, is incorporated in the application.

While the invention has been explained with reference to the specific embodiments of the invention, the explanation is illustrative and the invention is limited only by the appended claims.

What is claimed is:

1. A semiconductor device comprising:
   a semiconductor chip having a first main surface with an electrode pad in an exposed state and an interlayer insulation layer formed on the first main surface so that the electrode pad is partially exposed, said interlayer insulation layer including a surface with a post electrode mounting area defined thereon;
   a plurality of stress resistance resin patterns formed on the post electrode mounting area, each of said stress resistance resin patterns being disposed away from each other;
   a re-wiring layer including a wiring pattern, said wiring pattern having a linear portion having one end portion electrically connected to the electrode pad and extending from the electrode pad, and a post electrode mounting portion connected to the other end portion of the linear portion and formed on each of the stress resistance resin patterns, said post electrode mounting portion being formed in a polygonal shape;
   a base metal layer formed between the stress resistance resin patterns and the re-wiring layer;
   a post electrode formed on the post electrode mounting portion;
   a sealing portion disposed so that a top of the post electrode is exposed; and
   an outer terminal formed on the top of the post electrode.

2. The semiconductor device according to claim 1, wherein said stress resistance resin patterns are formed of a material same as that of the interlayer insulation layer.

3. The semiconductor device according to claim 1, wherein said stress resistance resin patterns are formed of a photosensitive resin.

4. The semiconductor device according to claim 1, wherein said stress resistance resin patterns have a thickness between 2 μm and 10 μm.

5. The semiconductor device according to claim 1, wherein said stress resistance resin patterns have an area in a plan view greater than that of the post electrode.

6. The semiconductor device according to claim 1, wherein said post electrode mounting portion is formed in the polygonal shape having at least six corners.

* * * * *